(12) United States Patent
Aragona

(10) Patent No.: US 6,732,053 B1
(45) Date of Patent: May 4, 2004

(54) METHOD AND APPARATUS FOR CONTROLLING A TEST CELL

(75) Inventor: Daniel C. Aragona, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/164,073

(22) Filed: Sep. 30, 1998

(51) Int. Cl.[7] ............................................. G06F 17/30
(52) U.S. Cl. ...................... 702/22; 702/108; 702/116; 702/117; 702/118; 702/121; 702/122
(58) Field of Search ............................... 702/57, 58, 62, 702/60, 108, 116, 117, 118, 119–123, 183–185, 188, FOR 103, FOR 104, FOR 106, FOR 111, FOR 134, FOR 135, FOR 170, FOR 171; 700/9, 10, 11, 12, 19; 324/764, 765; 714/718, 724

(56) References Cited

U.S. PATENT DOCUMENTS

| | | | | |
|---|---|---|---|---|
| 4,517,512 A | * | 5/1985 | Petrich et al. ............. 324/73 R |
| 4,635,259 A | * | 1/1987 | Schinabeck et al. .......... 371/20 |
| 4,637,020 A | * | 1/1987 | Schinabeck ................... 371/20 |
| 4,646,299 A | * | 2/1987 | Schinabeck et al. .......... 371/20 |
| 4,868,493 A | * | 9/1989 | Becker ...................... 324/73 R |
| 5,355,320 A | * | 10/1994 | Erjavic et al. .............. 364/488 |
| 5,381,417 A | * | 1/1995 | Loopik et al. .............. 371/15.1 |
| 5,539,676 A | * | 7/1996 | Yamaguchi .................. 364/559 |
| 5,561,386 A | * | 10/1996 | Funaki et al. ............... 324/758 |
| 5,591,299 A | * | 1/1997 | Seaton et al. ............. 156/626.1 |
| 5,726,920 A | * | 3/1998 | Chen et al. ................. 364/579 |
| 5,828,674 A | * | 10/1998 | Proskauer .................. 371/22.1 |
| 5,857,192 A | * | 1/1999 | Fitting ......................... 707/10 |
| 5,865,319 A | * | 2/1999 | Okuda et al. ............... 209/574 |
| 5,935,263 A | * | 8/1999 | Keeth et al. ................ 714/718 |
| 6,028,439 A | * | 2/2000 | Arkin et al. ................ 324/765 |

(List continued on next page.)

FOREIGN PATENT DOCUMENTS

JP 10-275835 * 10/1998

*Primary Examiner*—Marc S. Hoff
*Assistant Examiner*—Carol S W Tsai
(74) *Attorney, Agent, or Firm*—Blakely, Sokoloff, Taylor & Zafman LLP

(57) ABSTRACT

In one aspect of the present invention, an apparatus is provided for testing a plurality of devices. The apparatus, in one embodiment, comprises a controller, a device identifier capable of identifying each one of a plurality of devices as one of a plurality of device types, and a plurality of test heads. Each test head is capable of testing each one of the devices independently of the rest of the plurality of test heads responsive to the identification of each device by the device identifier and under the control of the controller. In a second aspect of the invention, a method is provided for testing a plurality of devices. The method, in one embodiment, comprises placing the plurality of devices identified into a plurality of test heads, each device being identified as one of a plurality of predetermined device types and being placed in a respective test head; and directing the testing of each device independently of the testing for the remaining devices responsive to the respective identification of the device, the direction for the testing of each device coming from the same controller.

26 Claims, 42 Drawing Sheets

U.S. PATENT DOCUMENTS

| | | | | |
|---|---|---|---|---|
| 6,031,384 A | * | 2/2000 | Furuta | 324/760 |
| 6,031,387 A | * | 2/2000 | Berar | 324/765 |
| 6,032,274 A | * | 2/2000 | Manning | 714/718 |
| 6,055,463 A | * | 4/2000 | Cheong et al. | 700/223 |
| 6,067,651 A | * | 5/2000 | Rohrbaugh et al. | 714/738 |
| 6,078,188 A | * | 6/2000 | Bannai et al. | 324/765 |
| 6,094,061 A | * | 7/2000 | Saouli et al. | 324/761 |
| 6,097,204 A | * | 8/2000 | Tanaka et al. | 324/765 |
| 6,111,421 A | * | 8/2000 | Takahashi et al. | 324/758 |
| 6,130,543 A | * | 10/2000 | Iino | 324/754 |
| 6,137,303 A | * | 10/2000 | Deckert et al. | 324/765 |
| 6,151,390 A | * | 11/2000 | Volftsun et al. | 379/229 |
| 6,157,200 A | * | 12/2000 | Okayasu | 324/753 |
| 6,166,552 A | * | 12/2000 | O'Connell | 324/754 |
| 6,170,071 B1 | * | 1/2001 | Wheeler | 714/724 |
| 6,185,708 B1 | * | 2/2001 | Sugamori | 714/724 |
| 6,192,496 B1 | * | 2/2001 | Lawrence et al. | 714/724 |
| 6,194,911 B1 | * | 2/2001 | Currin et al. | 324/765 |
| 6,195,772 B1 | * | 2/2001 | Mielke et al. | 714/724 |
| 6,198,273 B1 | * | 3/2001 | Onishi et al. | 324/158.1 |

* cited by examiner

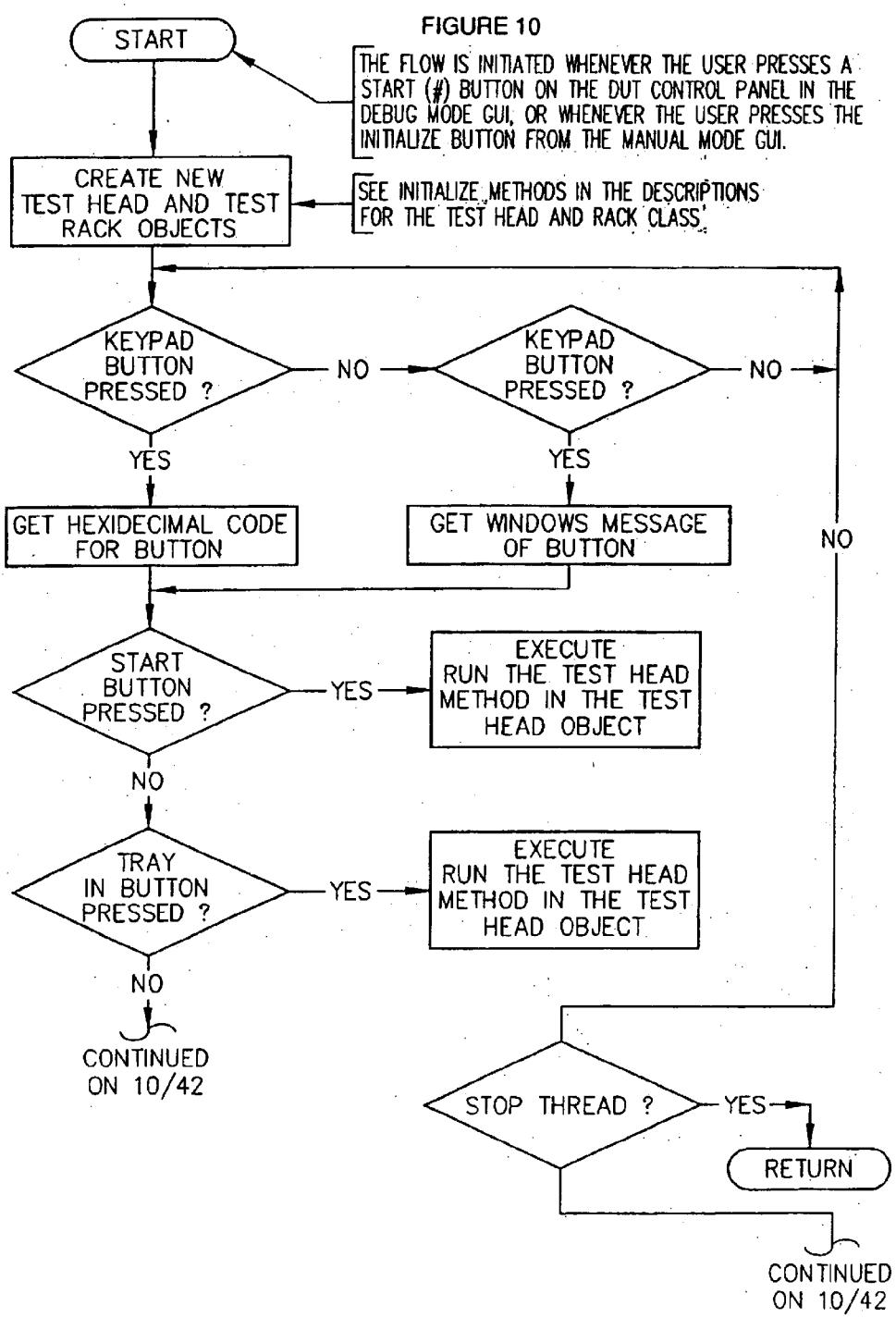

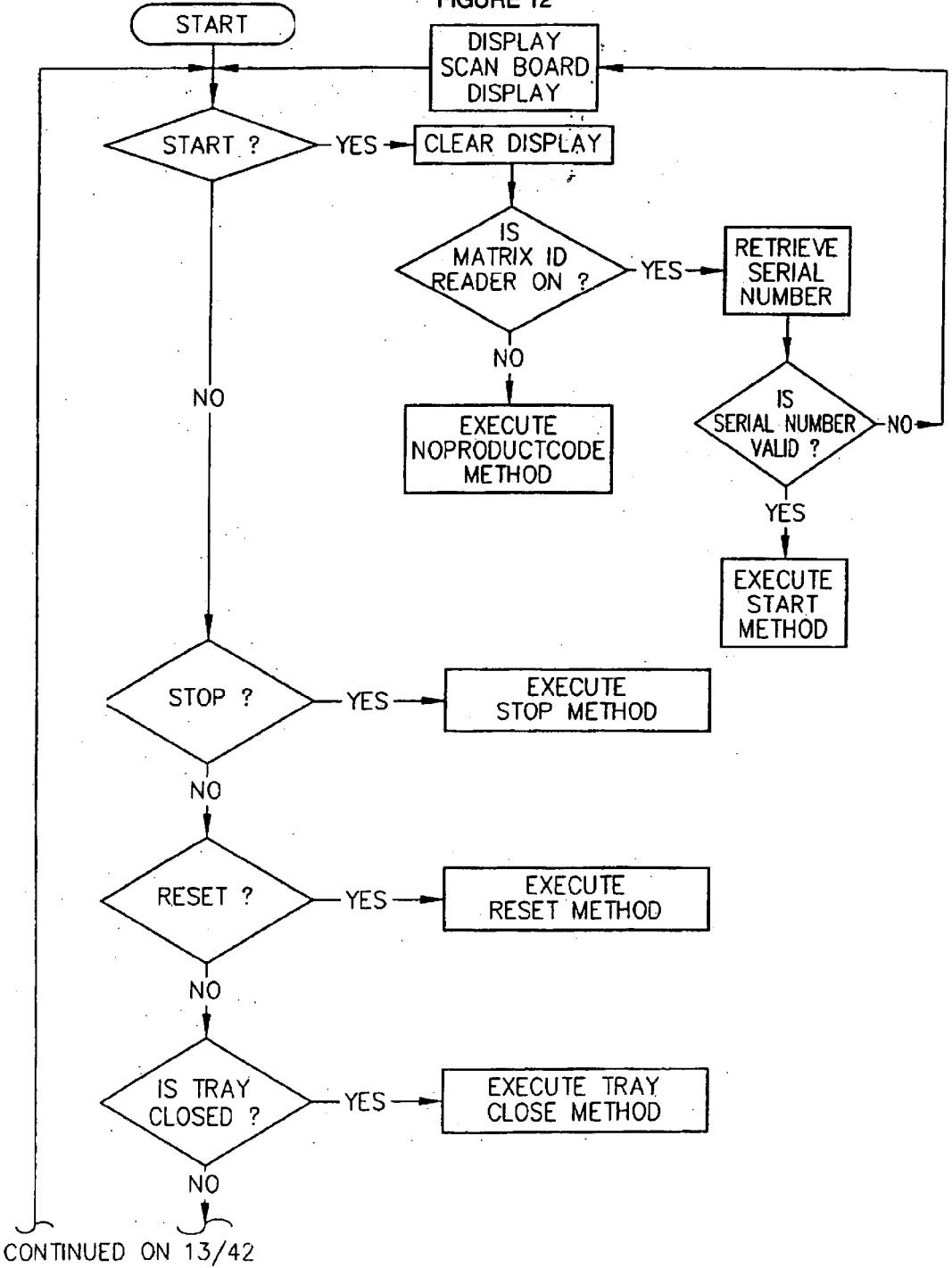

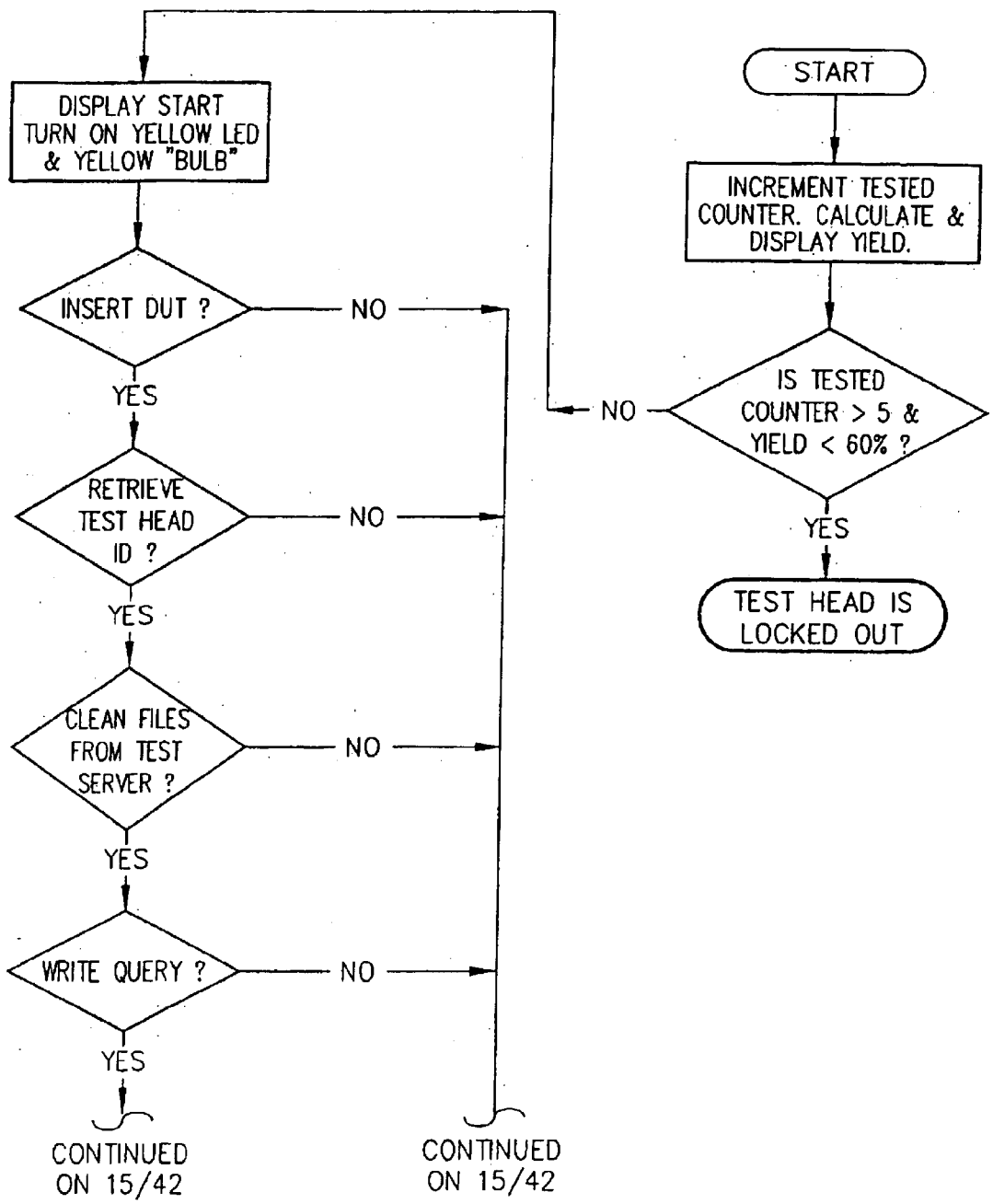

NOTE: EMPTYING THE SERIAL NUMBER STRING ACTS AS A FLAG TO THE MATRIX ID INHIBITOR OBJECT TO EXECUTE THE OPENINHIBIT METHOD

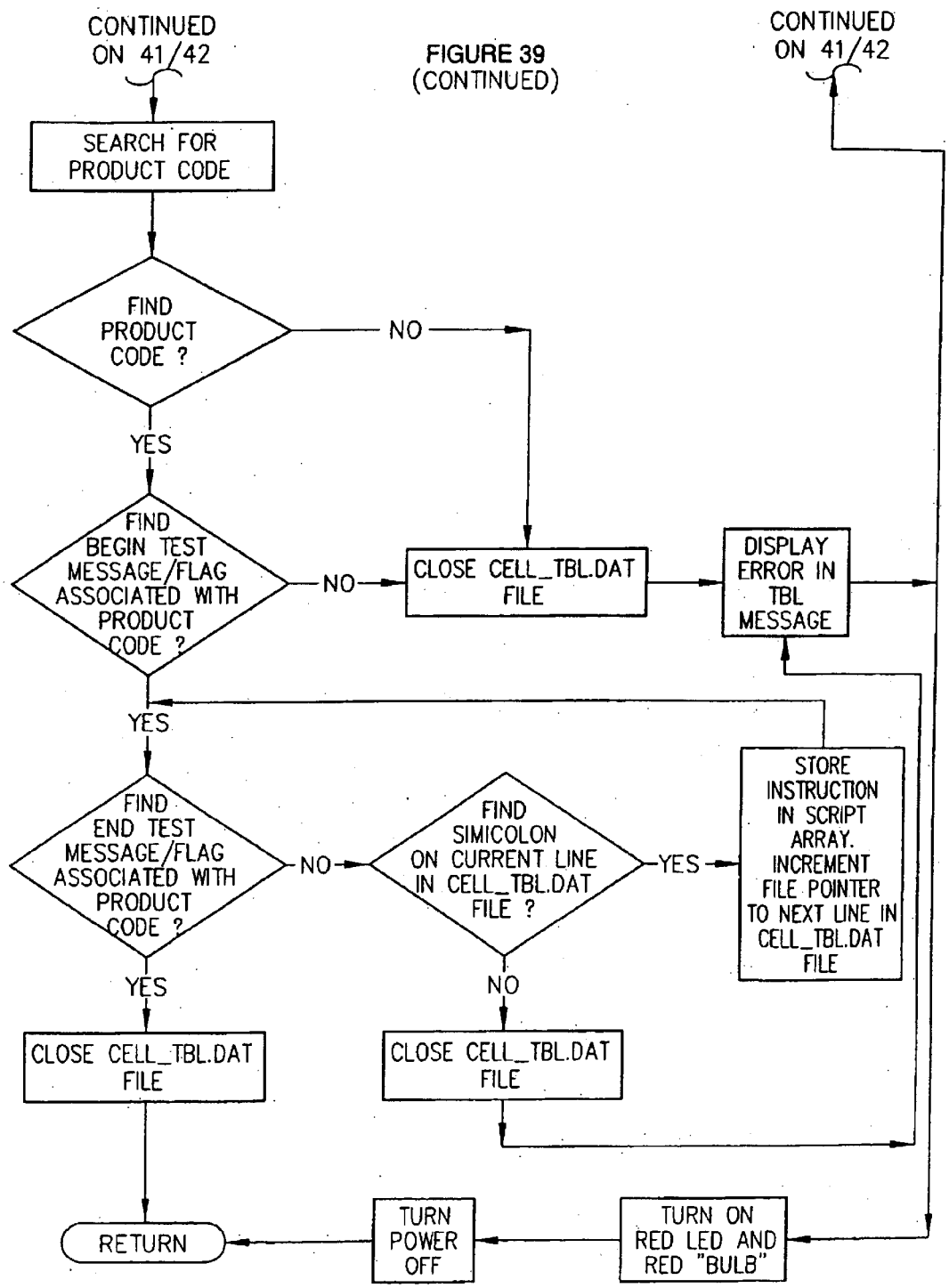

METHOD AND APPARATUS FOR CONTROLLING A TEST CELL

BACKGROUND OF THE INVENTION

1. Field of the Invention

This invention relates generally to device testing and, more particularly, to a method and apparatus for testing devices.

2. Description of the Related Art

Electronic devices are usually tested after their manufacture and before being shipped from the factory. In this context, "device" may mean an individual integrated circuit, or "chip," or may mean an assembled printed circuit board containing one or more chips. The hardware of such a tester is usually referred to as a "test cell" and usually has some software operating the test cell. The test cell generally includes a number of test heads into which devices are placed for testing. Device testers are designed to test a specific type of device and, so are uniquely adapted depending on the target device type. However, device testers, in many respects, have severely limited capabilities.

One typical limitation regards the number of device types that a tester may actually test. A test cell's unique adaptation to a particular type of device means that the test cell generally tests that device type well and thoroughly. On the other hand, the unique adaptation prevents the tester from effectively testing any other type of device. Thus, a test cell will usually test only a single type of device.

One approach to this difficulty is to include a variety of different test heads in a single test cell. However, each test head still is limited to testing a single device type. Further, the test cell increases in complexity with the number of different kinds of test heads. In effect, such a test cell is no more than a series of small test cells awkwardly cobbled together.

The present invention is directed to overcoming, or at least reducing the effects of, one or more of the problems set forth above.

SUMMARY OF THE INVENTION

In one aspect of the present invention, an apparatus is provided for testing a plurality of devices. The apparatus, in one embodiment, comprises a controller, a device identifier capable of identifying each one of a plurality of devices as one of a plurality of device types, and a plurality of test heads. Each test head is capable of testing each one of the devices independently of the rest of the plurality of test heads responsive to the identification of each device by the device identifier and under the control of the controller.

In a second aspect of the invention, a method is provided for testing a plurality of devices. The method, in one embodiment, comprises placing the plurality of devices identified into a plurality of test heads, each device being identified as one of a plurality of predetermined device its types and being placed in a respective test head; and directing the testing of each device independently of the testing for the remaining devices responsive to the respective identification of the device, the direction for the testing of each device coming from the same controller.

BRIEF DESCRIPTION OF THE DRAWINGS.

Other objects and advantages of the invention will become apparent upon reading the following detailed description and upon reference to the drawings in which.

Figure 1:
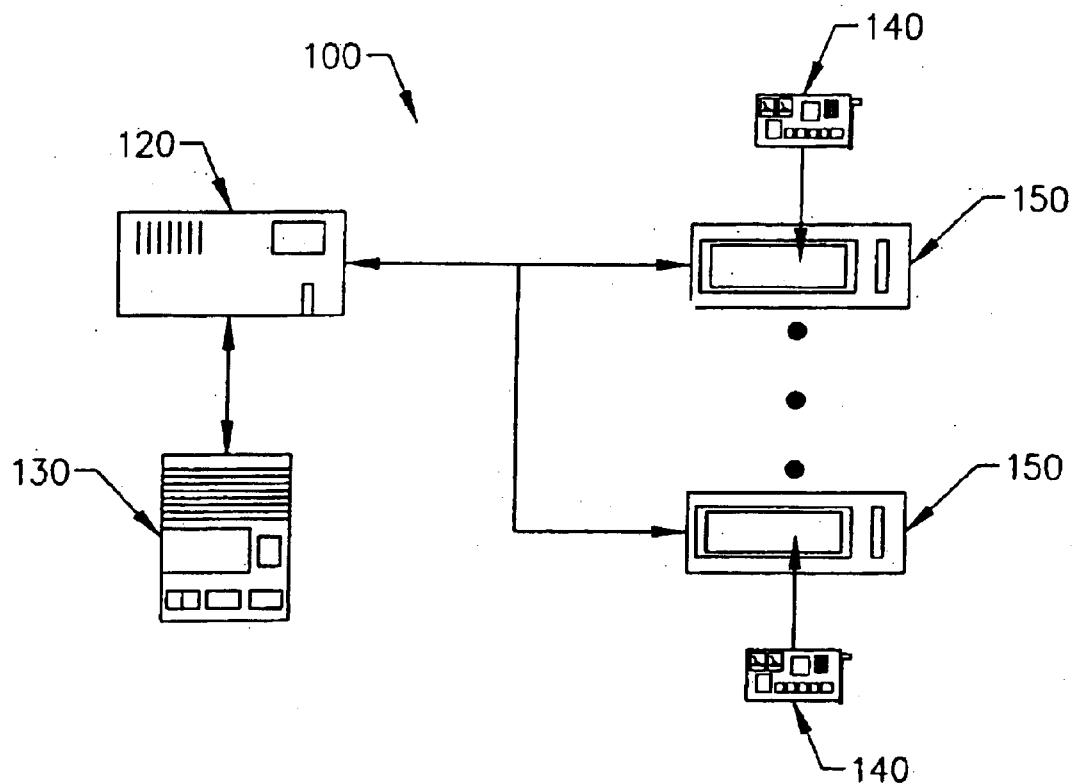
FIG. 1 is a block diagram of an apparatus for testing a plurality of devices constructed and operated in accordance with the present invention in a first invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Turning now to FIG. 1, an apparatus 100 constructed and operated in accordance with the invention is illustrated. The apparatus 100 generally comprises a controller 120, a device identifier 130, and a plurality of test heads 150. The device identifier 130 is capable of identifying each one of a plurality of devices 140 as one of a plurality of device types. Each test head 150 is capable of testing a device 140 independently of the rest of the plurality of test heads 150 responsive to an identification of the device 140 by the device identifier 130 and under the control of the controller 120. Thus, each test head 150 can effectively test any device 140 that is one of the plurality of device types, even when a second test head 150 is testing a device 140 of a second type.

The manner in which the controller 120, device identifier 130, and test heads 150 communicate among themselves will be implementation specific and may include any technique known to the art and suitable for a given implementation. For instance, the device identifier 130 is shown in FIG. 1 communicating directly with the controller 120. However, the invention is not so limited as, in other embodiments, the device identifier 130 and the controller 120 might communicate over a bus or some other communications medium. Conceivably, the controller 120 and device identifier 130 might even communicate wirelessly, such as by infrared or microwave techniques as are known to the art.

Figure 2:
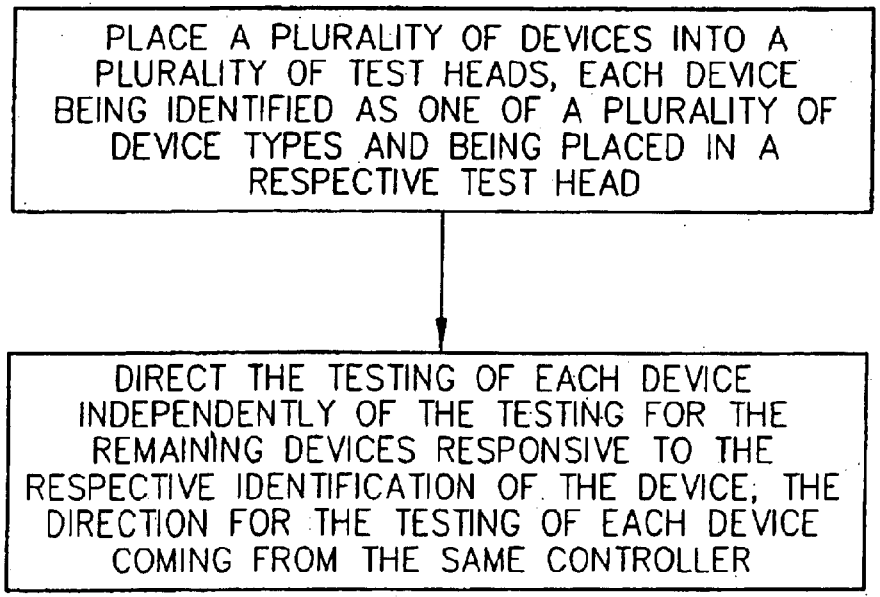
FIG. 2 is a block diagram of a method for testing a plurality of devices in accordance with a first embodiment of the invention.

FIG. 2 illustrates one embodiment of a method as may be practiced in accordance with the invention. Referring to both FIGS. 1 and 2, the method begins by placing the plurality of devices 140 into a plurality of test heads 150. Each device 140 is identified as one of a plurality of predetermined device types and is placed in a respective test head 150. Each device 140 may be identified prior to placement in the test head 150, but the invention is not so limited. In other embodiments, the device 140 might be identified after placement in the test head 150, provided the test head 140 has such capability. Next, the testing of each device 140 is directed independently of the testing for the remaining devices 140 responsive to the respective identification of the device 140. All tests are directed from the same controller 120.

Figure 3:
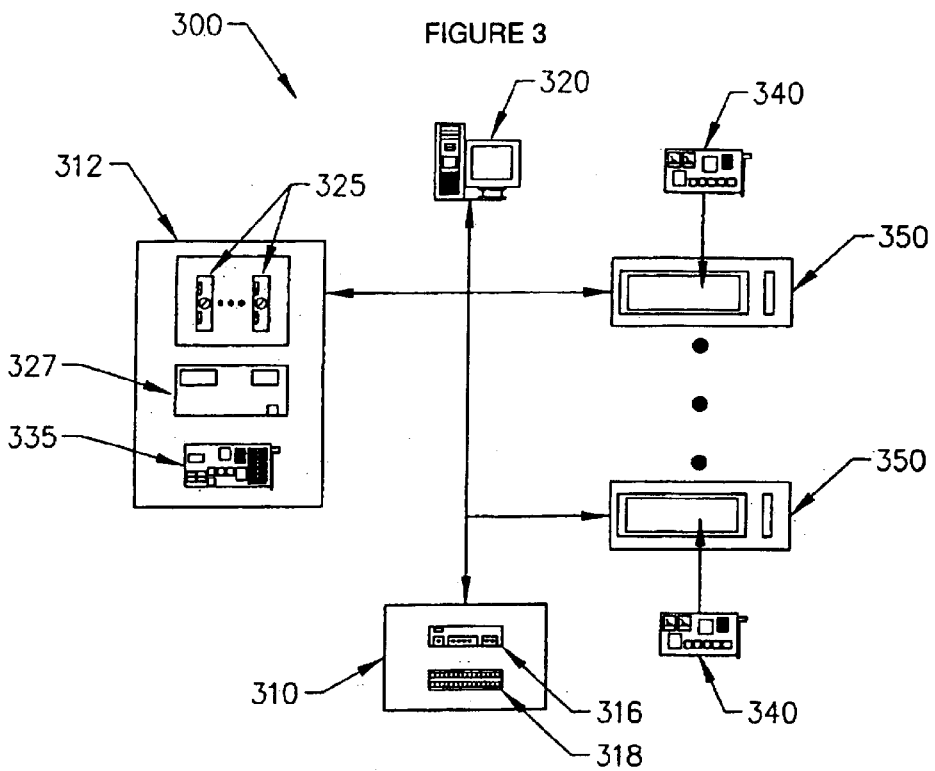
FIG. 3 is a block diagram of an apparatus for testing a plurality of devices built and operated in accordance with the present invention in a second embodiment.

FIG. 3 illustrates an apparatus 300 constructed and operated in accordance with a second embodiment of the invention. The apparatus 300 includes controller 327, a device identifier 310 capable of identifying a device 340 under test, and a plurality of test heads 350, as does the apparatus 100 in FIG. 1. Each test head 350, accordingly, is capable of testing any device 340 of a predetermined device type independently of the rest of the plurality of test heads 350 testing other devices 340 responsive to an identification by the device identifier 310 and under the control of the controller 327. The apparatus 300, however, further comprises a server 320 through which the controller 327 controls the plurality of test heads 350.

The controller 327 in the apparatus 300 comprises a part of a test bed 312. The test bed 312, in the embodiment illustrated, also includes a plurality of power supplies 325 and a communications interface 335. Thus, test bed 312 of the apparatus 300 controls the plurality of test heads 350 via the controller 327 and the server 320.

The device identifier 310 in FIG. 3 includes a serial number reader 316 and a product identifier 318. The device identifier 310, in this particular embodiment, identifies the device 340 before the device 340 is inserted into a test head 350, although this is not necessary to the practice of the invention. In this particular embodiment, the serial number reader 316 of the device identifier 310 reads the serial number from the device 340 in a manner known to the art. The product identifier 318 identifies the device 340 as one of several predetermined device types from the serial number of the device 340. The identification of the device 340 is then communicated to the controller 327. Note that the device identifier 310 is shown communicating with the controller 327 indirectly, as opposed to the embodiment in FIG. 1, in which the device identifier 130 communicates directly with the controller 120.

Figure 4:
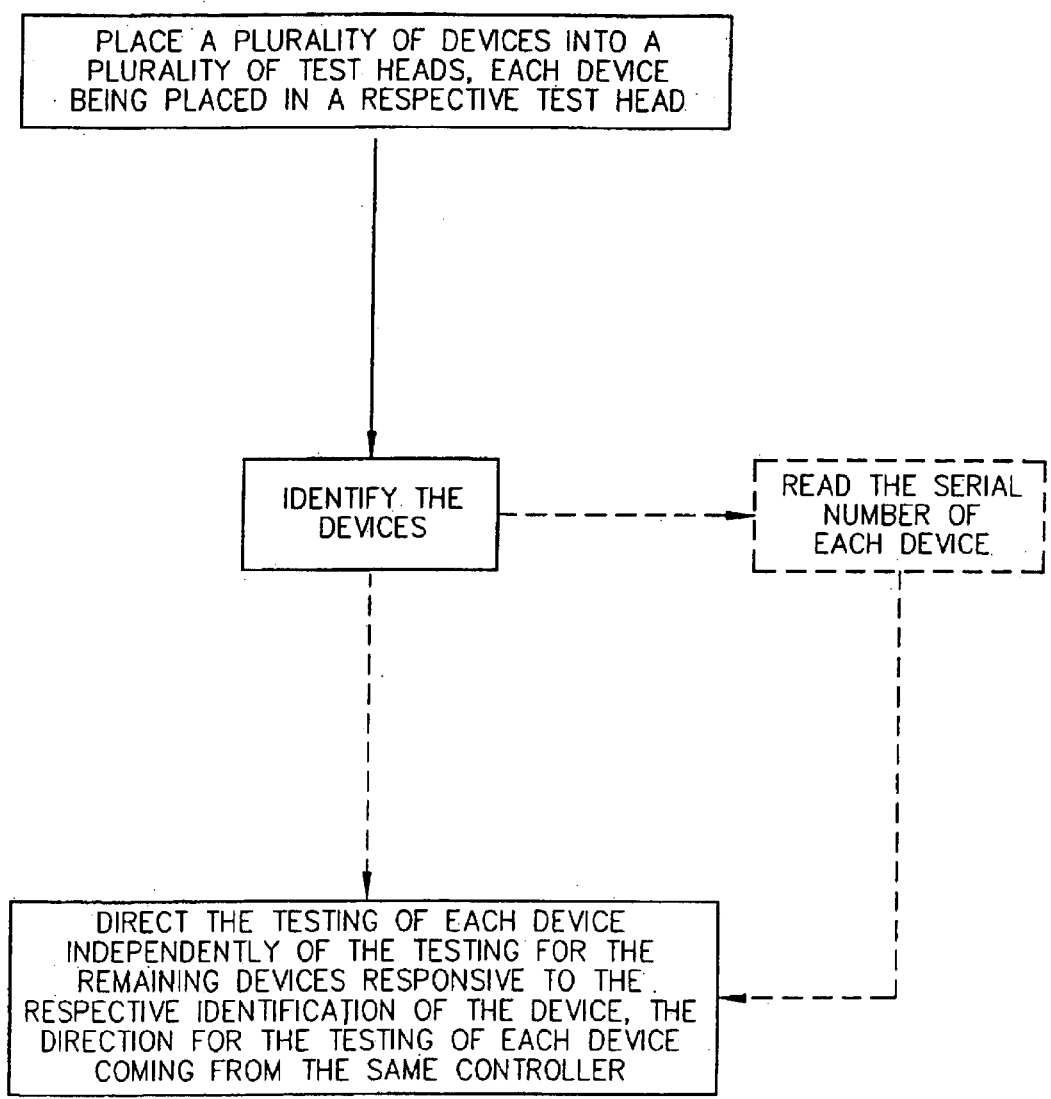
FIG. 4 is a block diagram of a method for testing a plurality of devices in accordance with a second embodiment of the invention.

FIG. 4 illustrates one embodiment of method as may be practiced in accordance with the present invention with the apparatus 300 of FIG. 3. Referring now to both FIGS. 3 and 4, the method begins by placing the plurality of devices 340 into a plurality of test heads 350, each device 340 being placed in a respective test head 350. The devices 340 may be previously identified using the device identifier 310 and, more particularly, the serial number reader 316 and the product identifier 318. The devices 340 may be identified either before or after being placed in the test heads 350, depending on the particular implementation. Either way, the testing of each device 340 is conducted independently of the testing for the remaining devices 340 and under the direction of the controller 327. The testing is conducted responsive to the respective identification of the device 340 in that different devices 340 may be subject to different testing protocols depending on their identification.

Figure 5:
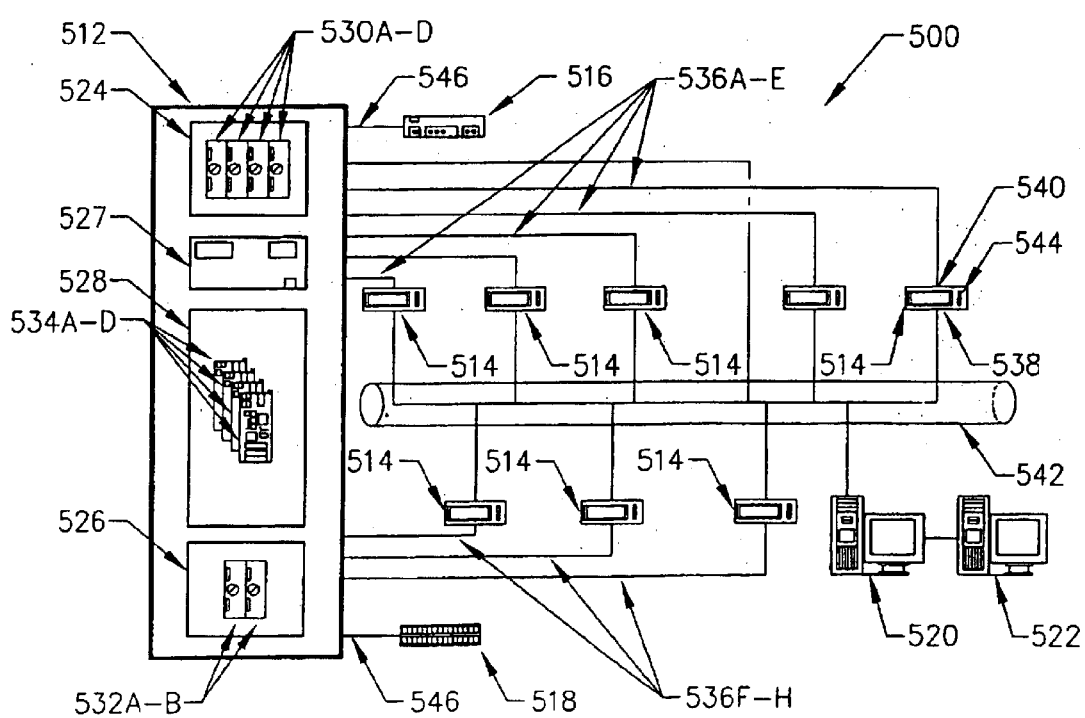
FIG. 5 is a block diagram of an apparatus for testing a plurality of devices built and operated in accordance with the present invention in a third embodiment.
Figure 6:
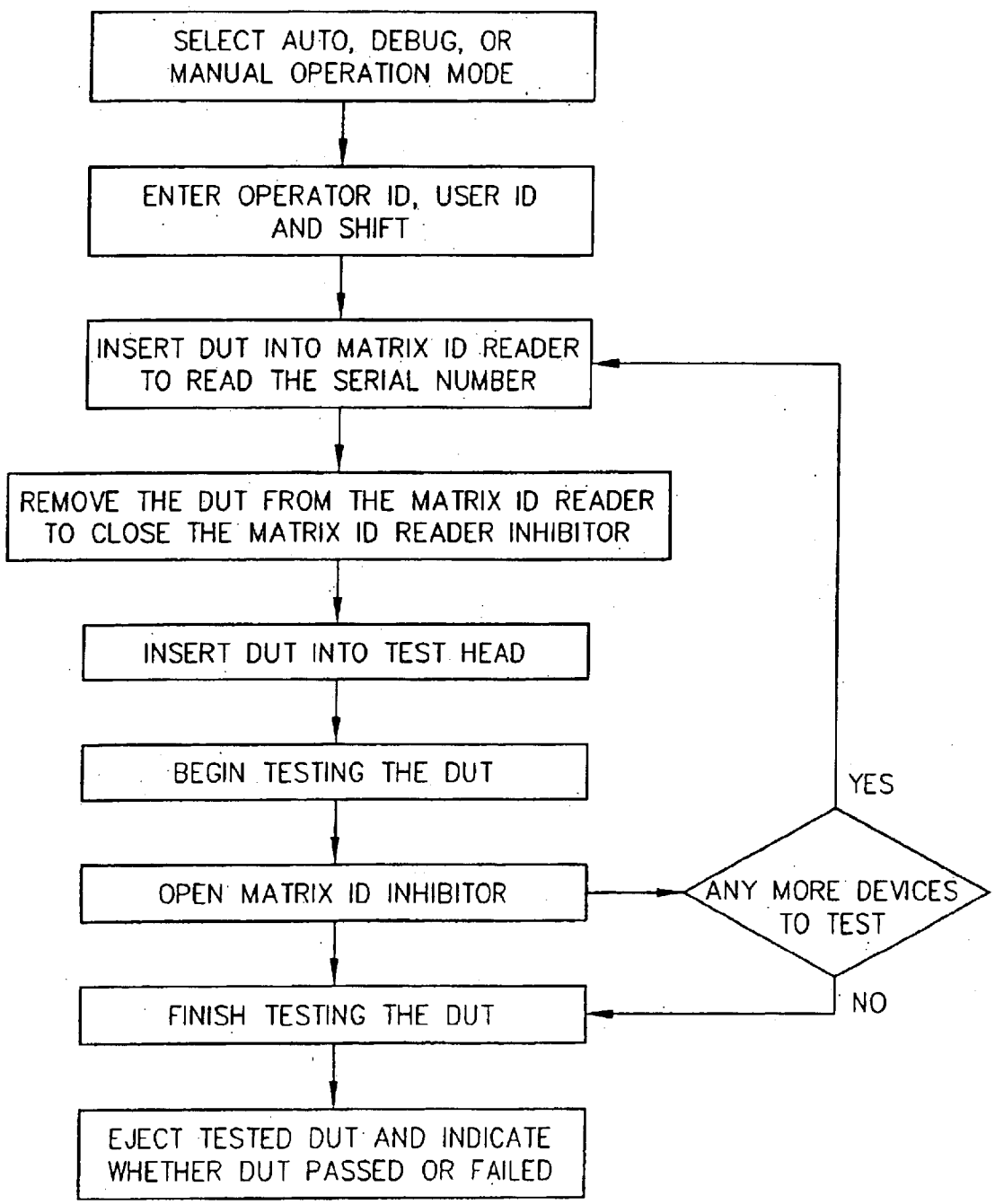
FIGS. 6–7 are block diagrams of a method for testing a plurality of devices in accordance with a third embodiment of the invention.

Turning now to FIGS. 5–6, one particular embodiment of the invention includes a multithreaded, C++, Windows® NT software application (not shown) controlling the hardware of a test cell 500 of FIG. 5 using the method of FIG. 6. The software may be encoded on any suitable program storage medium (not shown), which may comprise, without limitation, random access memory ("RAM"), a hard disk, a floppy disk, and an optical disk. The software provides a platform for testing mobile processor products. More particularly, this particular embodiment tests products incorporating processors for installation in portable computers, such as laptops. The test cell 500 includes a test rack 512, at least two test heads 514, a matrix identification ("ID") reader 516, a matrix ID reader inhibitor 518, a test server 520, and an IFICS server 522.

The test rack 512 comprises fixed power supplies 524, programmable power supplies 526, a controller 527, and a VersaModule Eurocard ("VME") bus eXtensions for Instrumentation ("VXI") card cage 528. The fixed power supplies 524 may include 24V, 12V, 5V, and 3.3V power supplies 530a–d, respectively, and the programmable power supplies 526 may include programmable $V_{DC}$ and 3.3V programmable power supplies 532a–b, respectively. The VXI card cage 528 may include a digital multi-meter ("DMM") card, two multiplexer ("MUX") cards, and two digital input/output ("DIG-IO cards") 534a–d, respectively. Alternative embodiments might also include a D1700 card (not shown). In one particular embodiment, the fixed power supplies 524, VXI card cage 528, and the programmable power supplies 526 are provided by an 801 Test Rack and an 801D Test Rack, both commercially available from Racal Instruments, Inc. Eight sets of cables 36a–h connect the test rack 512 to each test head 514.

The test rack 512 provides all necessary signals and data for testing the range of devices that might be tested in the test heads 514. For instance, the fixed power supplies 524 and programmable power supplies 532a–b provide all power necessary to power the devices. Similarly, the VXI card cage 528 provides the capability for the controller 527 to control the testing over the bus 542 and through the server 520 and the test heads 514. The bus 542 is an Ethernet such as is well known in the art. However, the invention is not so limited and any bus mechanism known to the art may be used.

Each test head 514 consists of an actuator 538, a cassette tray 540 used to insert the device (not shown in FIG. 5) into the actuator 538, an Ethernet connection 542 to the test server 520, the cable connections (not shown) to the test rack 512, and a keypad 544 to control the actuator 538 and the cassette tray 540. There are eight test heads 514 in the test cell 500 of FIG. 5. However, the invention is not so limited as the number of test heads 514 will be implementation specific. Each of the test heads 514 is connected to the test bed 512 via a set of RS-232 cables 536a–h, respectively.

The Matrix ID reader 516 and the matrix ID reader inhibitor 518 are connected to the test rack 512 via RS232 cables 546. The matrix ID reader 516 reads the serial number of a device under test. The Matrix ID reader inhibitor 518 selectively blocks user access to the Matrix ID reader 516 to regulate the availability of the Matrix ID reader 516 to the Cell Controller 527 as described further below.

The cell controller 527 communicates with the test heads 514 through software running on each apparatus. The software exchanges files through the test server 520. The names of these files are based upon the Ethernet address of the test head 514 requiring service and the type of service required. For example, if the Ethernet address of a test head 514 is ABC123 and the test head 514 requires query service from the IFICS server 522, the file name is ABC123.QRY. Additionally, the test server 520, in the embodiment illustrated, provides the means of communication to the IFICS server 522.

The IFICS server 522 ascertains the product code of a device under test based on the device's serial number. The product code is used to determine which set of test program instructions should be executed for a particular device under test. After the test is completed for that device, the Pass/Fail data is recorded according to its serial number stored on the IFICS server 522.

FIG. 6 illustrates one embodiment of a method practiced in accordance with the present invention using the test cell 500 of FIG. 5. Referring now to both FIGS. 5 and 6, the user first selects one of the Auto, Debug, or Manual operation modes for testing using a graphical user interface ("GUI") generated by the software resident on the controller 527. The user then enters their operator ID, user ID, and shift for record-keeping purposes. The user then inserts the first device into the matrix ID reader 516, which reads the serial number of the device. The user then removes the device from the matrix ID reader 516, which causes the controller 527 to close the matrix ID reader inhibitor 518 to temporarily prevent further use of the matrix ID reader 516.

The device is then placed in a test head 514. Because each of the test heads 514 operates independently of the others, the device may be placed into any unused test head 514. Once the device is placed in a test head 514, the controller 527, under control of the software resident thereon, directs the testing of the device to begin. The testing is responsive to the identification of the device generated by the matrix ID reader 516 in that the identification drives the selection and parameters of the test applied to the device.

At some point during testing of the device, the controller 527 directs the matrix ID inhibitor 518 to open. This permits the user to identify another device using the matrix ID reader 516, insert the identified device into a test head 514, and begin testing another device. Thus, the matrix ID reader inhibitor 518 selectively blocks user access to the matrix ID reader 516 to regulate the availability of the Matrix ID reader 516 to the Cell Controller 527. In the embodiment illustrated, the block persists long enough to set up and begin the test for an identified device.

Figure 7:
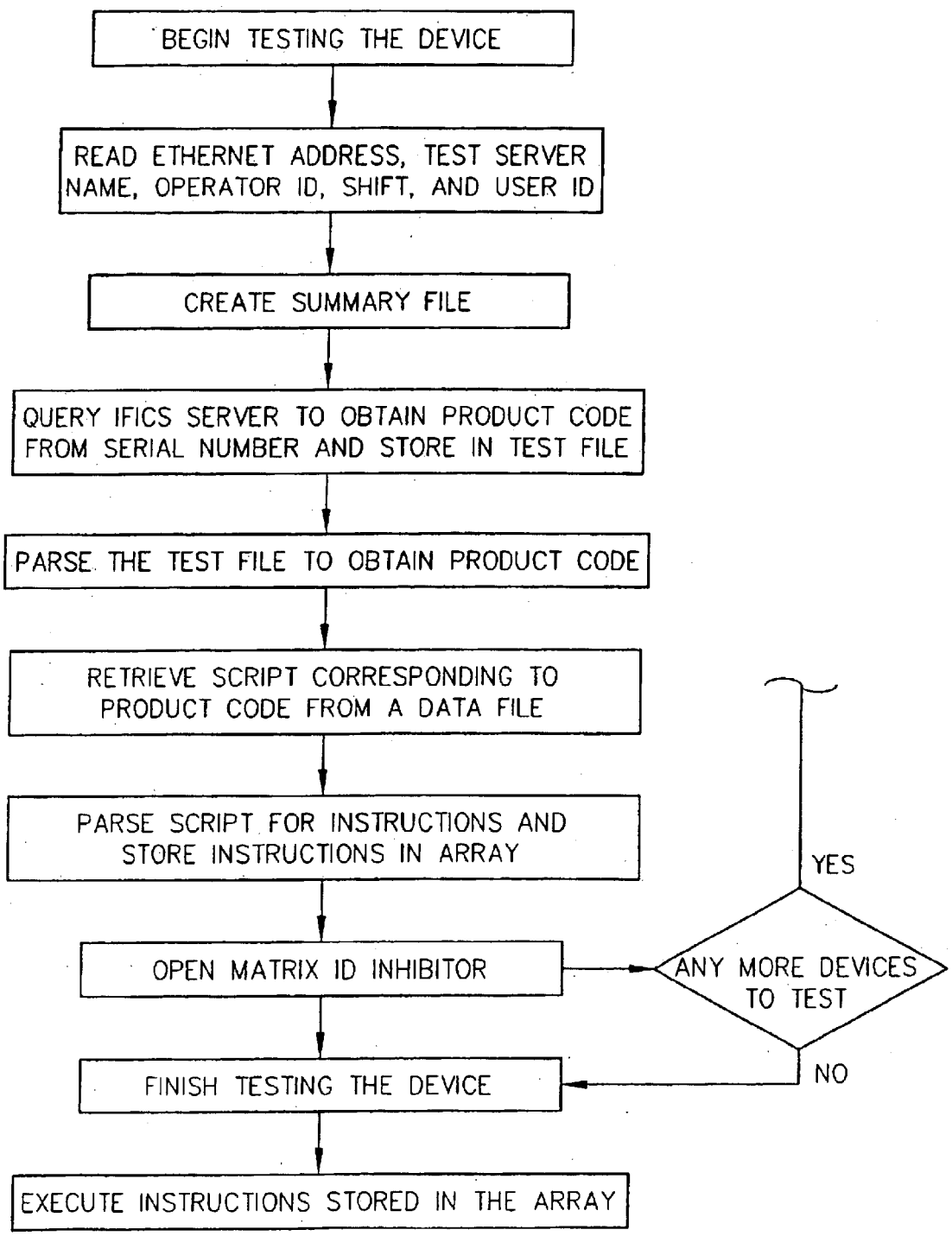

In one particular variant of this embodiment, when the test for any given device is begun, the software implements the method presented in FIG. 7. When the cassette tray 540 closes, the device is plugged into an Easter-T Mule board assembly (not shown). The Ethernet address of the test head 514 is read from a NOVRAM in the test head 514. The test server name, the operator ID ("OPID"), the shift, and the user ID are read from separate files created by the controller 527 when the respective information is made available. The controller 527 then creates a new, summary file associated with the Ethernet address of the test head 514 and containing the serial number of the device, the OPID, the shift, and the user ID. The test server 520 then query the IFICS server 522, looks up the product code based upon the serial number, and creates a new, test file.

The cell controller 527, executing the software stored thereon, then parses the test file for the product code, opens a data file containing scripts based on product codes that defines the testing protocols for each type of device. The cell controller 527 identifies the appropriate script based on the product code stored in the summary file for the device under test, parses the script containing the instructions for testing the respective device, and stores the instructions in an array. The cell controller 527 then opens the matrix ID reader inhibitor 518. The cell controller 527 then executes the test instruction stored in the array.

Returning to FIG. 6, upon completing the test instructions, the cell controller 527 instructs the test head 514 to eject the device under test and displays an indication of whether the device passed. The controller 527, which has been monitoring the test, then displays an indication of whether the device passed or failed the test. Once the test head 514 is empty, it may be used to test another identified device. Eventually, testing is completed for all devices under test and no more devices are put to test. The test cell 500 can then be powered down.

Figure 8:
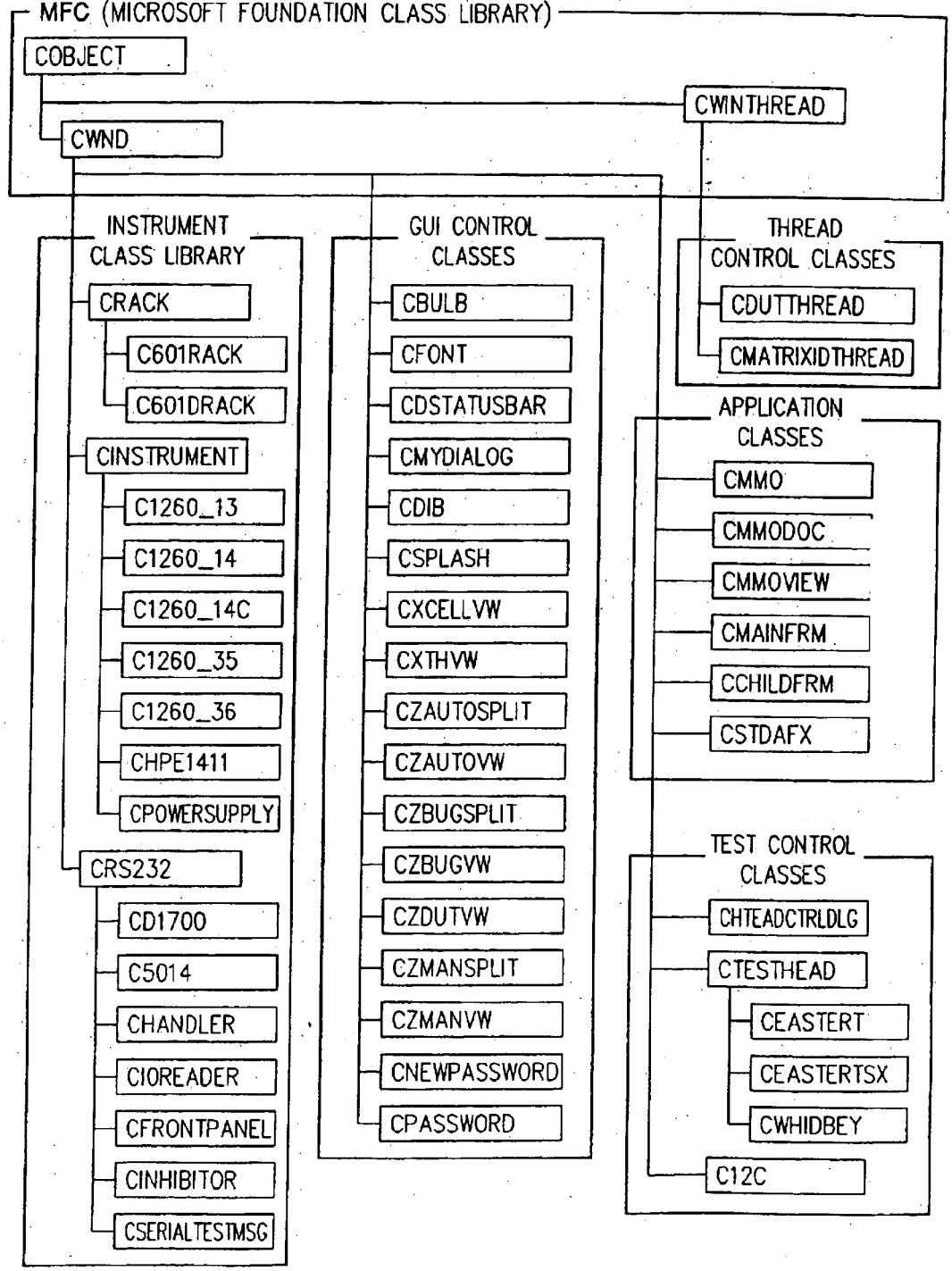
FIG. 8 illustrates the software architecture of the embodiment in FIGS. 5–7.

As mentioned above, the cell controller software in this particular embodiment is an object oriented application whose software architecture is shown in FIG. 8. This particular embodiment is coded using the commonly known programming language C++ and the Microsoft Foundation Classes ("MFC") software developers kit. However, the invention is not so limited and may employ other programming languages, even if those languages are not object oriented. The practice of the invention is likewise not limited to the MFC software developers kit. A brief explanation of several object oriented programming concepts is provided to further discussion of the invention below.

Three key concepts define object oriented technology in programming: (1) "objects" that encapsulate procedures and data; (2) "messages" that support polymorphism across objects; and (3) "classes" that implement inheritance within class hierarchies. These concepts are well known in the art and are described in many books, such as *Object Technology—A Manager's Guide* (Second Edition) by David A. Taylor, Ph.D. (First Printing September, 1997).

More particularly, an object is a software element that combines data and related procedures that manipulate that data. The procedures are referred to as "methods" to distinguish them from conventional procedures that are not attached to objects. The data elements are referred to as variables.

A class is a software template that defines the methods and variables to be included in each instance of an object that is created from the class using its software template. The class specifies a data structure and the permissible methods that apply to each of the objects created from the template. Typically, the data structure comprises numerous pointers that represent a physical address for the location of data, the actual data itself, or both. Each class is often uniquely identified by a data value known as a class identifier. An object, then, is an instance of a particular class The methods and variables that make up an object are defined only once, in the definition of the class. In any particular application there may be many objects of a certain class. The objects that belong to a class contain only their own particular values for the variables, but all objects of a particular class contain the same methods. It is possible for one class of objects to be defined as a special case of a more general class. This mechanism or technique is known as "inheritance."

Returning to FIGS. 5–6, the cell controller software controls the hardware of the test cell 500 by emulating the test hardware functions and providing an interface to the user operating the test cell 500. The controlling object within this software is the test head object. The test head object communicates and controls the hardware and communicate with the user. The communication is accomplished by constructing:

graphical user interface ("GUI") objects;
instrument objects;
the test head object, including passing pointers of the GUI and instrument objects into the test head object.

The test head object communicates to the GUI and instrument objects through the pointers. To increase the efficiency of the test platform, each test head is made to operate independent of all the other test heads by creating a thread object for each test head.

More particularly, this particular embodiment of FIGS. 5–6 includes at least the following exemplary objects:

main application (MMO.cpp) object: derived from CWinApp, this object interfaces the main application with the Windows operating system to execute the MMO Cell Controller software. When the Cell Controller software is first called, this object initializes the GUI. This object also controls the calls made to the objects mapped to the menu and toolbar items discussed elsewhere.

bulb object (BULB.cpp): this object links and embeds a graphic object into the XCELLVW.CPP and XTHVW.CPP constituent object files discussed below. Bulb objects are grouped in three to emulate the red, yellow, and green light emitting diodes ("LEDs") on a test head. Red indicates that the board failed; green indicates that the board passed; and yellow indicates that the test head cannot process another board until it finishes processing the current one (busy).

status display object (XTHVw.cpp): object displays the status and messages of each test head during its test execution. The color of the bulb object represents the status of the test execution: red for fail; yellow for busy; and green for Pass. The messages are displayed in a list box associated with the appropriate test head. The XTHVw Class is derived from CFormView.

number of devices under test display object (XCellVw.cpp): this object displays the number of devices under test in a particular test head, the number that passed the test suite for a particular test head, and the yield for each particular test head. The XCellVw Class is derived from CFormView.

splitter objects (ZAutoSplit.cpp, ZManSplit.cpp, ZBugSplit.cpp): these objects create a splitter window view displayed when the Auto Mode, Manual Mode, or Debug Mode toolbar or menu item is selected, respectively. The splitter windows contains the ZAutoVw, ZManVw, or ZBugVw views, respectively; the XCellVw view, and the XTHVw view. The ZAutoSplit Class, SManSplit Class, and ZBugSplit Class are derived from CMDIChildWnd.

view creation object (ZAutoVw.cpp, ZManVw.cpp, ZBugVw.cpp): These objects create the Auto Mode, Manual Mode, and Debug Mode views, respectively, to provide user interfaces in these various modes. The ZAutoVw Class, ZManVw Class, and ZBugVw Class are derived from CFormView.

thread creation object (DUTThread.cpp): this object starts the thread for a test head. The keypad buttons on the test head, or, if in Debug mode, the front panel buttons on the GUI, are continuously polled, ready for the user to press a button. The appropriate method call to the test head object, testhead.cpp (discussed below), is made. For example, if you press the TrayIn button, the test head object executes the OnTrayIn( ). DUTThread.cpp is derived from CWinThread.cpp.

binding object (TheadCtrlDlg.cpp): this object contains all of the methods that bind test head functionality, including control of the cassette tray movement, keypad buttons and display, and LEDs to the GUI features in the test head control dialog box.

enable objects (Testhead.cpp, EasterT.cpp, Whidbey.cpp): these objects contain all of the methods that enable test head functionality, including control of the cassette tray movement, keypad buttons and display, and LEDs. The Testhead Class is a base class; the EasterT Class and the Whidbey Class are derived from TestHead.cpp and all of the methods are overloaded from TestHead.cpp.

instrumentation objects (Rack.cpp, 801Rack.cpp, 802Rack.cpp, Instument.cpp, 1260_13.cpp, 1260_14.cpp, 1260_14C.cpp, 1260_35.cpp, 1260_38.cpp, HPE1411.cpp, PowerSupply.cpp): These objects emulate the instrumentation of the test rack and includes base classes and classes derived from the base classes. The base classes include:

(1) the Rack Class, from which the 801Rack, 802Rack classes are derived; (2) the Instrument Class, from which the 1260_13, 1260_14, 1260_14C, 1260_35., 1260_38, HPE1411 classes are derived, and (3) the PowerSupply Class. The Rack BASE class contains all methods enabling test rack functionality including: controlling the actuators that control cassette tray movement, communication via the RS232 port to the keypad buttons, keypad display, Matrix ID Reader, and the Matrix ID Inhibitor, and controlling the fixed power supplies, the programmable power supplies, and the VXI card cage via the GPIB. The Instrument BASE class contains all methods enabling basic functionality of instruments interconnected via GPIB that use National Instruments CVI software. The various derived classes address various operational characteristics including protocols and standards.

communication objects (RS232.cpp, D1700.cpp, 5014C.cpp, HANDLER.cpp IDReader.cpp, FrontPanel.cpp, Inhibitor.cpp): These objects emulate basic functionality of all RS232 devices and includes the RS232 BASE class and classes derived from the base classes. The D1700, 5014C, HANDLER derived classes specifically emulate communications devices in the test rack. The IDReader Class, FrontPanel Class, and Inhibitor Class emulate communication the cell controller and the Matrix ID Reader, the test rack front panel (not shown), and the Matrix ID Reader Inhibitor, respectively.

message object (SerialTestMsg.cpp): this object sets up the communication between the motherboard in the testhead and the MMO Cell Controller via a RS-232 port and enables the MMO Cell Controller software to communicate to the test suite software.

The methods and a description thereof associated with each object is set forth in Tables 1-X appended hereto and which form a part of this specification.

The main application object (MMO.cpp) defines five document templates, which include MMO, Manual Mode, Automatic Mode, Debug Mode, and DUT Configuration. More particularly:

- the MMO document template provides the main application view, which appears when the application is opened. This view provides the means to open ASCII files using the file open menu item, or to open any Mode document template when the associated toolbar button or menu item is selected.
- when the DUT Configuration template is selected when the user selects which product will be tested. The software automatically configures the test heads to work with the selected product.
- when the Debug Mode template is selected the Debug Mode view appears by calling the ZBugSplit object, which calls the ZBugVw object, XTHVw object, and the XCellVw object to create a splitter window. When the ZBugVw object is called it creates a IDReader object, either a Handler object or Inhibitor object (depending upon the test platform configuration), reads the OPID, user ID, shift, and server text files and updates all edit boxes. If the start Matrix ID Reader button is pressed the MatrixIDThread object is created. When any test head button is pressed a TheadCtrlDlg object is created without a DUTThread object being created.
- when the Manual Mode template is selected the Manual Mode view appears by calling the ZManSplit object, which calls the ZManVw object, XTHVw object, and the XCellVw object to create a splitter window. When the ZManVw object is called it creates an IDReader object, a MatrixIDThread object, an Inhibitor object, eight TheadCtrlDlg objects also signaling each TheadCtrlDlg object to create a DUTThread object, and reads the OPID, user ID, shift, and server text files and updates all edit boxes.
- when the Automatic Mode is selected the Automatic Mode view appears by calling the ZAutoSplit object, which calls the ZAutoVw object, XTHVw object, and the XCellVw object to create a splitter window. When the ZAutoVw object is called it creates an IDReader object, a MatrixIDThread object, an Handler object, eight TheadCtrlDlg objects also signaling each TheadCtrlDlg object to create a DUTThread object, and reads the OPID, user ID, shift, and server text files and updates all edit boxes.

When a TheadCtrlDlg object is created it is passed a pointer to the IDReader object, a pointer to the Handler object (if it was created), a pointer to the XTHVw object, a pointer to the XCellVw object, and a test head number corresponding to the test head to control. The TheadCtrlDlg object provides a dialog box containing controls for the test head and is responsible for the creation of the thread running that test head.

When a DUTThread object is created it is passed a pointer to the XTHVw object, a pointer to the XCellVw object, a pointer to the Handler object (if it was created), a pointer to the list box object which resides in the TheadCtrlDlg dialog box, a test head number corresponding to the test head to control, and a flag indicting if the Matrix ID reader is being used. The DUTThread object starts a program thread for the test head associated with it. This object first creates an appropriate Rack (801, 801A, or 802) object and appropriate TestHead object (EasterT, EasterTSX, or Whidby), and then starts the program thread which is constantly looping responding to keypad commands from buttons being depressed on the test head front panel keypad.

When a Rack object is created it is passed a test head number corresponding to the test head to control, creates a cable map object which defines signal names and connections from the test head to the equipment contained within the Rack, and creates the instrument objects associated with the 'type' of Rack being created. For an 801Rack object a Frontpanel object, 1260__14 object, 1260__13 object, 1260__35 object, HPE1411 object, and PowerSupply object are created. For an 802Rack object a Frontpanel object, 1260__14C object, 1260__38 object, D1700 object, 5014 object, HPE1411 object, and PowerSupply object are created. The Rack object now contains all of its constituent instrument objects. As per FIG. 1 we now have constructed a software model of the test rack hardware.

When a TestHead object is created it is passed a pointer to the XTHVw object, a pointer to the XCellVw object, a pointer to the Handler object (if it was created), a pointer to the list box object which resides in the TheadCtrlDlg dialog box, a test head number corresponding to the test head to control, a flag indicting if the Matrix ID reader is being used, and a pointer to the Rack object. Also at the time of creation the 'type' of test head is determined. If an EasterTSX or Whidby test head type is determined then a SerialTstMsg object is created. The communication mechanism between the test head and the rack instruments is either through a serial port (required by EasterTSX and Whidby) or through a ether net port (required by EasterT).

As will be recognized by the art, each of the above objects will be associated with one or more methods. As with the objects, the number and definition of methods and objects will be implementation specific. The methods associated with the objects set forth above in this particular embodiment are set forth in Tables 1–32 in the Appendix hereto. The logic flow for several, selected methods are set forth FIGS. 9A–39 as noted in Tables 1–32.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

Appendix

TABLE 1

Methods Associated With MMO.cpp

MMO( );: Constructs the MMO object.
~MMO( );: Destructs/Destroys the MMO object.
PreTranslateMessage(MSG* pMsg);: Processes Windows messages passed to the application.
DisableTheToolBarAndMenu(int pressed__ID);: Once an item from the toolbar or menu has been selected, this method disables the item (masks it in gray).
EnableTheToolBarAndMenu( );: After the selected toolbar or menu item has been successfully executed, this command enables the item (fills it in with color).
InitInstance( );: Initializes the MMO application GUI. (See FIG. 3.)
OnAppAbout( );: Processes calls to the selected About menu and toolbar item.

OnModeManual( );: Processes calls to the selected Manual Mode menu and toolbar item.
OnModeAutomatic( );: Processes calls to the selected Auto Mode menu and toolbar item.
OnModeDebug( );: Processes calls to the selected Debug Mode menu and toolbar item.
OnXmode( );: Processes calls to the selected Exit Mode menu and toolbar item.
OnAppExit( );: Processes calls to the Exit menu.
OnPassword( );: Processes calls to the selected Password menu and toolbar item.

TABLE 2

Methods Associated With BULB.cpp

Bulb( );: Constructs the bulb object.
~Bulb( );: Destructs/Destroys the bulb object.
SetBackColor(OLE_COLOR);: Matches the background color of the bulb with the color of the window.
SetForeColor(OLE_COLOR);: Sets the foreground color of the bulb to red, yellow, or green.
SetCaption(LPCTSTR);: Centers the text within the bulb (for labeling the object).
GetFont( );: Retrieves the font you mapped to the text using the SetCaption method. Use this method in conjunction with the font object (FONT.CPP).
SetFont(LPDISPATCH);: Sets the font you assign to the text using the SetCaption method. Use this method in conjunction with the font object (FONT.CPP).
TurnOn( );: Changes the color of the bulb object to the foreground color you previously set using the SetForeColor method. This makes the "bulb" appear that it has been turned on.
TurnOff( );: Changes the color of the bulb object to the background color you previously set using the SetBackColor method. This makes the "bulb" appear that it has been turned off.

TABLE 3

Methods Associated With XTHV.cpp

XTHVw( );: Constructs the XTHVw object.
~XTHVw( );: Destructs/Destroys the XTHVw object.
InitXTHView( );: Initializes the XTH view by turning the "bulbs" off and clearing the list boxes.
ShutXTHView( );: Turns off all the "bulbs" simultaneously in the XTH view.
THBarGreen(int nBar);: Turns a "bulb" green.
THBarYellow(int nBar);: Turns a "bulb" yellow.
THBarRed(int nBar);: Turns a "bulb" red.
THBarOff(int nBar);: Turns off a "bulb".
writeTHL(CString strLBData, int nBar);: Writes a message in a list box.
SeparatorTHL(int nBar);: Inserts a blank line in a list box.
ClearTHL(int nBar);: Clears the contents of a list box.

TABLE 4

Methods Associated With XCellVw.cpp

XCellVw( );: Constructs the XCellVw object.
~XCellVw( );: Destructs/Destroys the XCellVw object.
CVBarReset(int nBar);: Resets the Tested, Passed, and % counters to 0.
CVBarCount(int nBar);: Increments the Tested counter and displays the result in the Tested edit box.
CVBarPass(int nBar);: Increments the Passed counter and displays the result in the Passed edit box.
CVBarYield(int nBar);: Calculates the yield and displays it in the Yield edit box.
InitXCellView( );: Initializes the XCell view, resetting the Tested, Passed, and % counters to 0.
TestYield(int nBar);: After a test head has been started five times, the method determines whether the yield has dropped below 60 percent.
ShutXCellView( );: Resets the Tested, Passed, and % counters to 0.

TABLE 5

Methods Associated With ZxxxSplit.cpp

ZxxxSplit( );: Where xxx is Auto, Bug, or Man, constructs the ZAutoSplit, ZBugSplit, or ZManSplit object, respectively.
~ZxxxSplit( );: Where xxx is Auto, Bug, or Man, destructs/Destroys the ZAutoSplit, ZBugSplit, or ZManSplit object, respectively.
OnCreateClient(LPCREATESTRUCT lpcs, CCreateContext* pContext);: Specifies the sizes of and includes the views that are displayed within the splitter window view. The views included are ZAutoVw in the ZAutoSplit object, ZBugVw in the ZBugSplit object, or ZManVw in the ZmanSplit object, respectively, and XTHVw and XCellVw in each of the ZAutoSplit, ZBugSplit, or ZmanSplit objects.
PreCreateWindow(CREATESTRUCT& cs);: Specifies the qualifiers of the splitter window.

TABLE 6

Methods Associated With ZAutoVw.cpp

ZAutoVw( );: Constructs the ZAutoVw object.
~ZAutoVw( );: Destructs/Destroys the ZAutoVw object.
CMMODoc* GetDocument( );: Gets the document associated with the application.
InitAutoView( );: Display 'ShutDown' in the rack listbox associated with this view.
ShutAutoView( );: Display 'ShutDown' in the rack listbox associated with this view.
ZAutoVw* GetThisView( );: Gets the object pointers for each splitter view associated with this window.
RackSelfTest( );: Executes rack self test.
ServerUp( );: Test connection to test server.
StartMatrixID( );: Starts the Matrix ID thread.
StopMatrixID( );: Stops the Matrix ID thread.
StartHandler( );: Starts the Board Handler.
OnAppExit( );: Defeats normal exit of application, ensuring the operator will not close the application before the application has been terminated.
OnFileClose( );: Defeats normal exit of window.
OnOpid( );: This method stores the OPID.
OnShift( );: This method stores the shift.
OnUserid( );: This method stores the user ID.
OnAinit( );: Initialize this view, instruments, and test heads.
OnAshut( );: Close this view.
OnButthx( );: Opens test head control panel for test head x, where x=[1,8].

TABLE 7

Figure 9A:
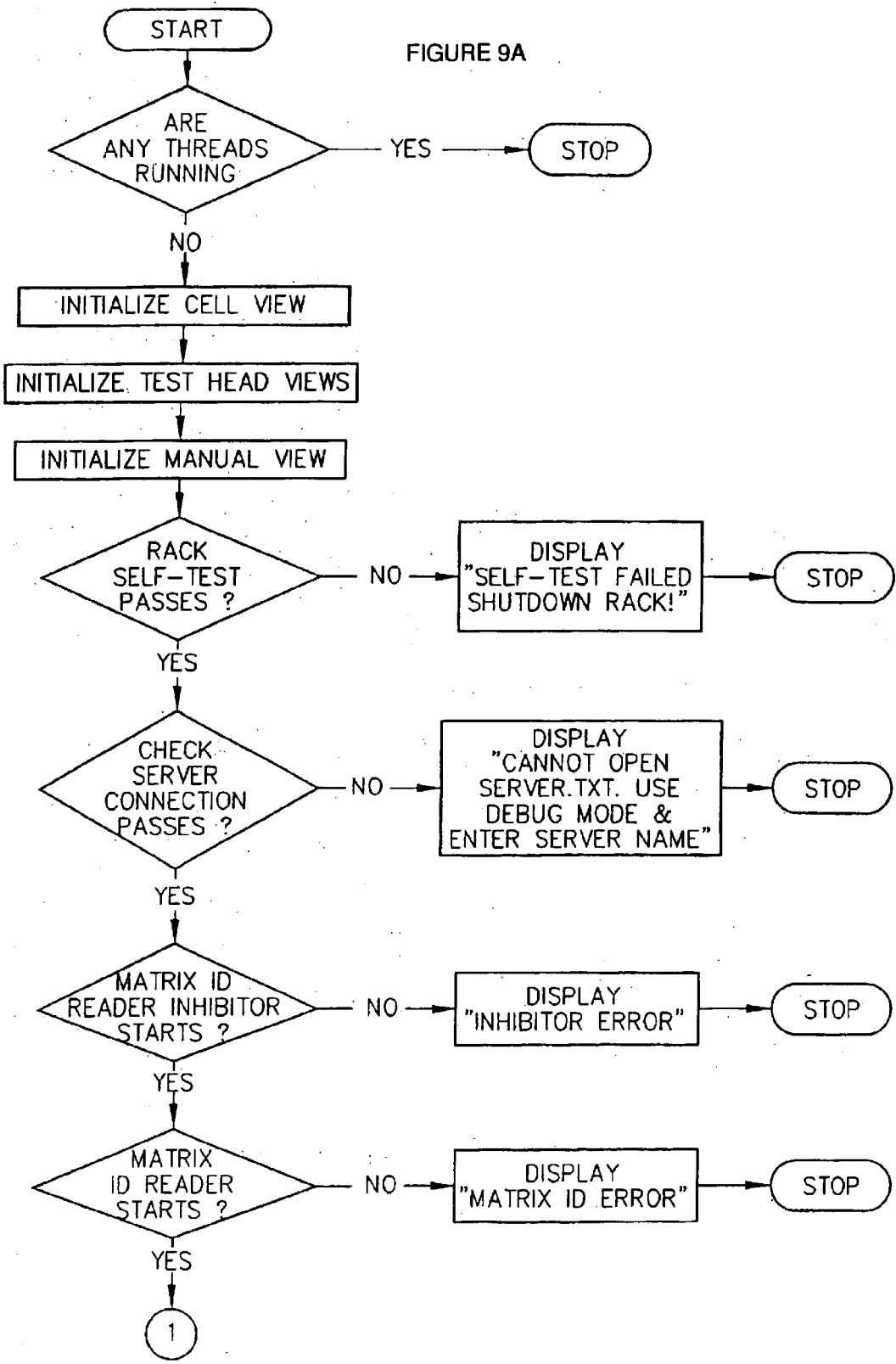
FIGS. 9A–39 are flow charts of selected objects and methods of the software architecture in FIG. 8.
Figure 9B:
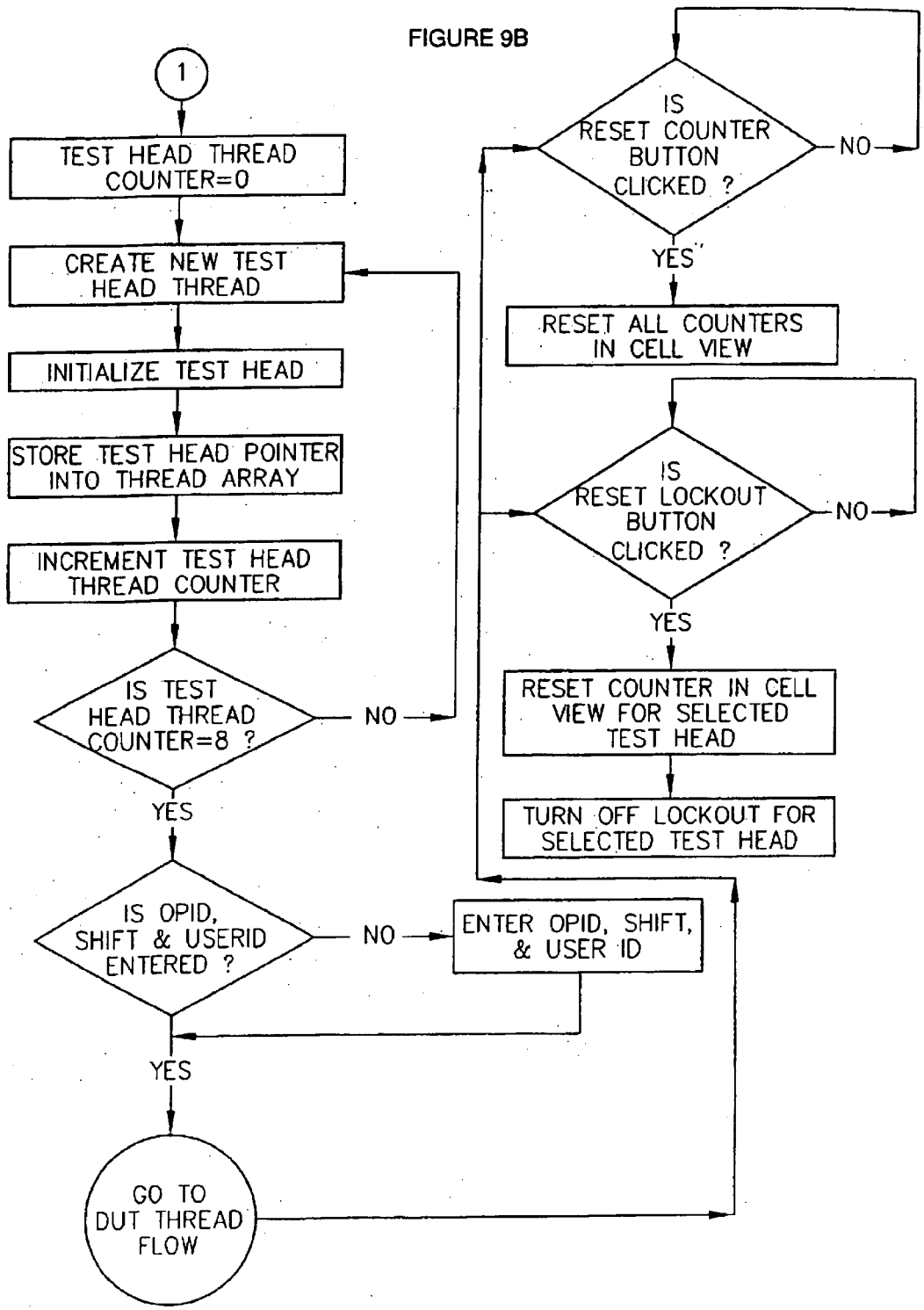
Figure 10:
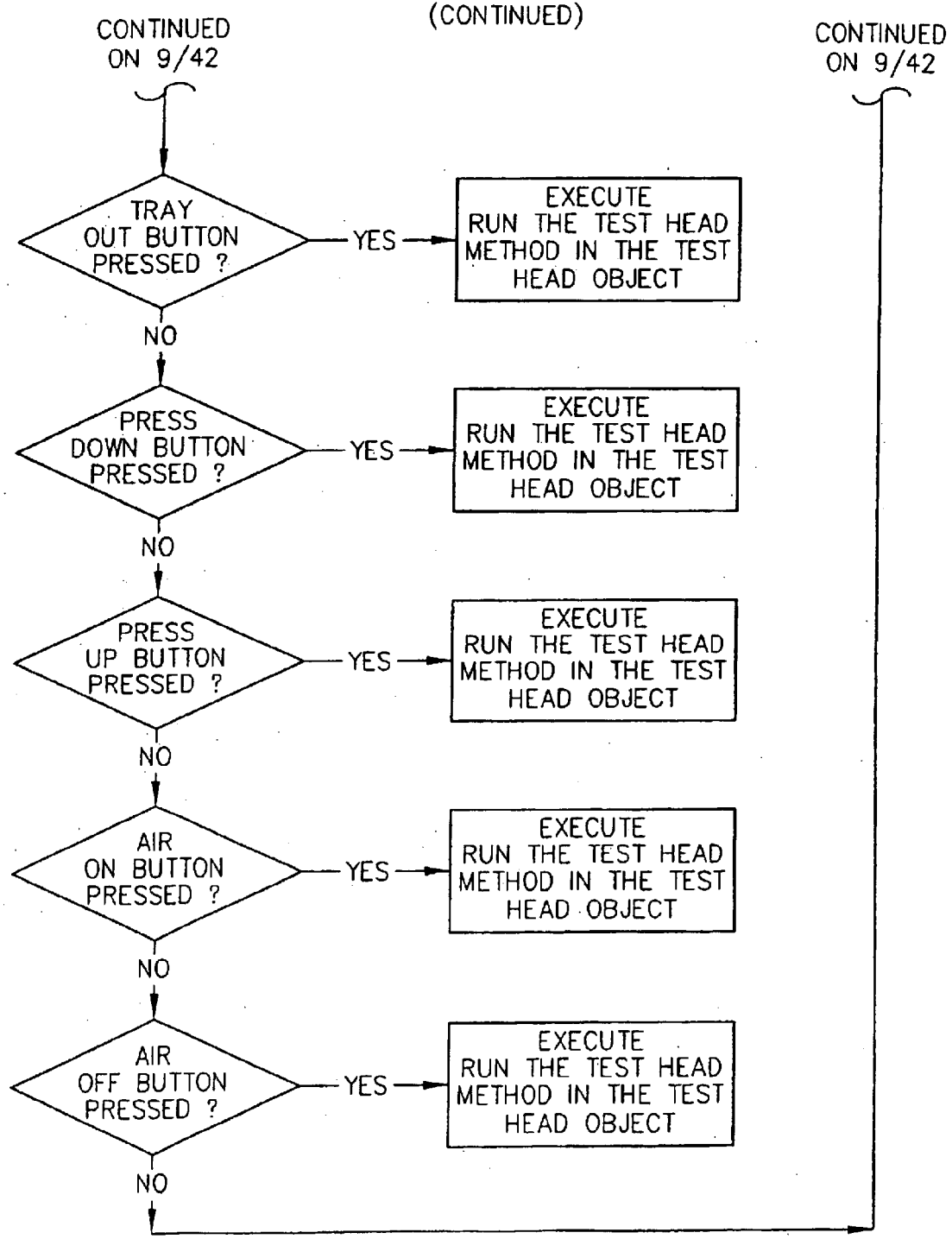
Figure 11:
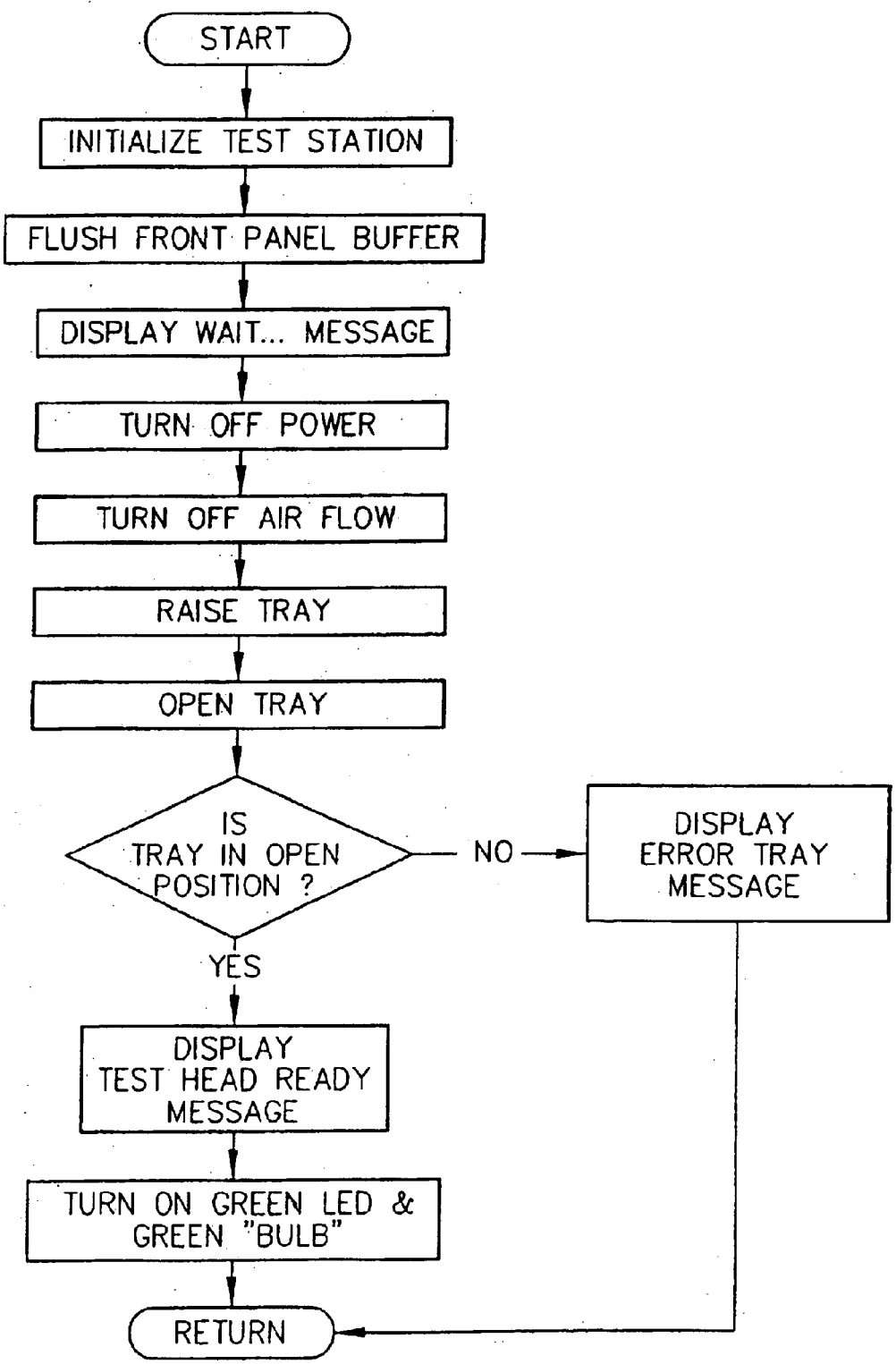
Figure 12:
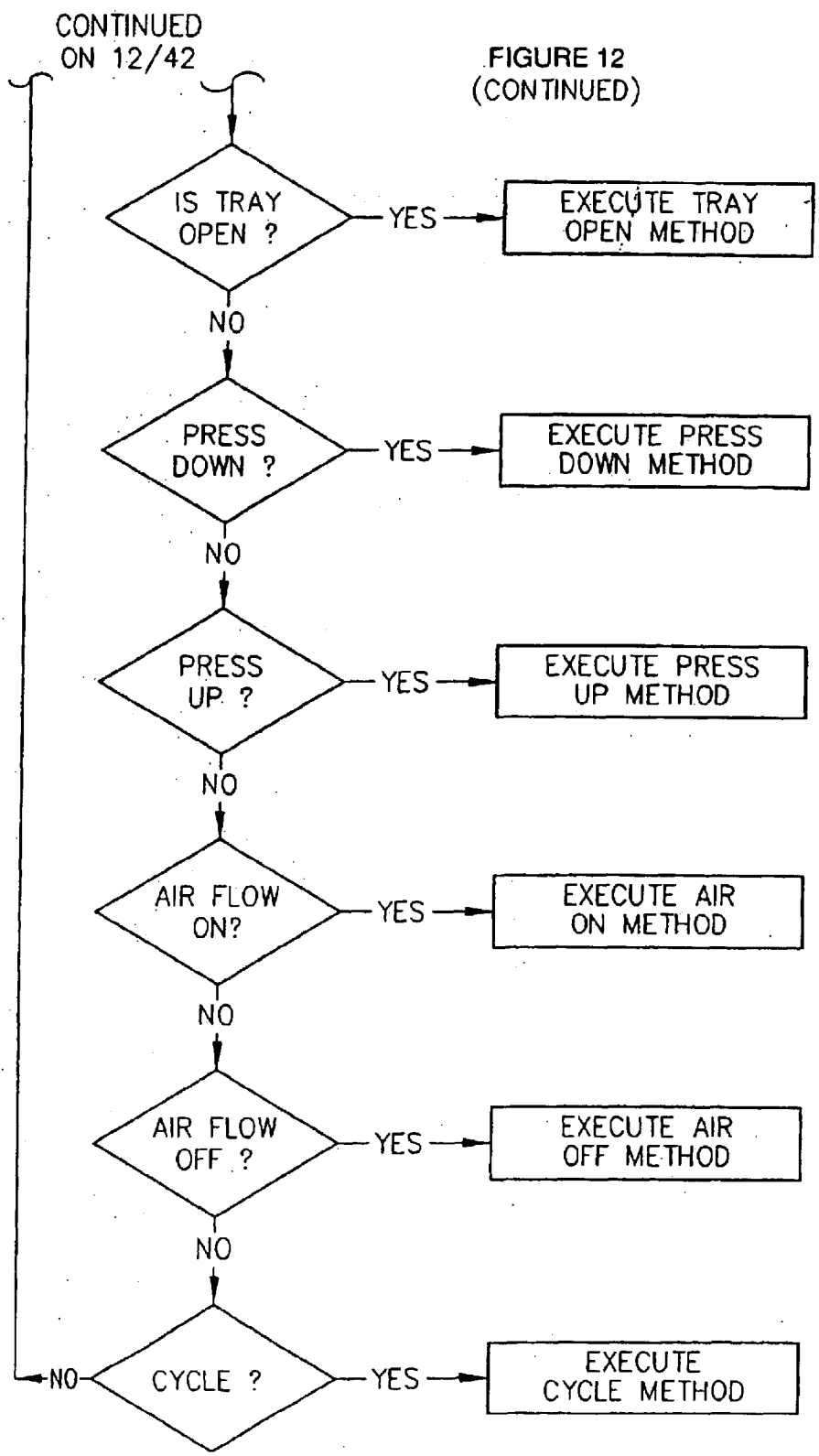
Figure 13:
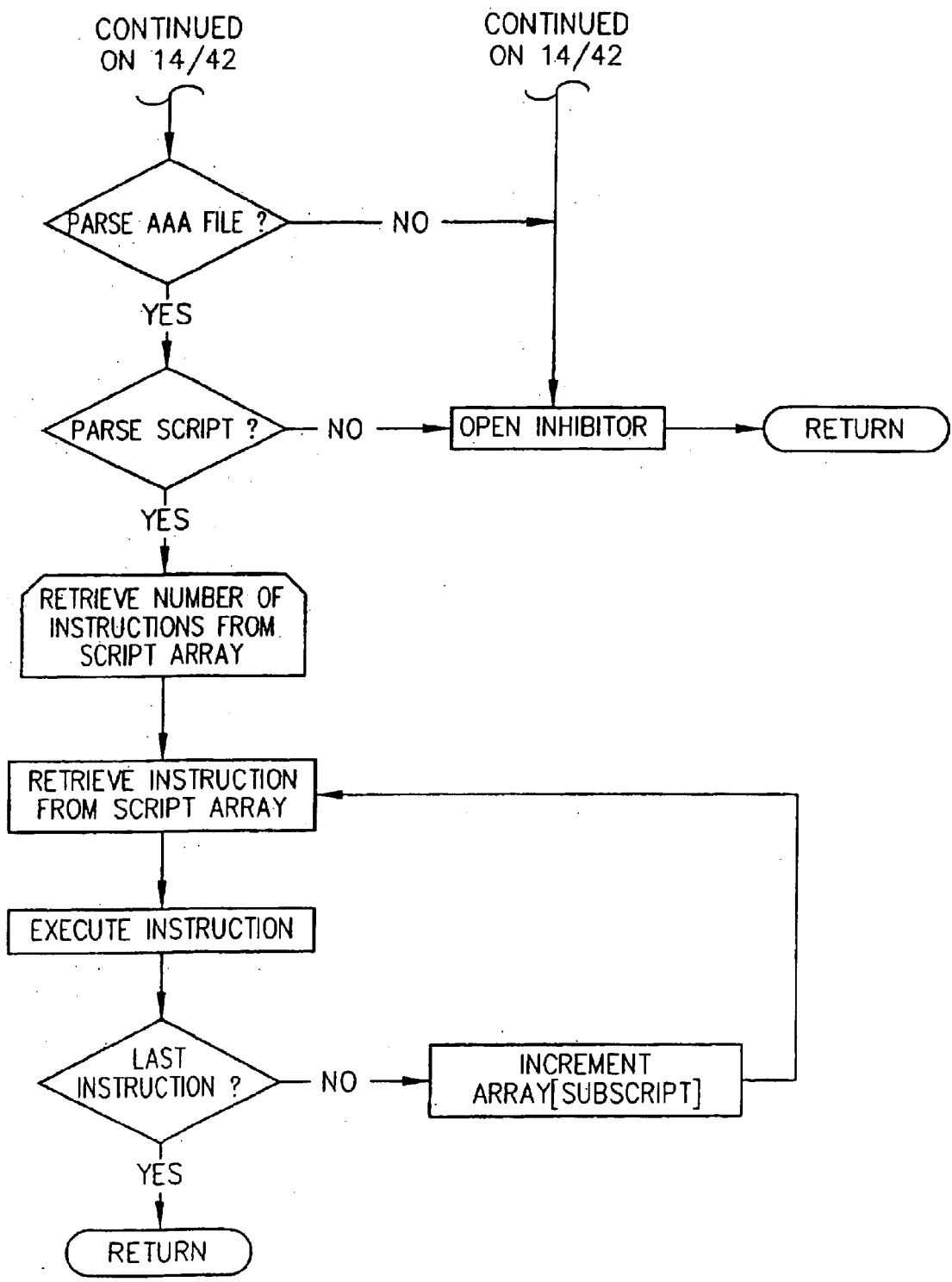
Figure 14:
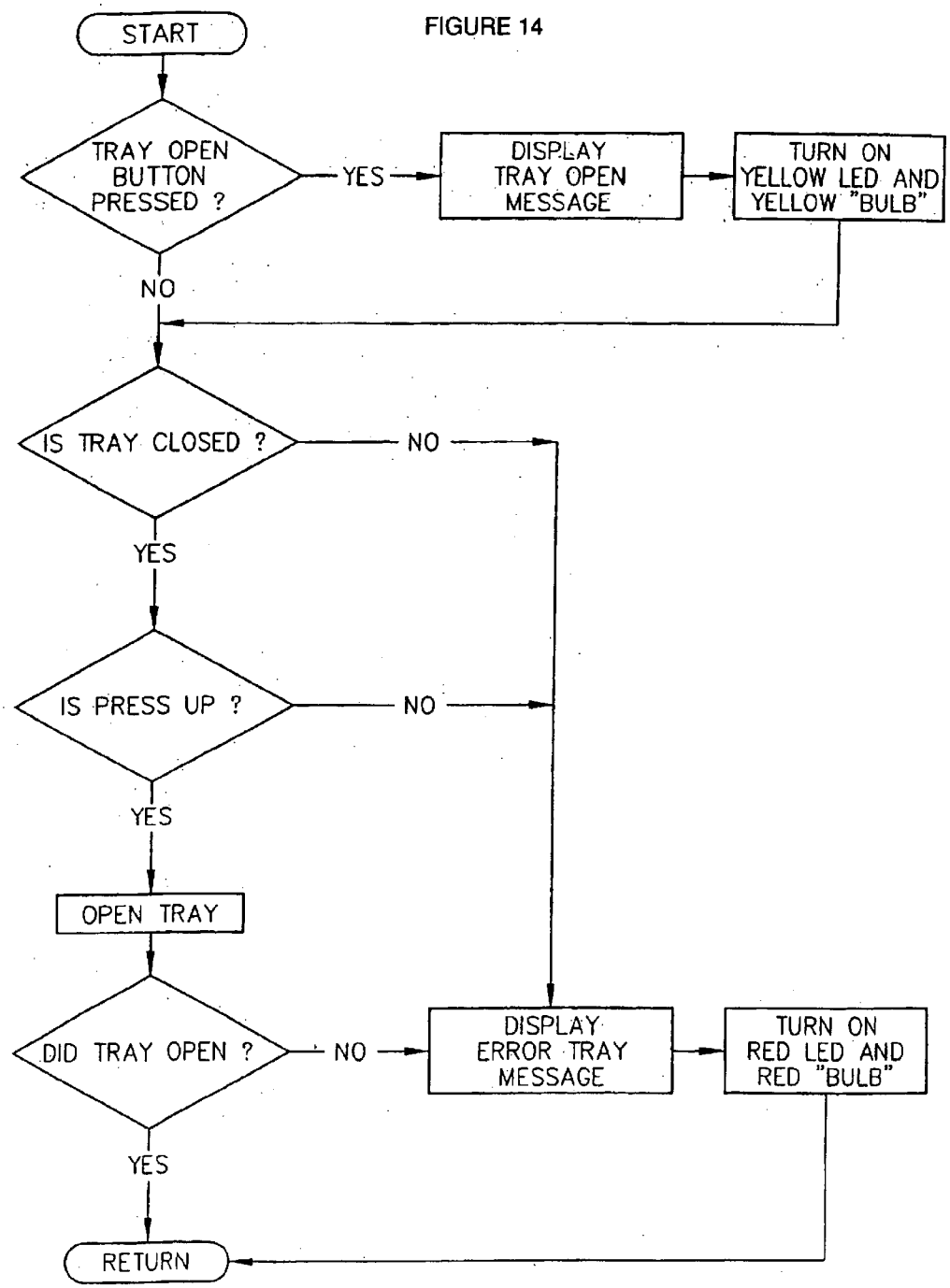
Figure 15:
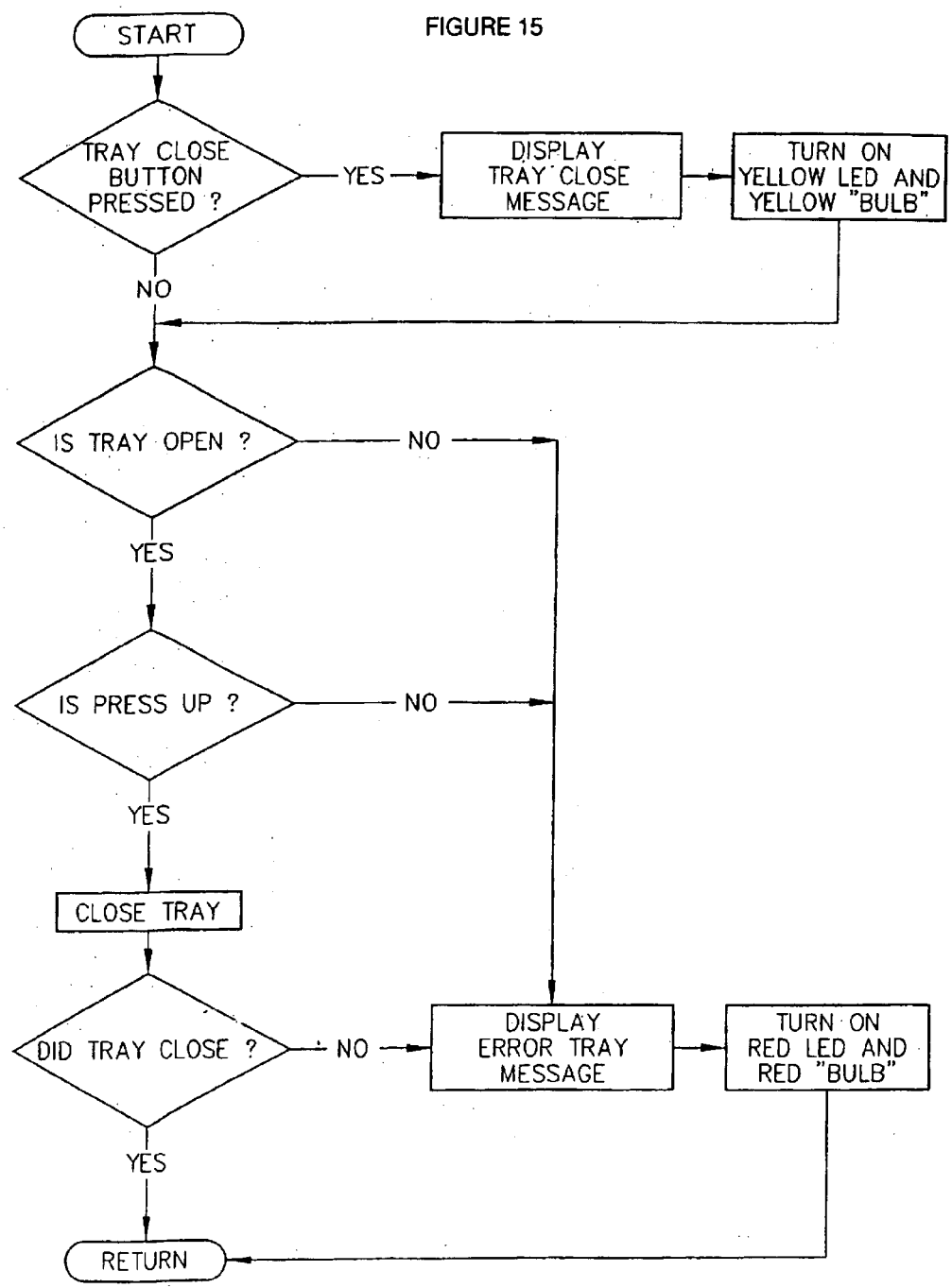
Figure 16:
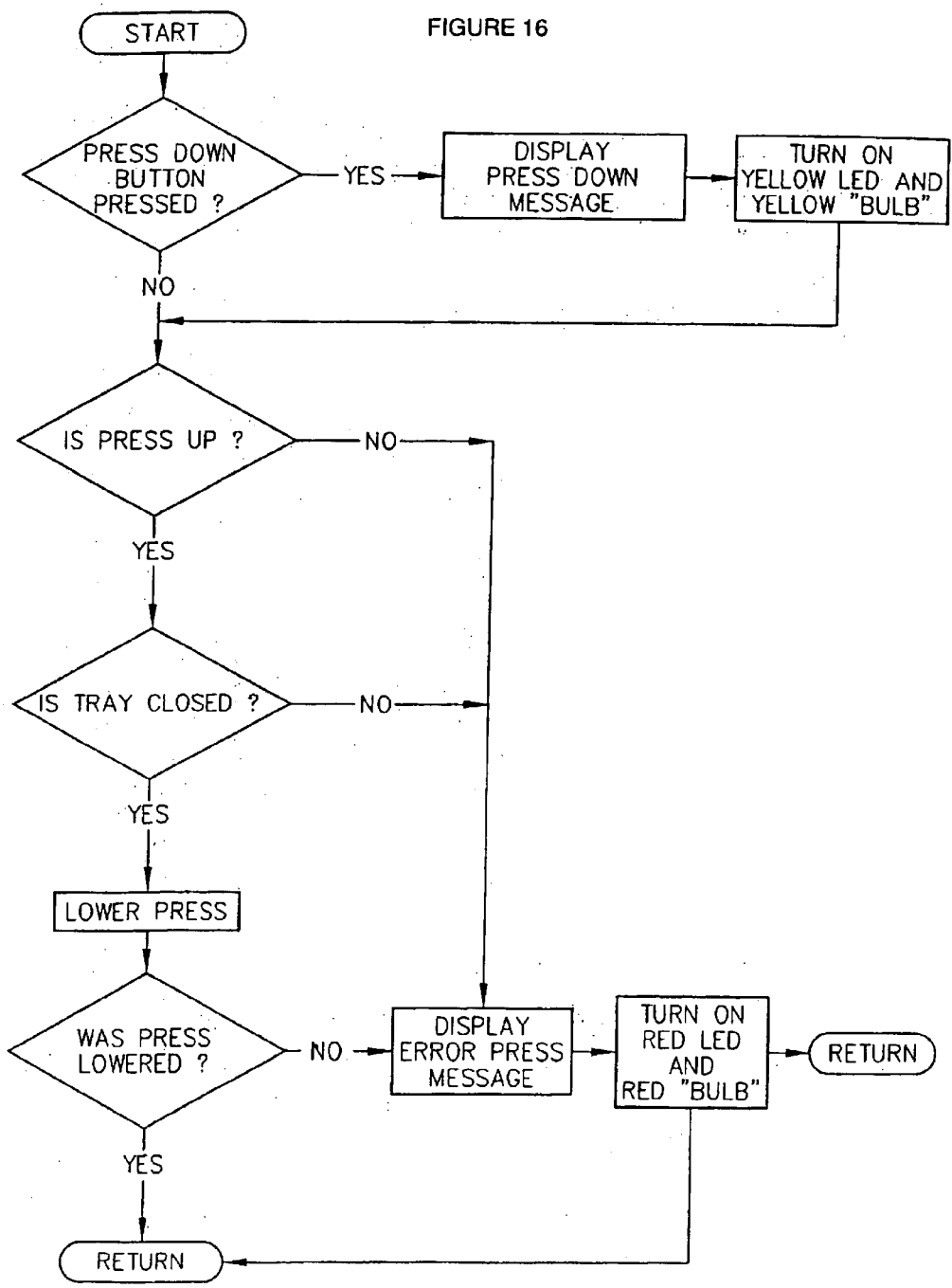
Figure 17:
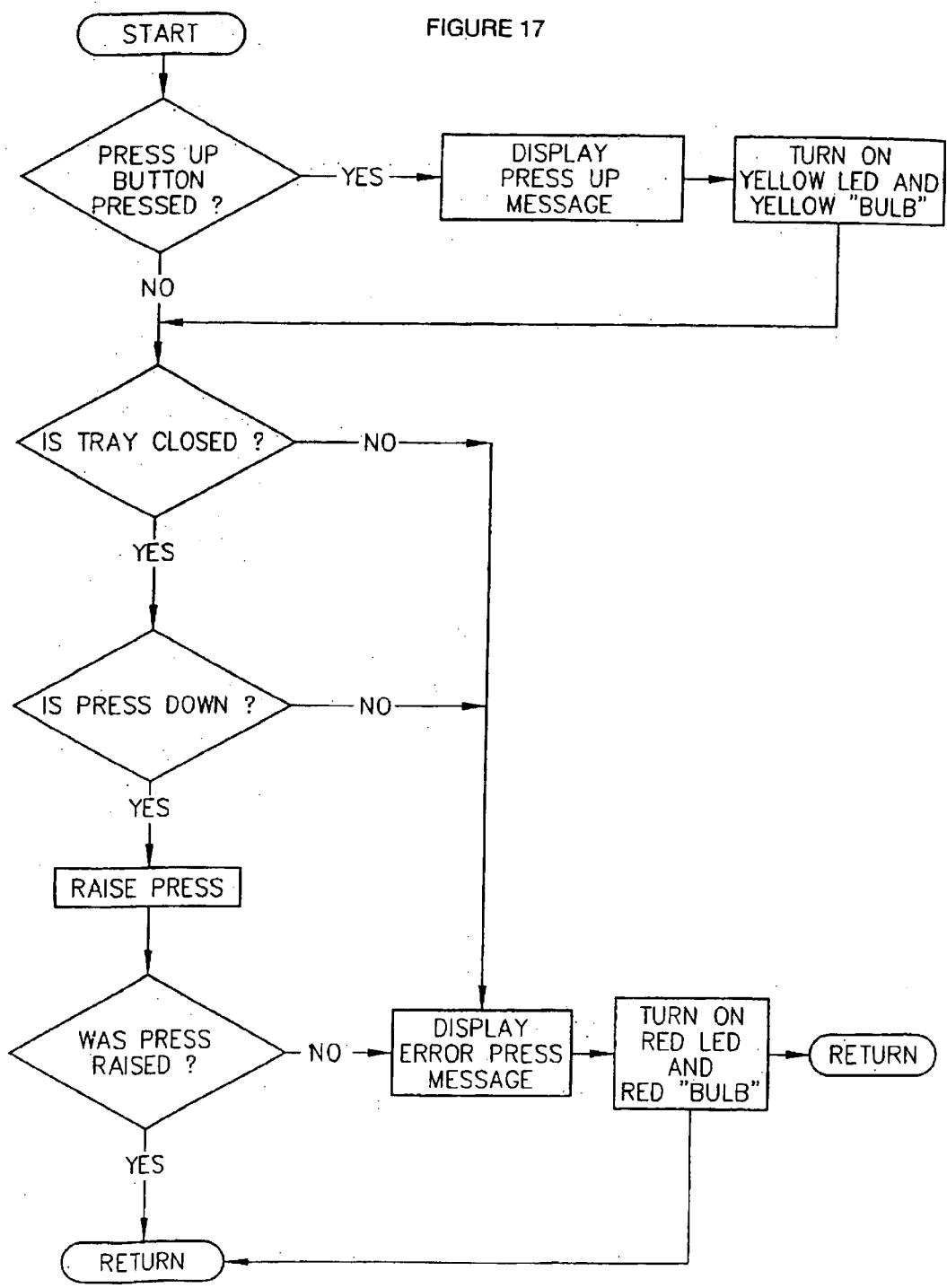
Figure 18:
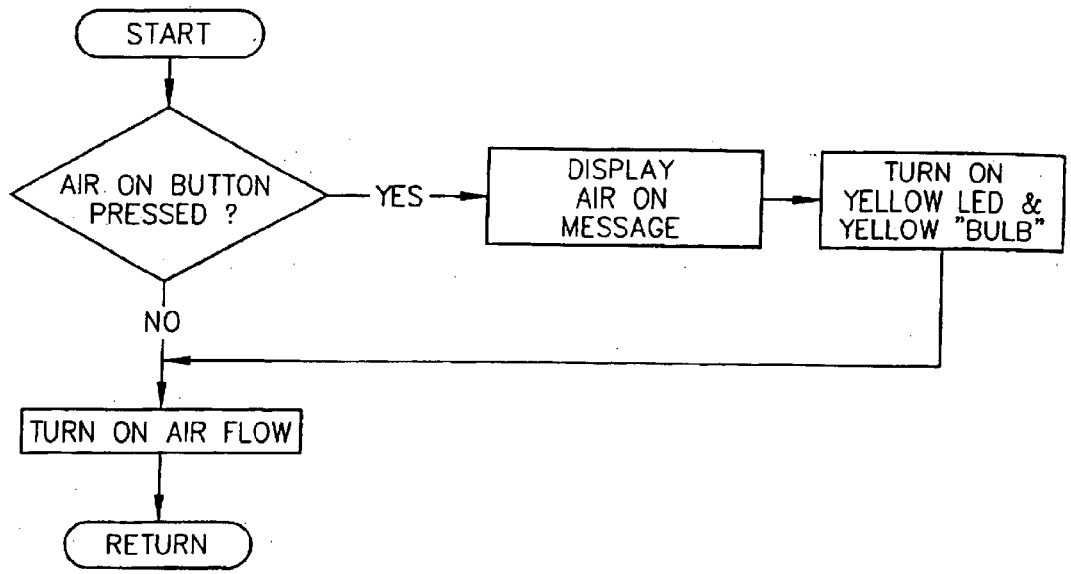
Figure 19:
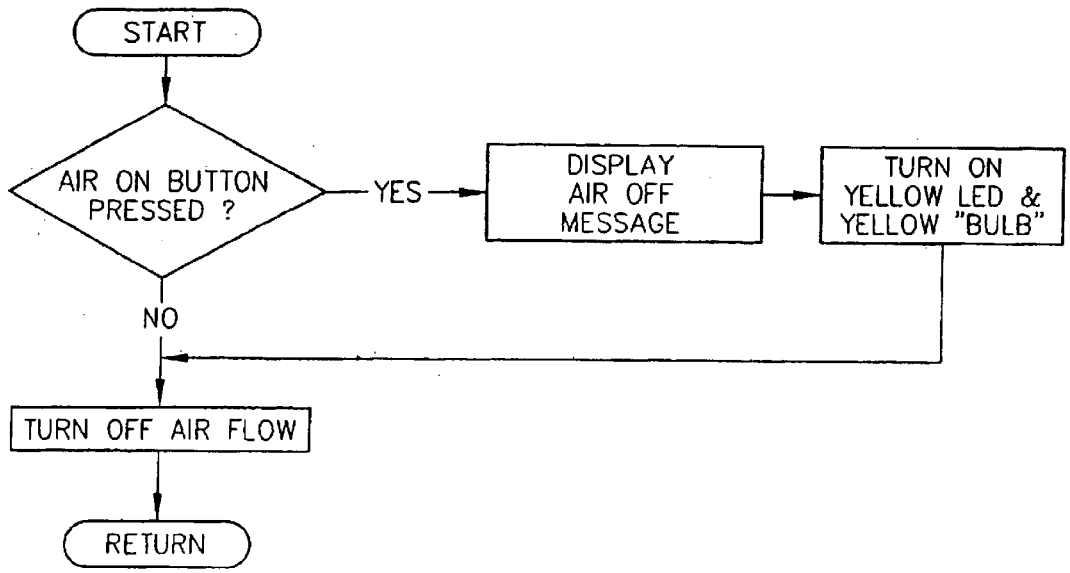
Figure 20:
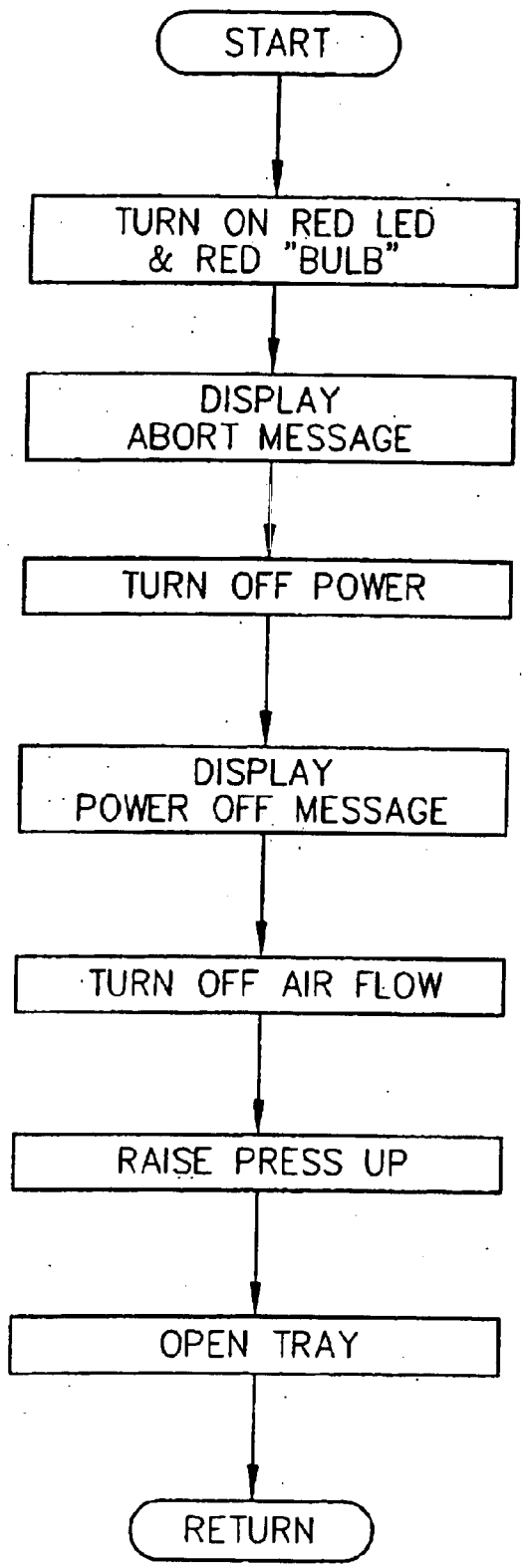
Figure 21:
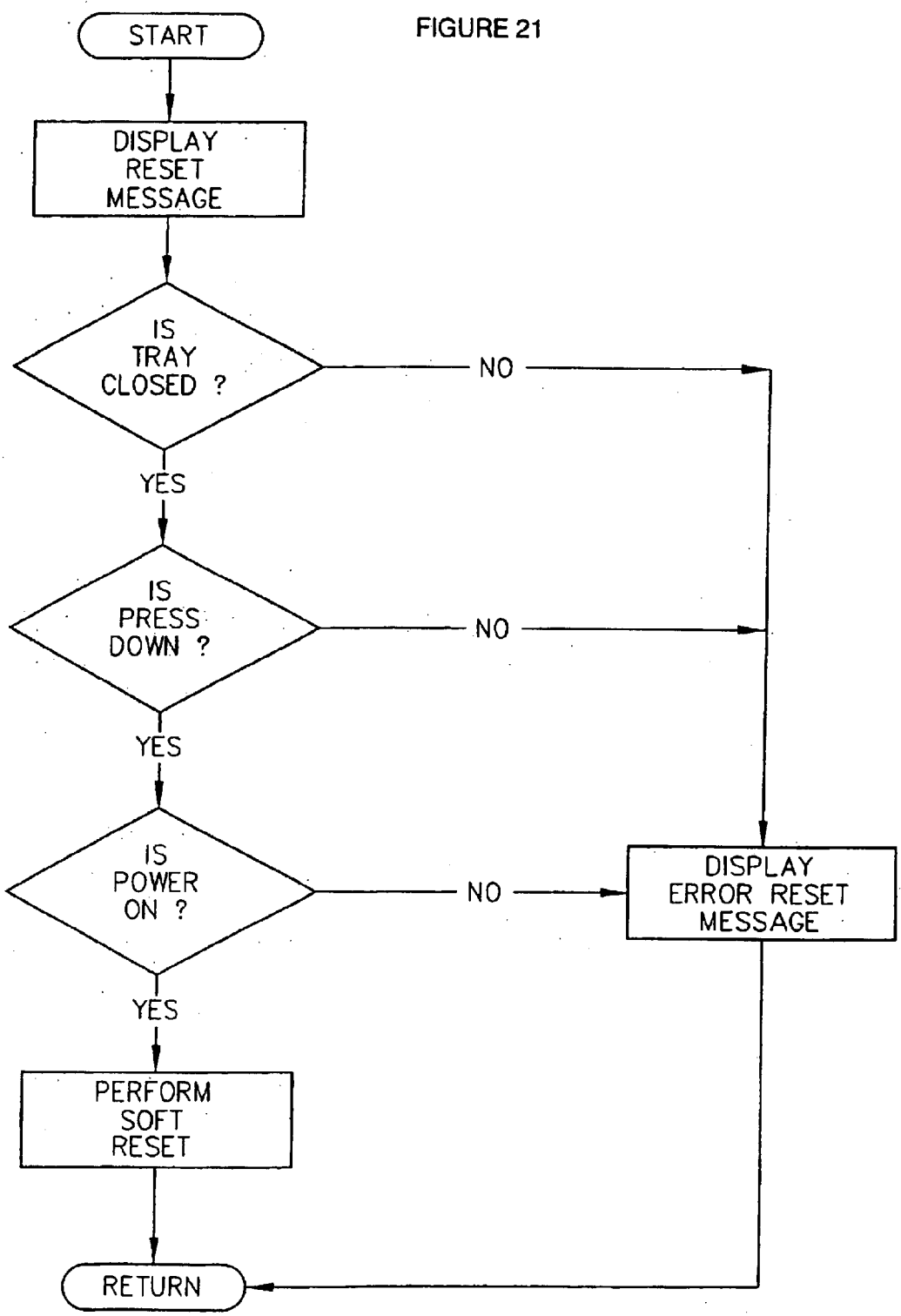
Figure 22:
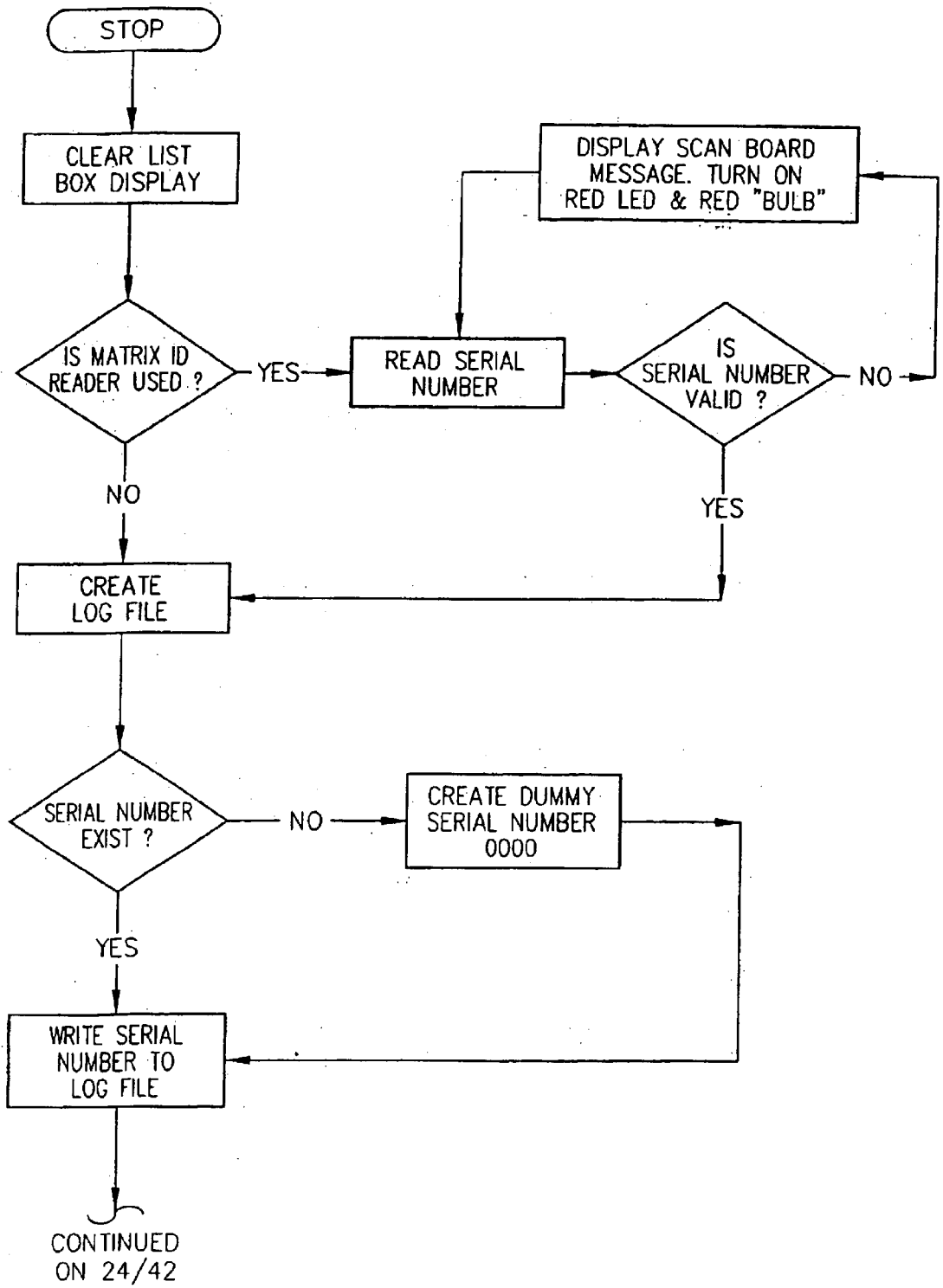
Figure 22:
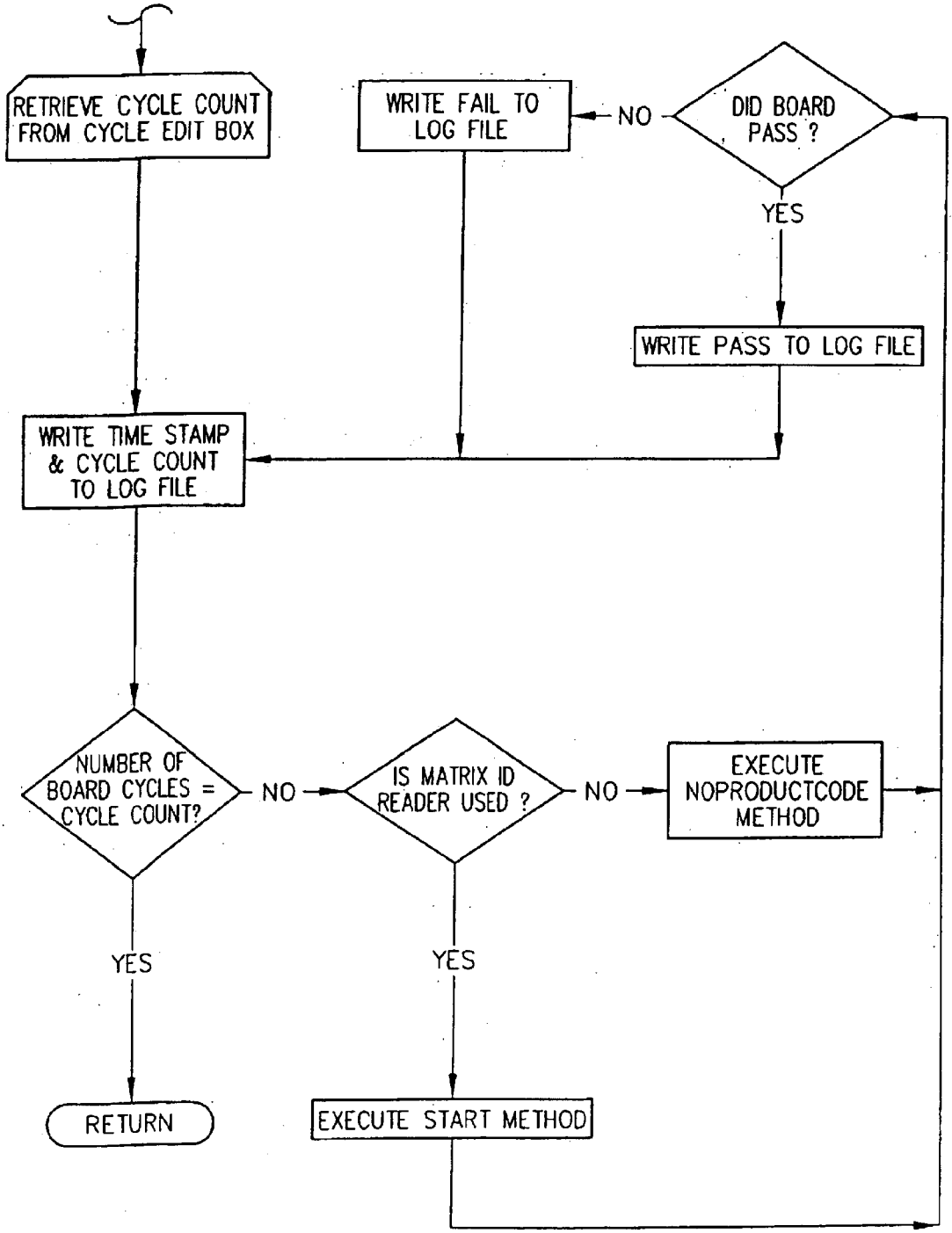
Figure 23:
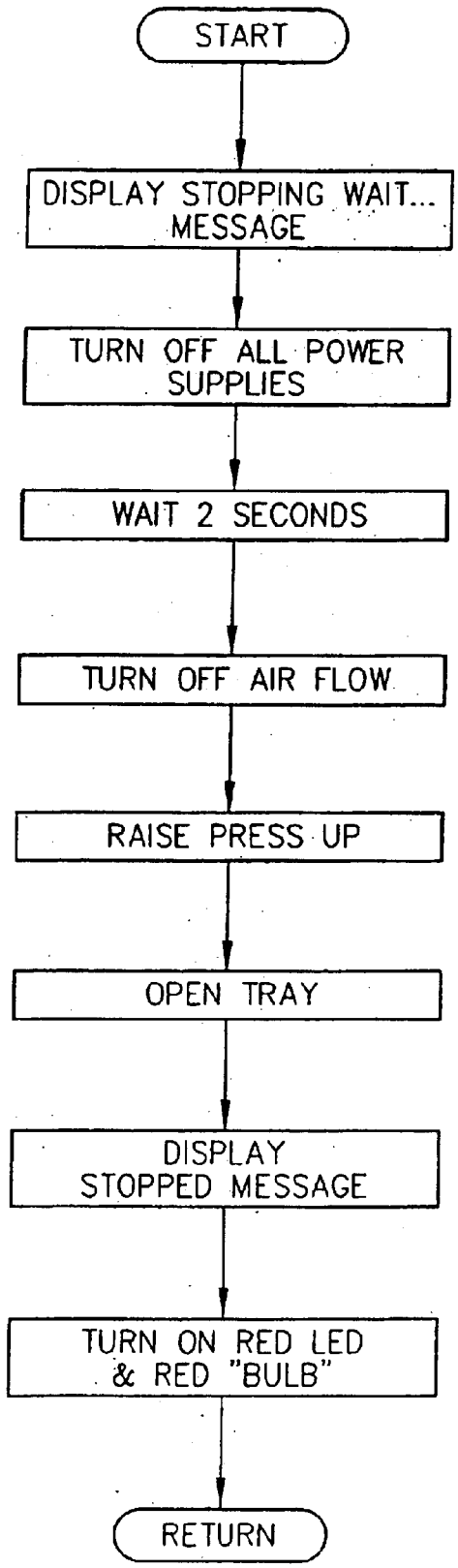
Figure 24:
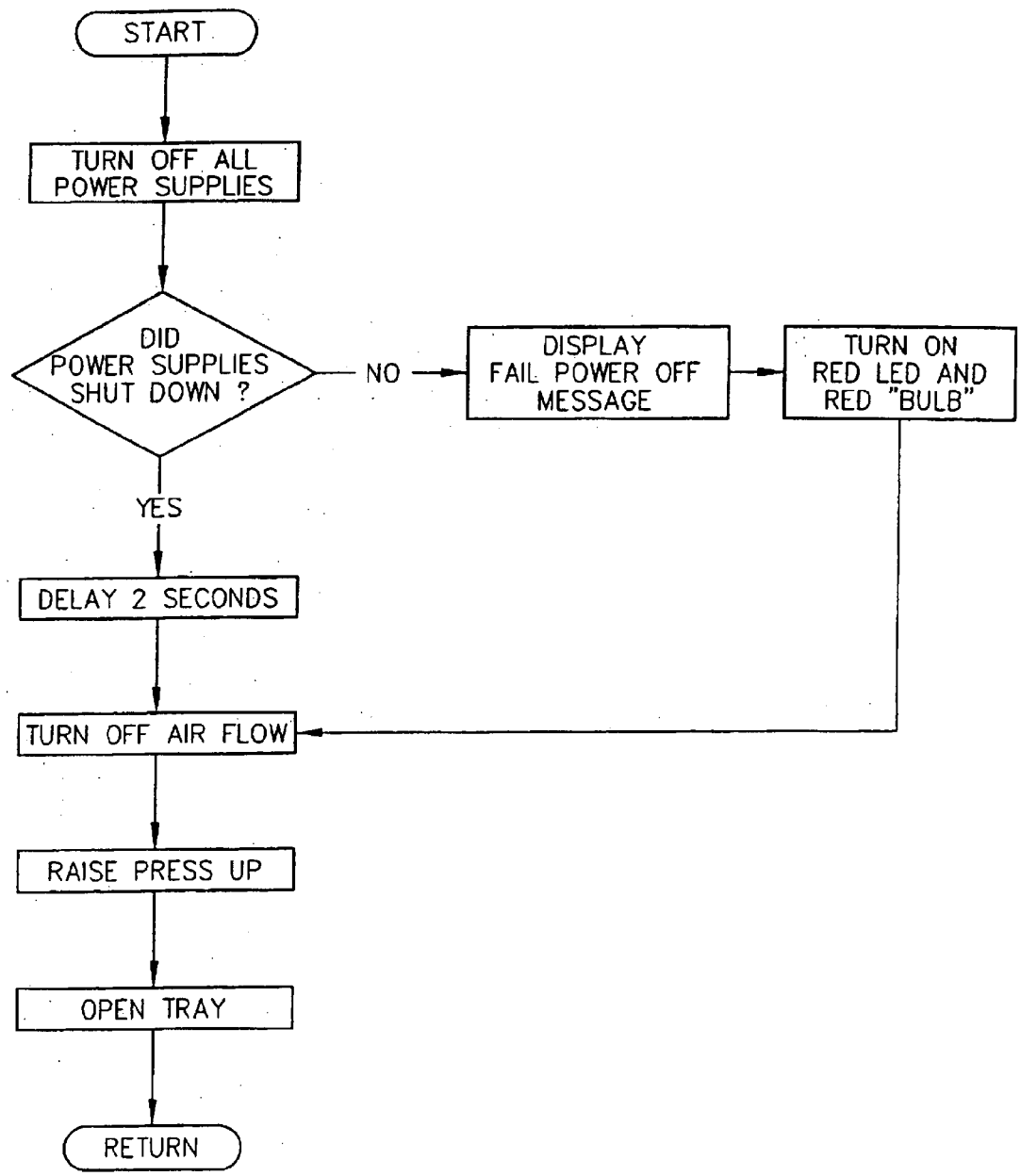
Figure 25:
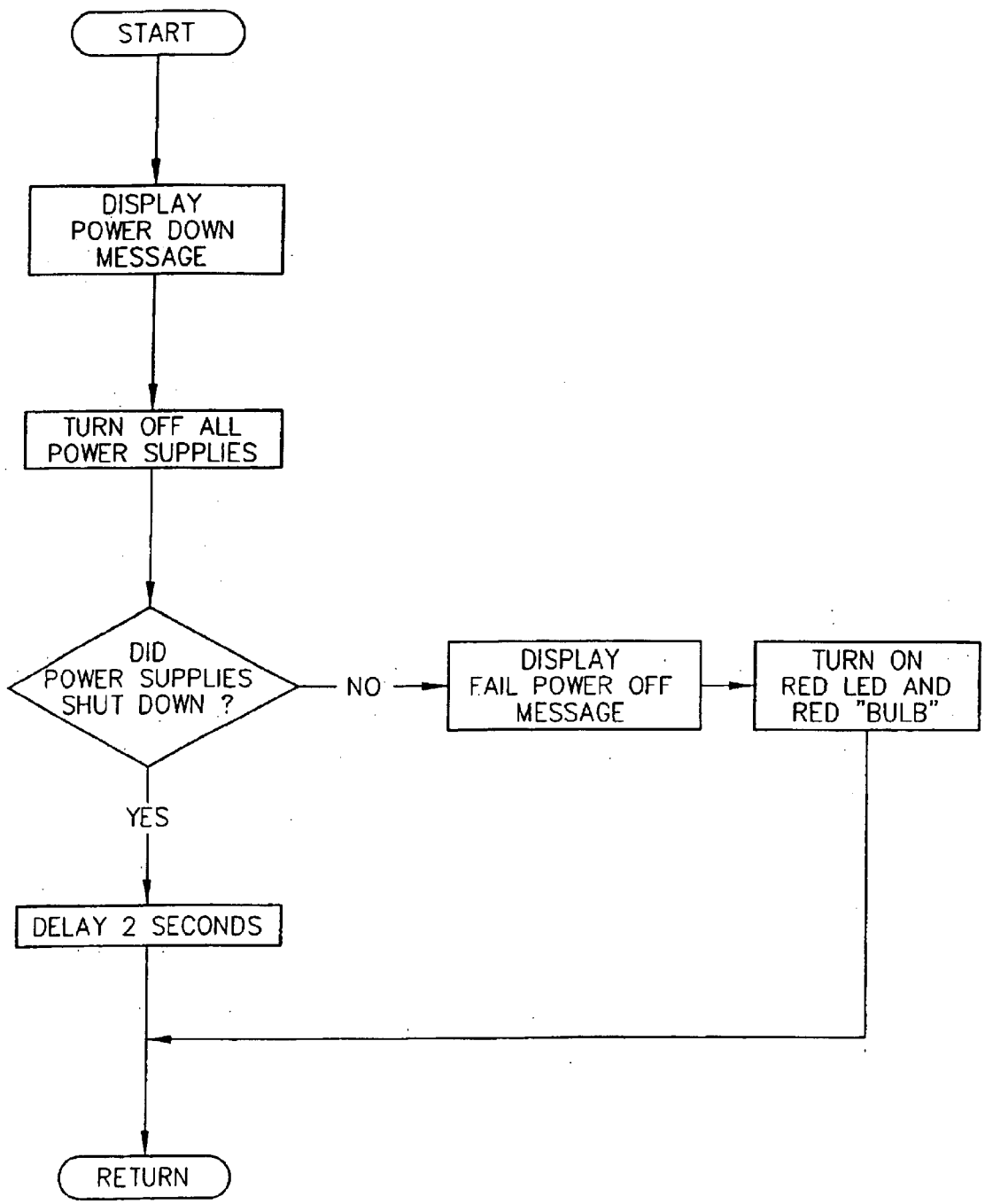
Figure 26:
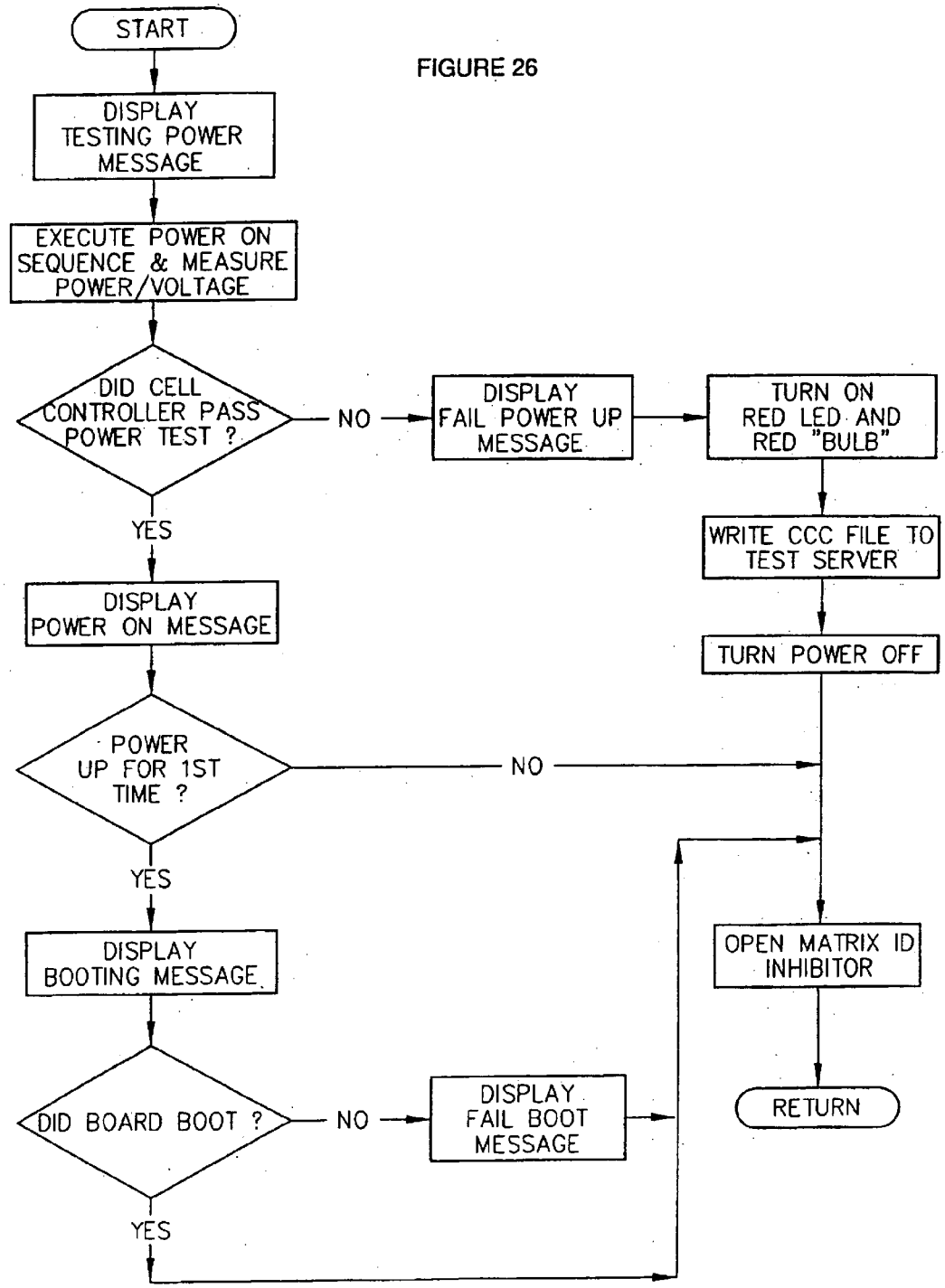
Figure 27:
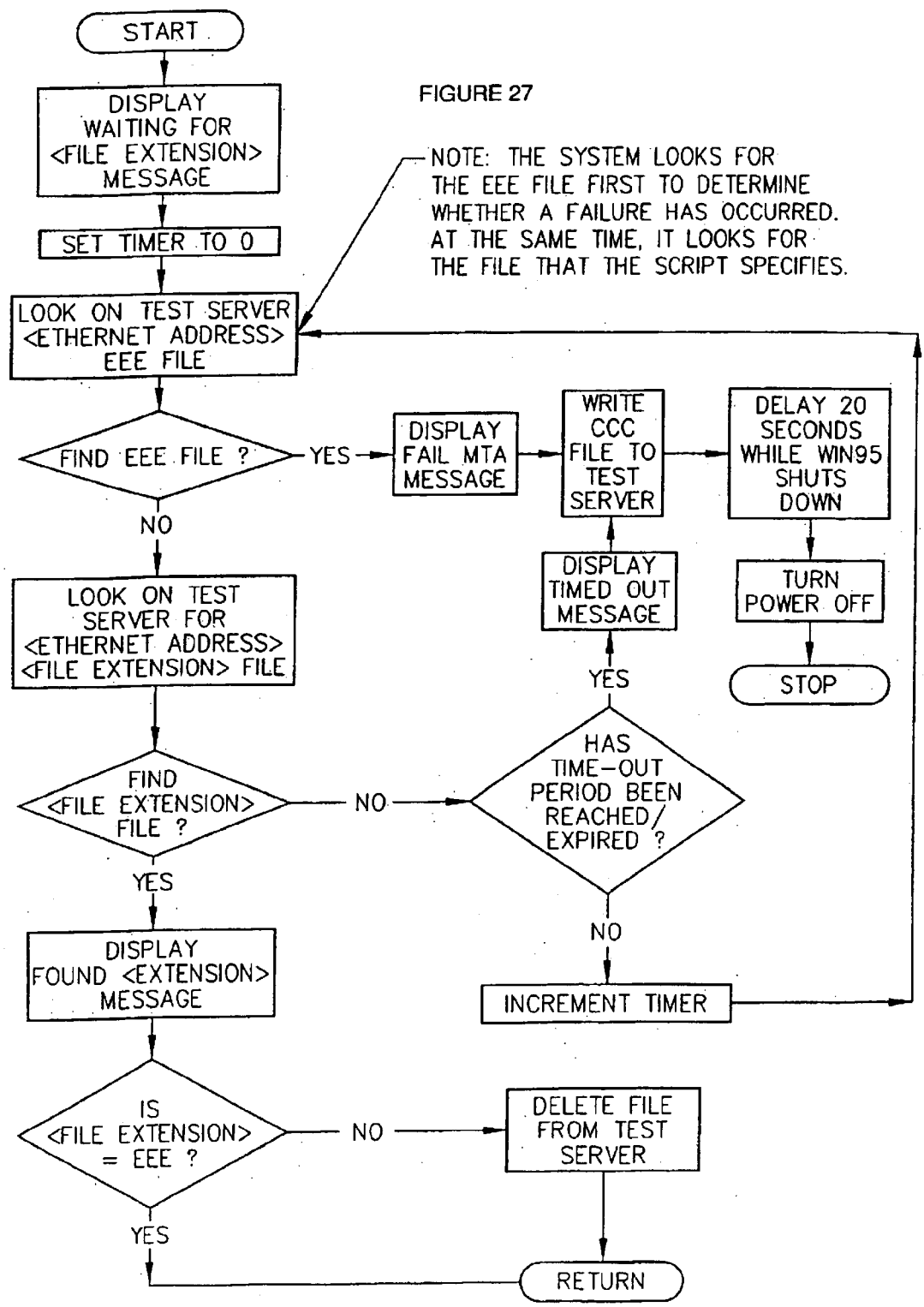
Figure 28:
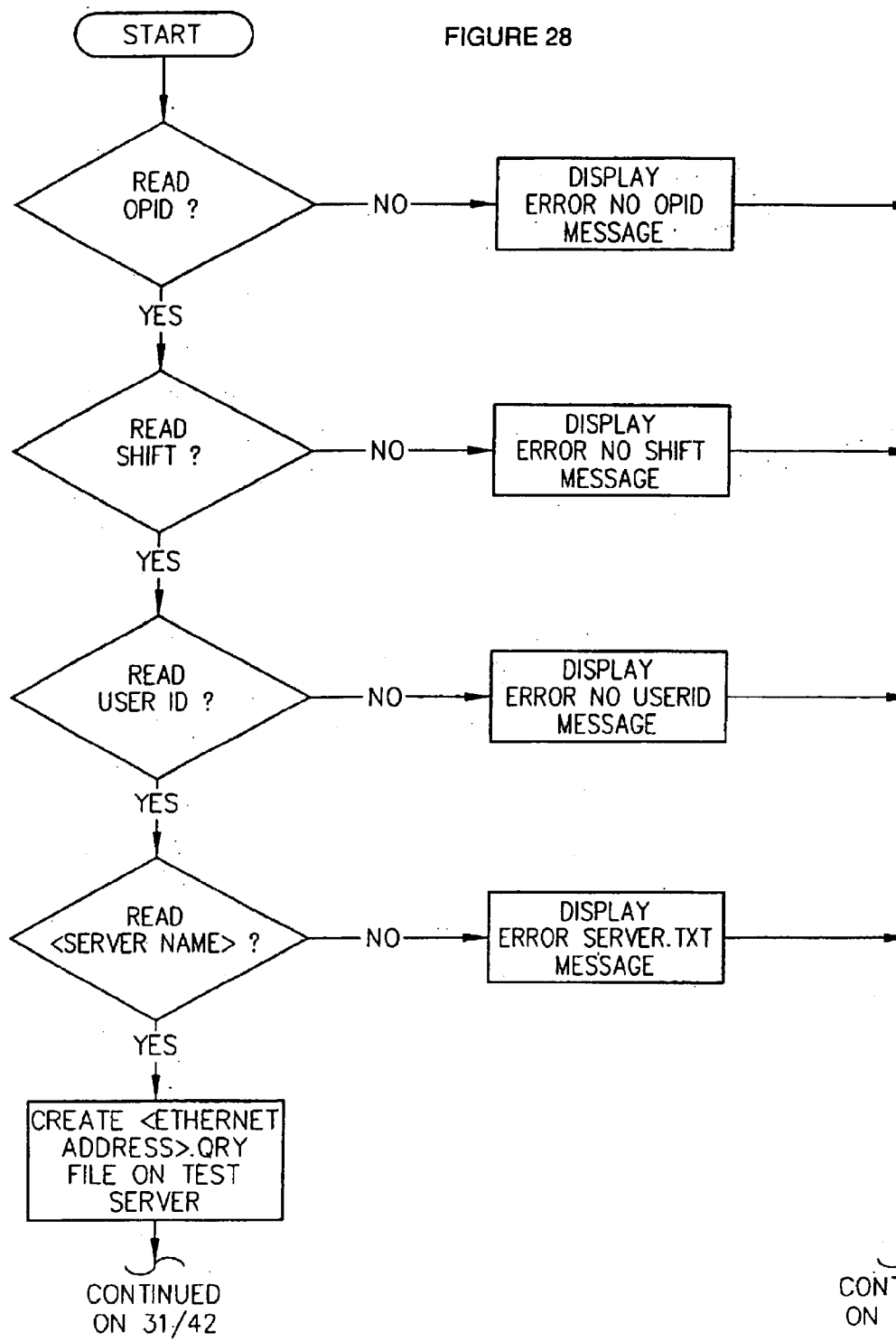
Figure 28:
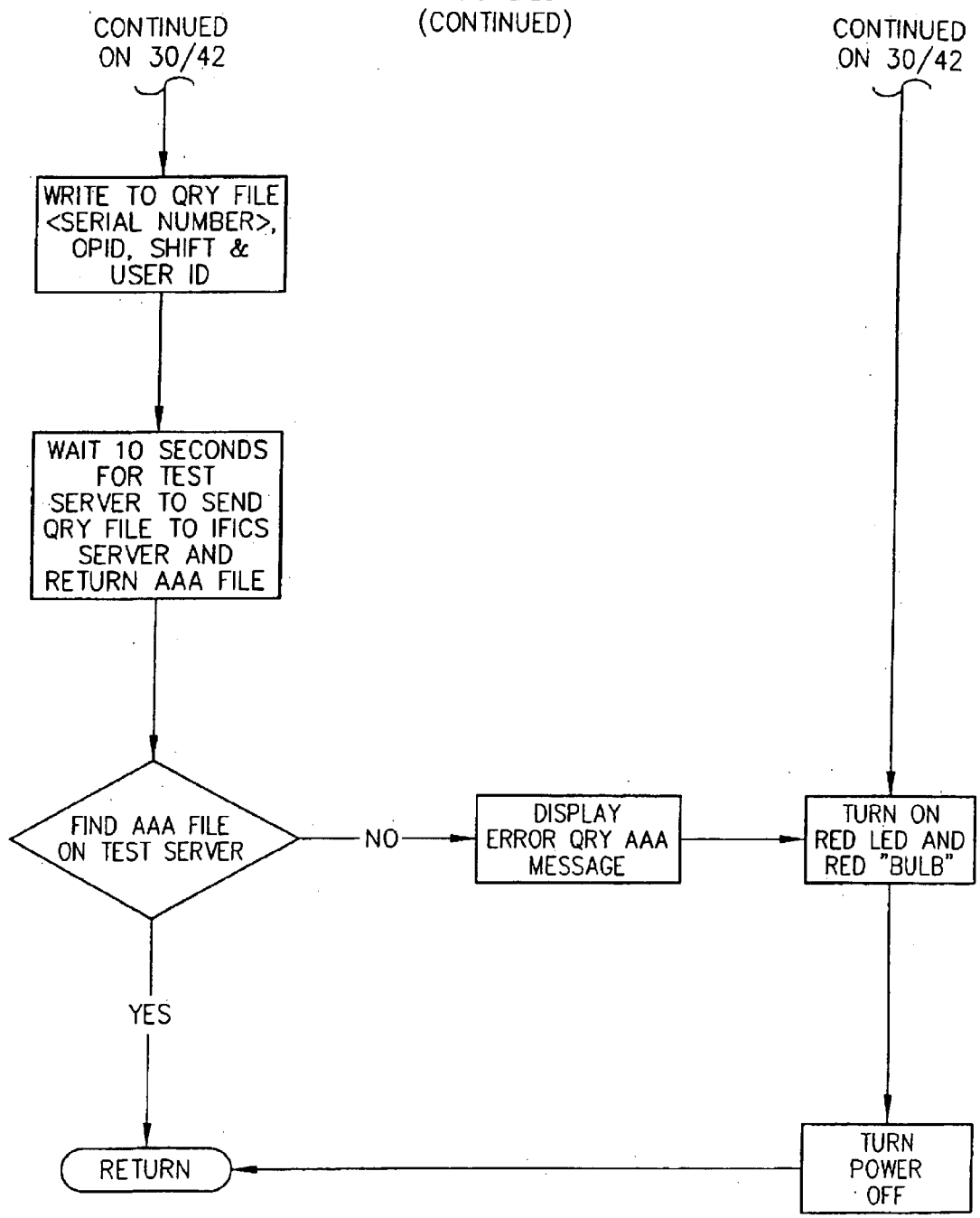
Figure 29:
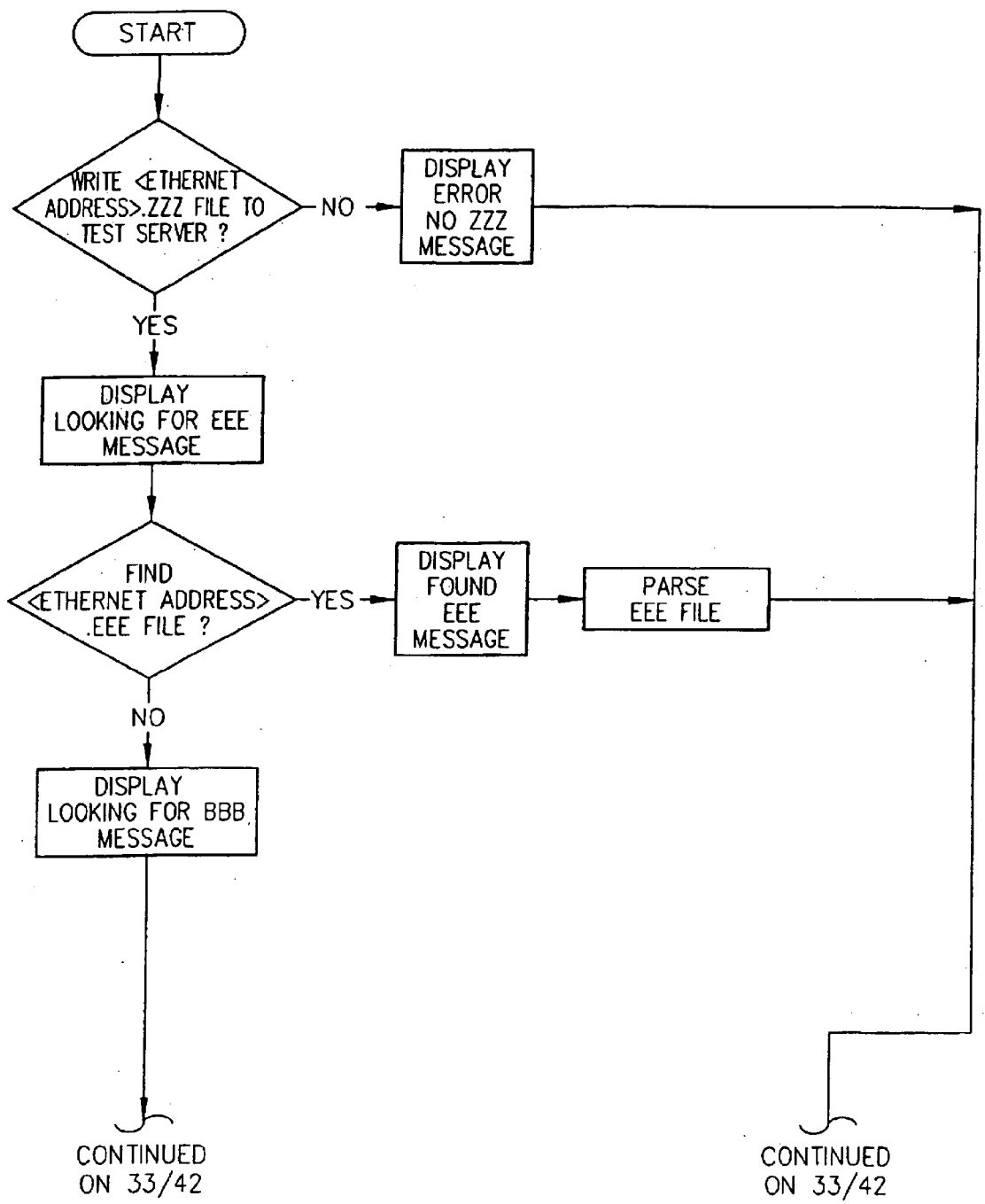
Figure 29:
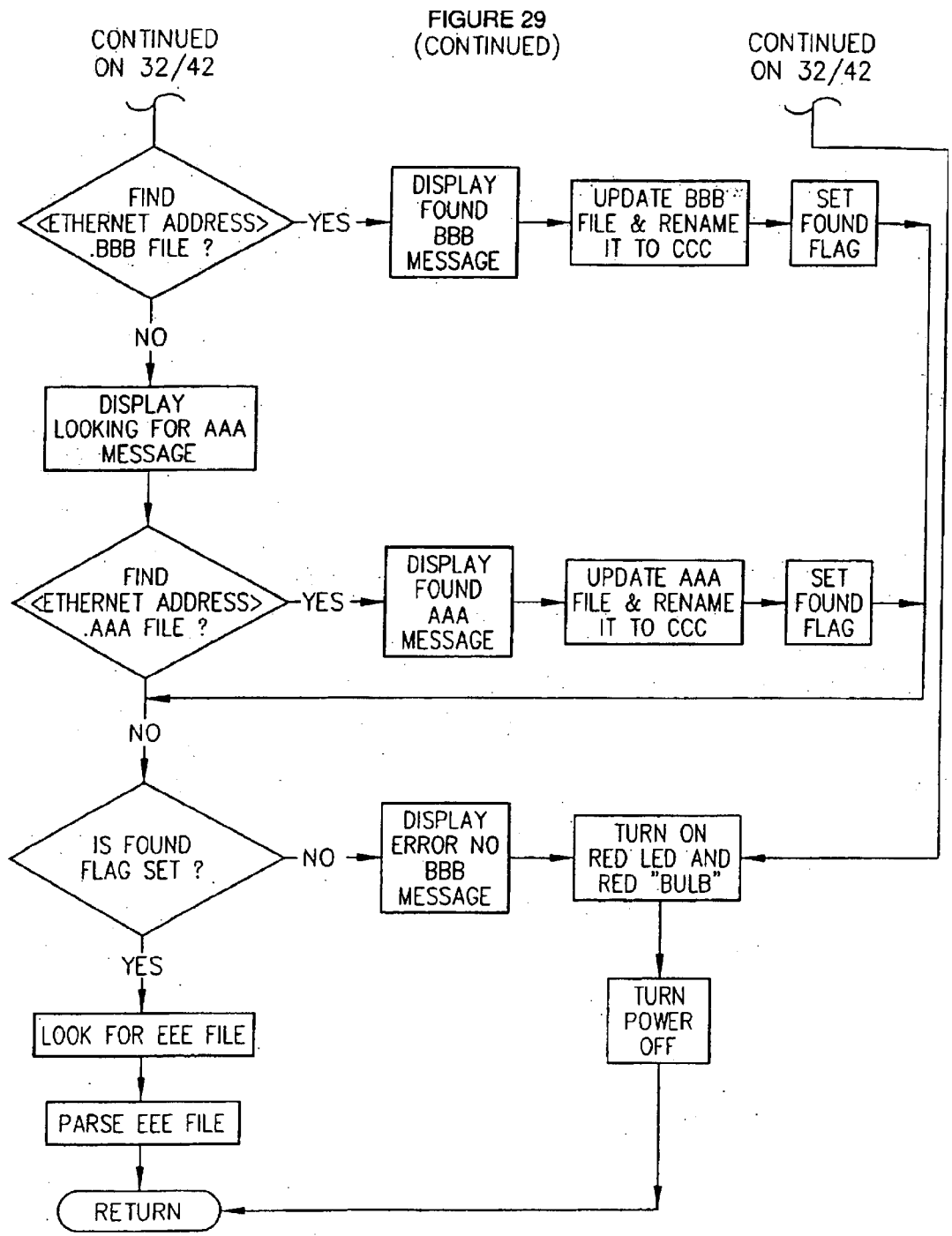
Figure 30:
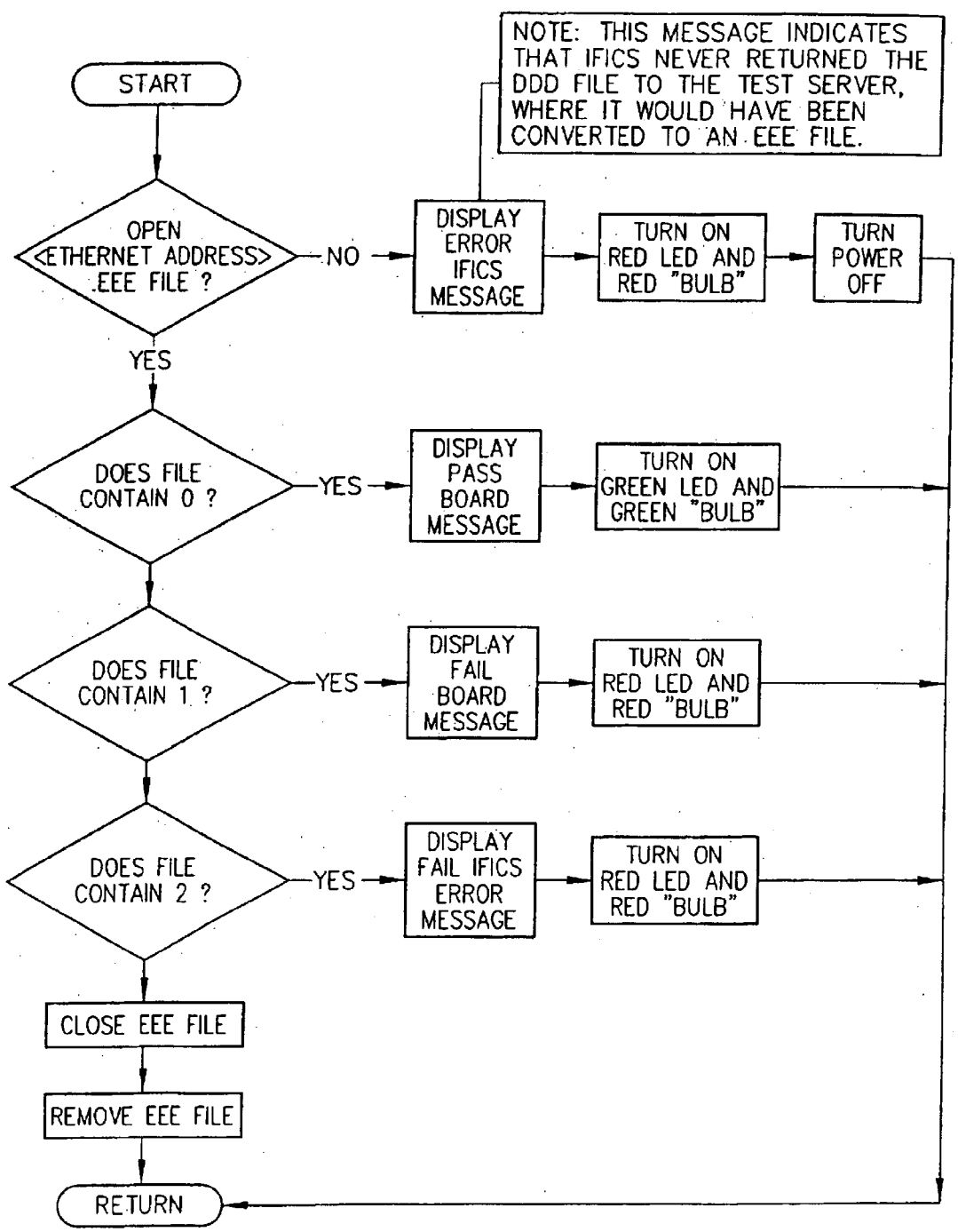
Figure 31:
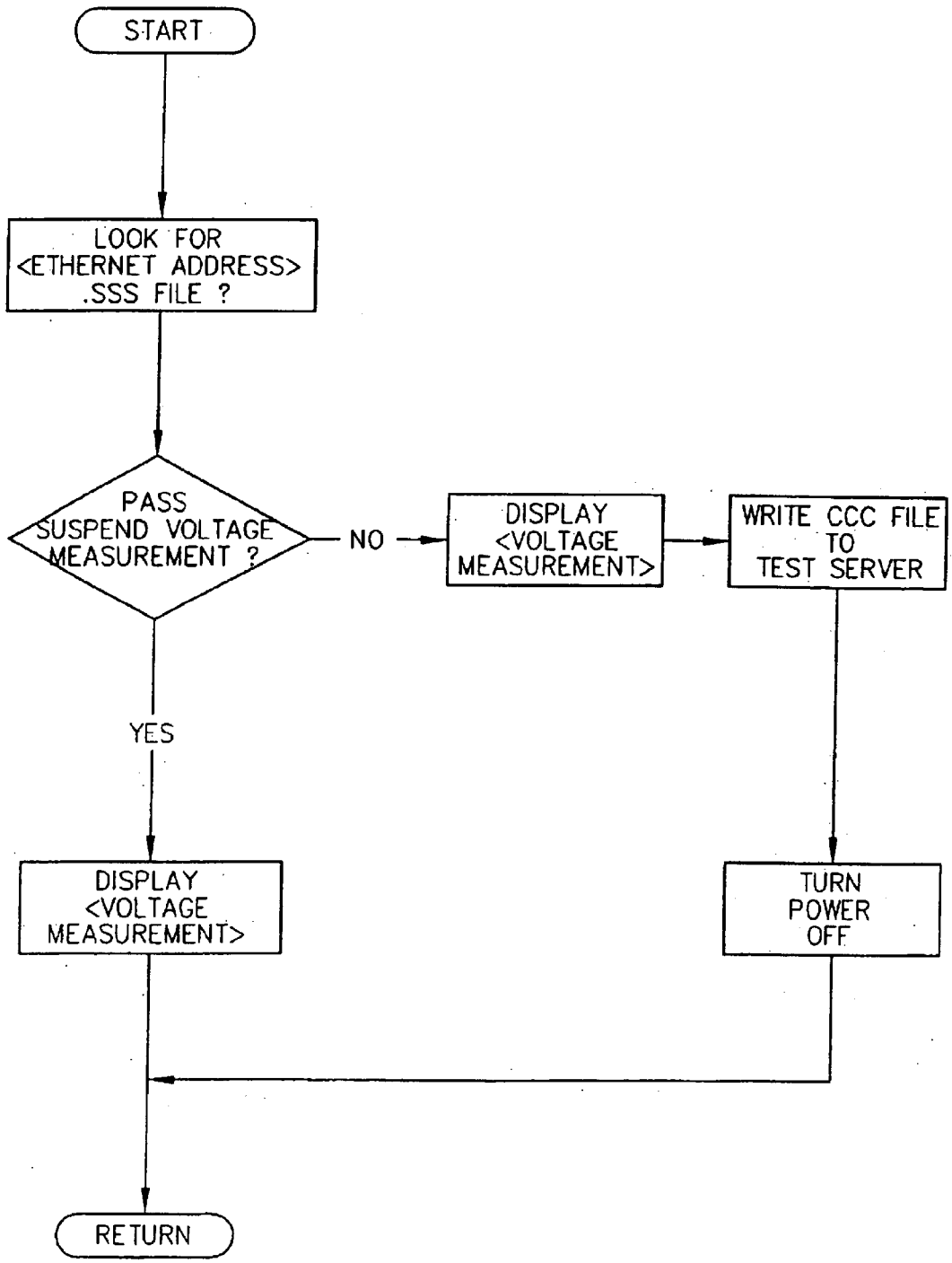
Figure 32:
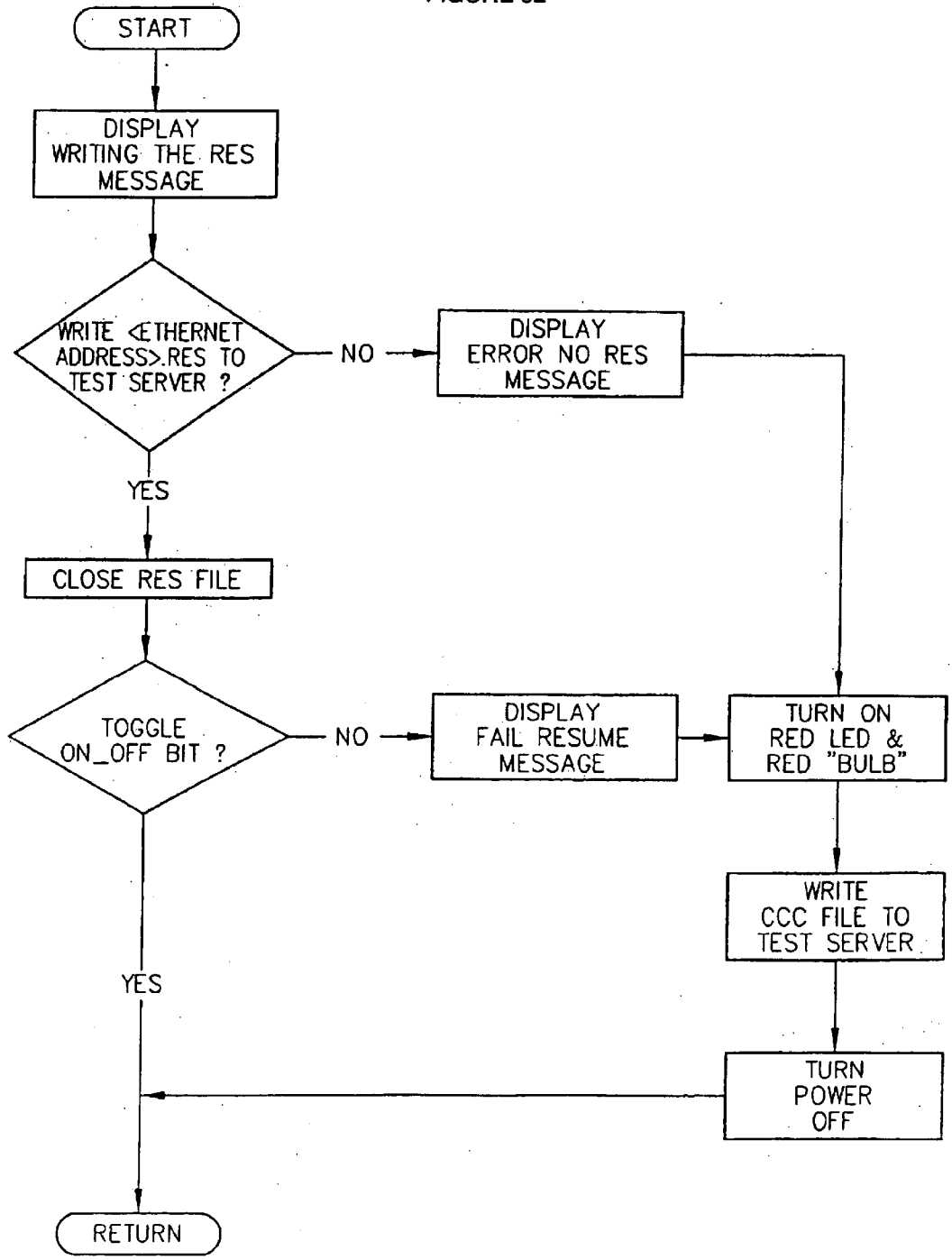
Figure 33:
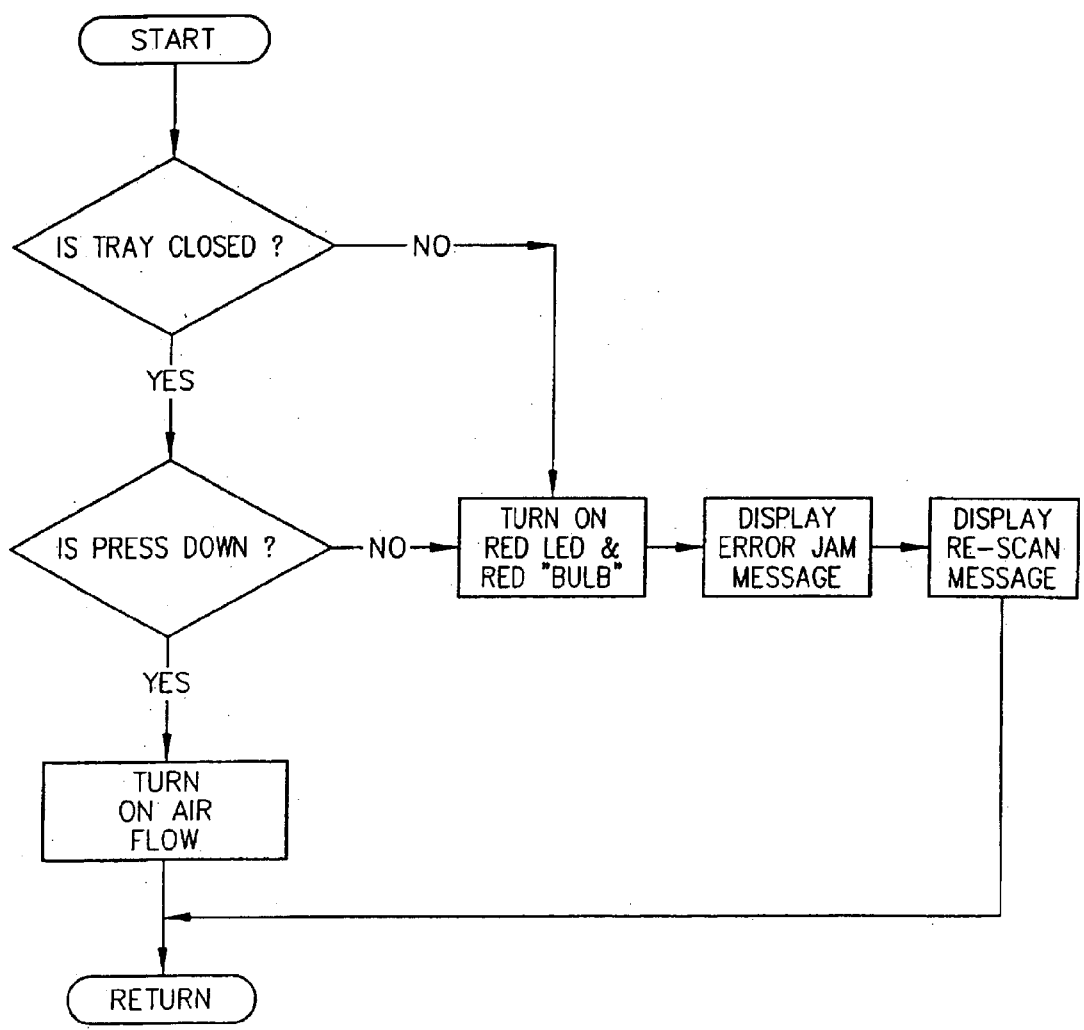
Figure 34:
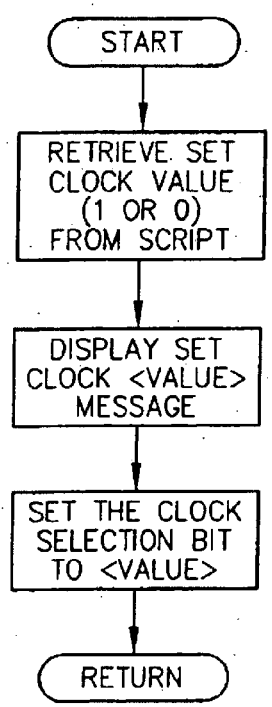
Figure 35:
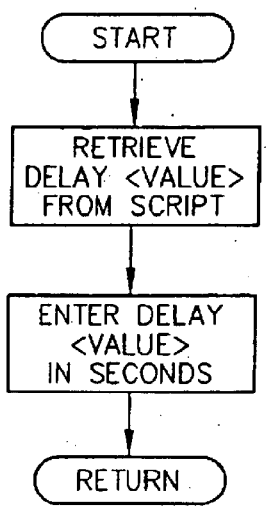
Figure 36:
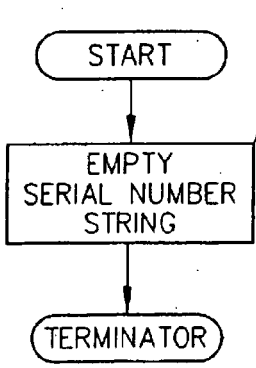
Figure 37:
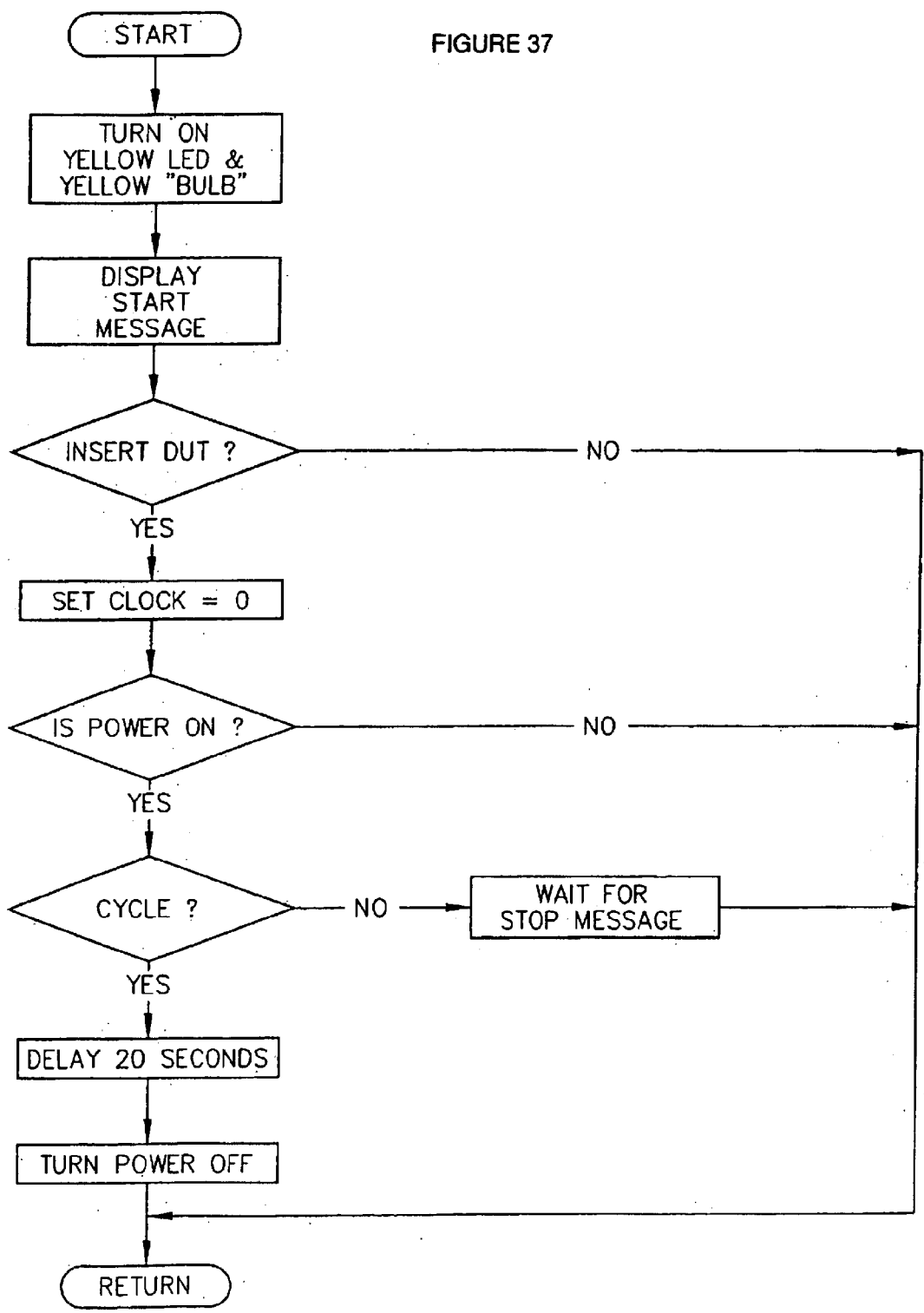
Figure 38:
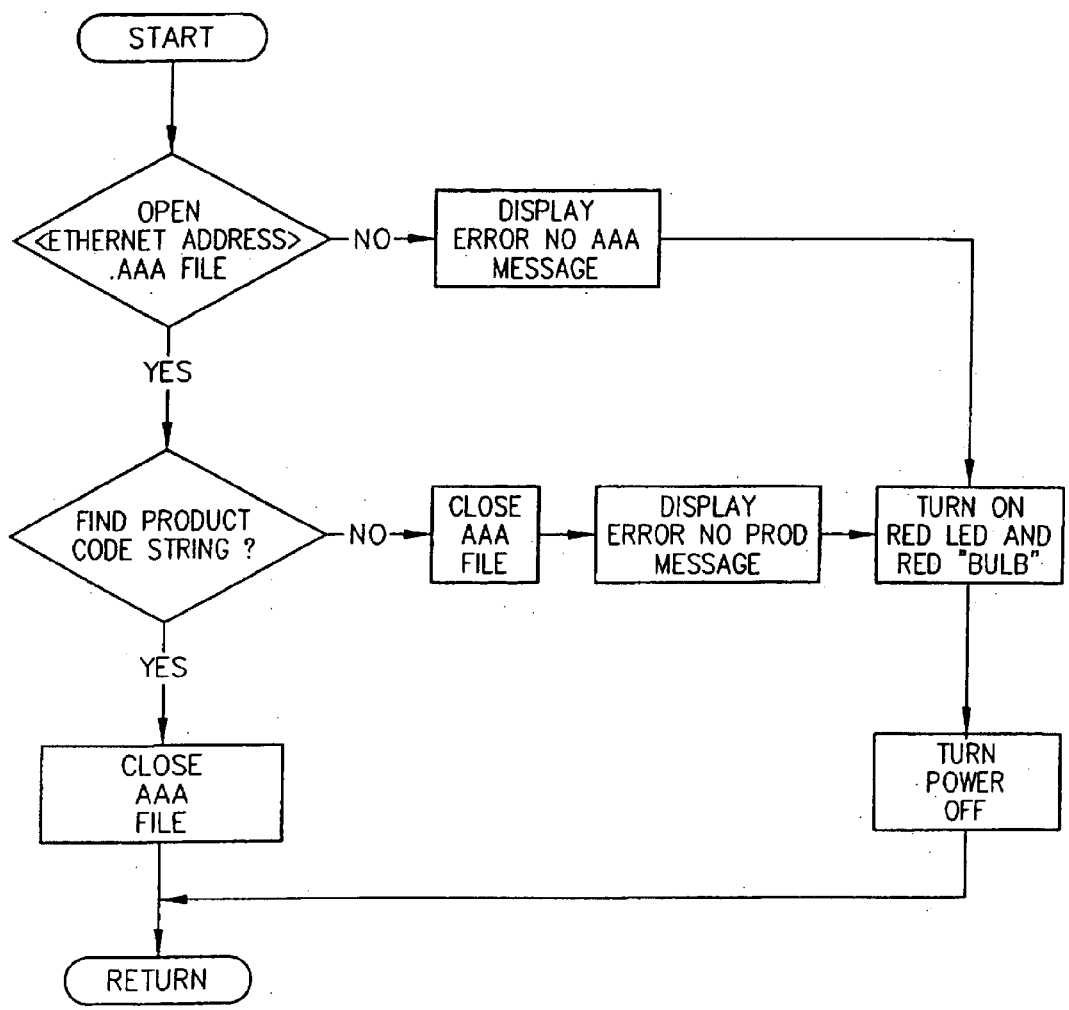
Figure 39:
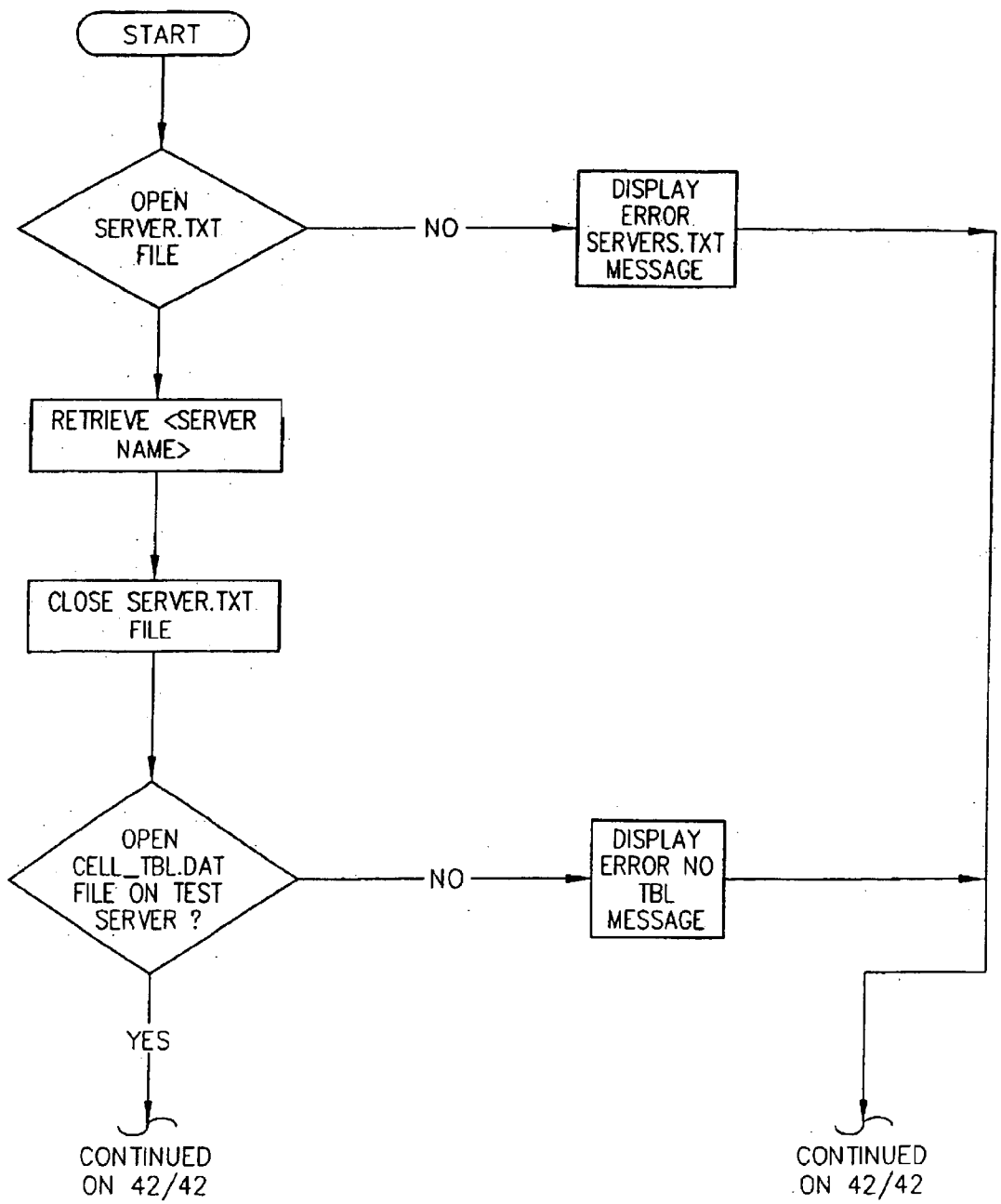

Methods Associated With ZManVw.cpp (Flowchart in FIGS. 9A–9B)

ZManVw( );:: Constructs the ZManVw object.
~ZManVw( );: Destructs/Destroys the ZManVw object.
OnInit( );: Maps to the INITIALIZE button in the view. Press the INITIALIZE button to run a self-test on the Test Rack, check communication with the test server, and create the communication link to the Matrix ID Reader and Matrix ID Reader Inhibitor. This method starts all test head threads, which poll the front panel of each test head ready ("waiting") for you to press a button on the testhead front panel.
OnShut( );: Maps to the SHUTDOWN button in the view. Press the SHUTDOWN button to shut down the threads in an orderly manner and break the communications link to the Matrix ID Reader, Matrix ID Reader Inhibitor, and test server.
OnButthx( );: Opens test head control panel for test head x, where x=[1,8].
OnAppExit( );: Prevents the user from exiting the application while the application has any threads running.
OnFileClose( );: Prevents the user from closing this view while the application has any threads running.
OnOpID( );: Maps to the OPID button on the view and enables the user to update the operator ID data.
OnShift( );: Maps to the SHIFT button on the view and enables the user to update the shift data.
OnUserID( );: Maps to the USERID button on the view and enables the user to update the user ID data.
InitMan view( );: Initializes the view, including the edit and list boxes.
ShutManView( );: Clears the view.
RackSelfTest( );: Executes the Test Rack self-test.
StartMatrixID( );: Sets up the RS232 port used for communicating with the Matrix ID Reader.
StopMatrixID( );: Closes communication with the Matrix ID Reader.
ServerUp( );: Tests the communication link with the test server.
StartInhibit( );: Sets up the RS232 port used for communicating with the Matrix ID Reader Inhibitor.
GetThisView( );: Accesses the appropriate view within the splitter window for updating data within that view. The views include XTHView, XCellVw, ZManVw.

TABLE 8

Methods Associated With ZBugVw.cpp

ZBugVw( );: Constructs the ZBugVw object.
~ZBugVw( );: Destructs/Destroys the ZBugVw object.
OnRack( );: Maps to the Rack Self Test button and is used to execute the Test Rack self-test.
OnOpID( );: Maps to the OPID button and is used to update the operator ID data.
OnShift( );: Maps to the SHIFT button and is used to update the shift data.
OnUserID( );: Maps to the USERID button and is used to update the user ID data.
OnServer( );: Maps to the Enter Server button and is used to update the test server name.
OnTstsrvr( );: Maps to the X button and is used to check the connection between the Test Rack and the test server.
OnClinhib( );: Maps to the Close button and is used to close the Matrix ID Reader Inhibitor.
OnOpinhib( );: Maps to the Open button and is used to open the Matrix ID Reader Inhibitor.
OnStopMat( );: Maps to the Stop MatrixID button and is used to disconnect the Test Rack from the Matrix ID Reader.
OnStartMat( );: Maps to the Start MatrixID button and is used to connect the RS232 communication link between the Test Rack and the Matrix ID Reader.
OnRdsn( );: Maps to the Read S/N button and is used to read the serial number of a DEVICE UNDER TEST placed in the Matrix ID Reader fixture.
OnLoadth( );: Maps to the Load Board button and is used to load a board onto a test head by the board handler.
OnUnloadth( );: Maps to the UnLoad Board button and is used to unload a board from a test head by the board handler.
OnRadfail( );: Maps to the Pass Bin radio button and is used to indicate to unload a board to the pass bin from a test head by the board handler.
OnRadpass( );: Maps to the Fail Bin radio button and is used to indicate to unload a board to the fail bin from a test head by the board handler.
OnRadthx( );: Maps to the THx radio button, where x=[1,8], and is used to indicate to load/unload a board from the indicated test head by the board handler.
OnButthx( );: Opens test head control panel for test head x, where x=[1,8].
OnAppExit( );: Prevents the user from exiting the application while the application has any threads running.
OnFileClose( );: Prevents the user from closing this view while the application has any threads running.

TABLE 9

Methods Associated With DUTThread.cpp

DUTThread(XTHVw* pTH=NULL, XCellVw* pCVw=NULL, int nTHID=NULL, BOOL bReader=FALSE);: Creates a DUTThread object and calls to create a new test head object, rack object, and DMM object.
~DUTThread( );: Destroys/Destructs a DUTThread object.
RunDut( );: Repeatedly calls CheckfrontPanel( ).
ExitDutThread(DUTThread* pThread);: Exits a thread.
SetOwner(XTHVw*pTHOwner,XCellVw*pXCOwner): Sets the owner of the GUI to the present thread.
EmulateFrontPanel(int nEvent);: Causes the GUI front panel buttons to emulate the keypad buttons on the test head.
DoStop( );: Interfaces the method from the ZBugVw object with the Stop( ) method in the test head object.
DoClock(int nClkSet);: Interfaces the clock selection (CLK_SELECT) method from the ZBugVw object with the clock selection method in the test head object.
CheckFrontPanel( );: Singularly polls the keypad buttons on the test head.

TABLE 10

Methods Associated With TheadCtrlDlg.cpp

CTheadCtrlDlg(BOOL bStartThread, int nTHID=0, IDReader* pIDReader=NULL, CHandler* pHandler=NULL, XTHVw* pTH=NULL, XCellVw* pCVw NULL,CWnd* pParent=NULL);: Constructs a TheadCtrlDlg object.
OnAiroff( );: Maps to the Air Off button and will turn the air off to the test head.
OnAiron( );: Maps to the Air On button and will turn the air on to the test head.
OnCounter( );: Maps to the Reset Counter button and will reset the lockout counter.

OnCycle( );: Maps to the Cycle button and will repeatedly test a device under test up to the number of times entered into the edit box.

OnLoadboard( );: Maps to the Load Board button and will instruct the board handler to load a DUT onto this test head.

OnLock( );: Maps to the Reset Lockout button and will reset the lockout on this test head.

OnPressdown( );: Maps to the Press Down button and will cause the tray to lower.

OnPressup( );: Maps to the Press Up button and will cause the tray to raise.

OnRadiofail( );: Maps to the Fail radio button and will cause the board handler to place a DUT onto the fail bin.

OnRadiopass( );: Maps to the Pass radio button and will cause the board handler to place a DUT onto the pass bin.

OnReadthid( );: Maps to the Read THID button and will cause the test head to read the test head ID from the front panel NVRAM.

OnReset( );: Maps to the Reset button and will cause the DUT to re-boot.

OnRobotstart( );: Maps to the Start button in the board handler group and will open the communication path to the board handler.

OnRobotstop( );: Maps to the Stop button in the board handler group and will close the communication path to the board handler.

OnStart( );: Maps to the Start button in the front panel group and will cause test execution to start.

OnStop( );: Maps to the Stop button in the front panel group and will cause the test execution to halt.

OnThreadstart( );: Maps to the Start button in the thread control group and will cause this 'program thread' to start.

OnThreadstop( );: Maps to the Stop button in the thread control group and will cause this 'program thread' to stop.

OnTrayin( );: Maps to the Tray In button and will cause the tray to close.

OnTrayout( );: Maps to the Tray Out button and will cause the tray to Open.

OnUnload( );: Maps to the UnLoad button and will cause the board handler to remove the DUT from the test head.

OnWritethid( );: Maps to the WriteTHID button and will write the test head ID to the NVRAM in the front panel.

OnInitDialog( );: Initializes this dialog box by recalling all states of all buttons.

OnOK( );: Maps to the OK button and will cause this dialog box to close and save present settings.

TABLE 11

Methods Associated With Testhead.cpp

Test head(XTHVw* pTH=NULL, XCellVw* pCVw=NULL, int nTHID=NULL, Rack* pRack=NULL, BOOL bMatrixID=FALSE);: Creates a new test head object.

~Test head( );: Destroys/Destructs a test head object.

InitTest head( );: (See FIG. 11) Initializes the test head object by doing the following: Clearing the variables that the power supplies and DIG-IO use in the Test Rack;: Flushing the front panel display buffer;: Sending a Wait message to the front panel display;: Making sure the power flow is off to the test head;: Bringing the tray to its Open position;: Sending a Test Head Ready message to the front panel display;: Illuminating the green LED on the test head;: and turning on the green "bulb" on the GUI associated with the test head.

RunTheTest head(int m__nFPBut);: (See FIG. 12) Starts execution of the function determined by the button you press, either the one on the test head's front panel or from the GUI in Debug mode. When you press the Start button, the RunTheTest head(int m__nFPBut) method determines whether the Matrix ID Reader has been started:;: If the Matrix ID Reader has not been started, the NoProductCode method is executed.;: If the Matrix ID Reader has been started, the RunTheTest head(int m__nFPBut) method checks for a serial number from the Matrix ID Reader and executes the Start method.

Start( );:(See FIG. 13) Executes the normal test flow for a DUT, defined as follows: Illuminating the LED on the test head and turning the GUI "bulb" yellow;: Inserting the tray into the test head;: Reading the test head ID;: Querying IFICS for the product code;: Parsing the 5A file for the appropriate product code;: Parsing the script file for the appropriate test flow; and executing the test flow.

NoProductCode( );: (See FIG. 37) Used to insert a DUT into a test head and apply power to boot the test head.

TrayClose(CString strTC);: (See FIG. 15) Closes the cassette tray.

TrayOpen(CString strTO);: (See FIG. 14) Opens the cassette tray.

PressDown(CString strPD);: (See FIG. 16) Presses the tray down, inserting the DUT into its connector on the Easter-T board.

PressUp(CString strPU);: (See FIG. 17) Raises the tray up, extracting the DUT from its connector on the Easter-T board.

AirOn(CString strAON);: (See FIG. 18) Turns on the air used for cooling the DUT.

AirOff(CString strAF);: (See FIG. 19) Turns off the air used for cooling the DUT.

Abort( );: (See FIG. 20) Shuts off power to the test head and ejects the DUT.

Reset( );: Causes a soft reset of a DUT that is currently being tested.

SelfTest( );: Invokes the Test Rack self-test method in the rack object.

WriteID(CString strID);: Writes the test head ID to the NOVRAM in the test head's front panel.

ReadID(CString& strRID);: Reads the test head ID from the NOVRAM in the test head's front panel.

Stop( );: (See FIG. 23) Causes the execution of the Start method or NoProductCode method to halt.

ClockSelect(int Clock);: This method does the following: Powers down the DUT;: Sets the bit that controls the clock setting on the Easter-T board;: SDARM or EDO clocking;: and powers up the DUT.

Cycle( );:(See FIG. 22) Causes a repeated cycling of the Start or NoProductCode, methods.

Suspend(DWORD dwTimeOut, CString& strFilePath);: (See FIG. 31) Looks for a flag, the {Ethernet address}.SUS file located on the test server, from the functional test. When this method finds the flag, the DUT's 3__VS voltage is tested. If the DUT fails the voltage test, test execution is halted and the DUT is failed.

Resume(DWORD dwTimeOut, CString& strFilePath);: (See FIG. 32) Toggles the Power On__Off bit, ending the DUT's Suspend status. After toggling the bit, a flag, the Ethernet address.RES file on the test server, is sent to the functional test execution flow and testing is resumed.

InsertDut( );: (See FIG. 33) Inserts and lowers the cassette tray containing the DUT and turns on the air flow.

GetTheTHID(CString& strTHID);: Reads the test head ID from the NOVRAM in the test head's front panel.

SetTheClock(int nRam);: (See FIG. 34) Sets the clock bit.

LookForFile(CString strFileExt, DWORD dwTimeOut, CString& strFilePath);: (See FIG. 28) Looks for a particular file on the test server for a set period of time. If the time period expires, the DUT is failed, power is shut off, and the tray is ejected.

HardReset( );: Cycles power.

WriteTheQRY(CString strThID, CString& strFilePath);: (See FIG. 29) Writes the file {Ethernet address}.QRY to the test server. This file contains the serial number of the DUT. The test server then sends this file to IFICS, which looks up the product code based on the serial number.

ParseTheEEE(CString strFile);: (See FIG. 30) Parses a (Ethernet address).EEE file upon test completion, which determines if the DUT passes or fails the test suite.

PowerOff( );: (See FIG. 24) Powers down a DUT, and ejects the tray.

PowerDown( );:(See FIG. 25) Powers down a DUT.

PowerOn( );: (See FIG. 26) Powers up a DUT and tests the voltages applied to the Easter-T board and that generated from the DUT.

Test headMessage(CString strTHMsg);: Displays messages on the test head's front panel and the list box associated with its GUI.

ClearDisplay( );: Clears the front panel display and GUI list boxes associated with a particular test head.

TestheadLights(CString strTHBulb);: Turns on the appropriate LED and GUI "bulb" for a particular test head.

WriteTheCCC(CString& strFilePath, CString strFailMsg);: (See FIG. 29) Is invoked upon a DUT's test failure and determines whether an EEE, BBB, or 5A file exists. If the system finds an 5A or BBB file, a CCC file is written that creates an EEE file. The EEE file is then parsed for failure data.

OpenInhibitor( );: (See FIG. 36) Causes the Matrix ID Inhibitor to assume an open position.

Delay(DWORD dwSec);: (See FIG. 35) Causes the current program execution to be suspended ("sleep") for a set period of time.

ParseThe5A(CString& strFilePath, CString& strProductCode);: (See FIG. 38) Parses the 5A file that a query for the product code of the DUT creates.

ParseTheTBL(CString& strProductCode, CStringArray& strFlowArray);: (See FIG. 39) Parses the script file associating the test execution flow with the DUT based on the DUT product code.

CleanTheServer(int m_n THID, CString strTHID, CString& strFileName);: Deletes from the test server all files corresponding to the test head ID except for ZZZ files and LOG files.

TABLE 12

Methods Associated With EasterT.cpp

EasterT (XTHVw* pTH=NULL, XCellVw* pCVw=NULL, int nTHID=NULL, Rack* pRack=NULL, BOOL bMatrixID=FALSE);: Creates a new test head object.
~EasterT( );: Destroys/Destructs a test head object.
Start( );: (See FIG. 13)
Suspend(DWORD dwTimeOut, CString& strFilePath);: (See FIG. 31)
Resume(DWORD dwTimeOut, CString& strFilePath);: (See FIG. 32)
SetTheClock(int nRam);: (See FIG. 34)
LookForFile(CString strFileExt, DWORD dwTimeOut, CString& strFilePath);: (See FIG. 28)
WriteTheCCC(CString& strFilePath, CString strFailMsg);: (See FIG. 29)
ParseTheTBL(CString& strProductCode, CStringArray& strFlowArray);: (See FIG. 39)
CleanTheServer(int m_n THID, CString strTHID, CString& strFileName);:

TABLE 13

Methods Associated With EasterTSX.cpp

EasterTSX (XTHVw* pTH=NULL, XCellVw* pCVw=NULL, int nTHID=NULL, Rack* pRack=NULL, BOOL bMatrixID=FALSE);: Creates a new test head object.
~EasterTSX( );: Destroys/Destructs a test head object.
Start( );: (See FIG. 13)
Suspend(DWORD dwTimeOut, CString& strFilePath);: (See FIG. 31)
Resume(DWORD dwTimeOut, CString& strFilePath);: (See FIG. 32)
WriteTheCCC(CString& strFilePath, CString strFailMsg);: (See FIG. 29)

TABLE 14

Methods Associated With Whidbey.cpp

Whidbey(XTHVw* pTH=NULL, XCellVw* pCVw=NULL, int nTHID=NULL, Rack* pRack=NULL, BOOL bMatrixID=FALSE);: Creates a new test head object.
~Whidbey ( );: Destroys/Destructs a test head object.
Start( );: (See FIG. 13)
Suspend(DWORD dwTimeOut, CString& strFilePath);: (See FIG. 31)
Resume(DWORD dwTimeOut, CString& strFilePath);: (See FIG. 32)
WriteTheCCC(CString& strFilePath, CString strFailMsg);: (See FIG. 29)

TABLE 15

Methods Associated With Rack.cpp

Rack(int nTHID=0);: Creates a Test Rack object.
~Rack( );: Destroys/Destructs a Test Rack object.
FlushTheFrontPanelBuffers( );: Clears the buffer used to send and receive data to the front panel.
InitTestStation(void);: Initializes the Test Rack hardware.
OperateActuator(CString strActuator);: Sets the relay drivers in the VXI card cage used to control the actuators.
PollButtons( );:Polls the status of the keypad buttons, pressed or not pressed.
ReadActuators(int& XtrayState, int& XpressState);: Reads the status of the sensors connected to the actuators used to control cassette tray movement in the test head.
SetActuationCounter(long actuatorCount);: Resets the test head counter.
ReadActuationCounter( );: Reads the data from the test head counter.
SetMessage(CString strMsg);: Sends messages in ASCII text to the front panel of the keypad.
ReadFixtureID(CString& strRead);: Reads the data stored in the NOVRAM located in the front panel keypad.
SetFixtureID(char *fixtureID);: Writes the data stored in the NOVRAM located in the front panel keypad.
SetIndicatorLight(CString strLight);: Turns on and off the test head LEDs.
SetFan(CString strFanState);: N/A
ReadDUTParameterFile(CString path_name);: Used to read the test parameters from the 'dutparam.dat' file.
ResetDUT( );: Drives the Reset signal.
PowerUp( );: Turns on the fixed and programmable power supplies, drives the Power Good, Power On, and Power Off signals, and measures the voltages that the fixed and programmable power supplies generate.

PowerDown( );: (See FIG. 25) Disconnects the fixed power supplies and programs the programmable power supplies to 0 volts.

WriteI2Cbus (unsigned char dataByte);: Enables the Test Rack to drive the I2C bus on the Easter-T board.

SetClockFrequency(int busFrequencySelect);: N/A

SetClockBoost(int clockBoostSetting);: N/A

StrobePON( );: Toggles the Power On signal.

SoftReset( );: Causes the Power On signal to become strobe-like, which in turn causes a soft reset of the Easter-T board.

SelectClock(int ClockSetting);: Drives the clock-selection (CLK_SELECT) bit high or low.

Resume( );: (See FIG. 32) Causes the Power On signal to become strobe-like.

RackPOST(void);: Executes the self-test of the Test Rack hardware.

DoSuspendMeas(double& dMeasSuspend, int& iSerror);: Measures the DUT's 3_VS voltage after a Suspend has occurred on the Easter-T board.

ParseDUT(int nParse, CString strParse);: Parses a line of data from the 'dutparam.dat' file.

DoPowerShortsTest( );: Tests for short circuits on the power buses.

DoPowerMeasurements( );: Tests the voltages on the power buses.

TABLE 16

Methods Associated With C80xRack.cpp

C80xRack(int n THID=0);: where x=[1,2].
virtual ~C80xRack( );:
InitTestStation (void);:
OperateActuator(CString strActuator);:
ReadActuators(int& XtrayState, int& XpressState);:
SetIndicatorLight(CString strLight);:
SetFan(CString strFanState);:
WriteI2Cbus (unsigned char dataByte);:
SetClockBoost(int clockBoostSetting);:
SetClockFrequency(int busFrequencySelect);:
ResetDUT( );:
StrobePON( );:
SoftReset( );:
Resume( );: (See FIG. 32)
SelectClock(int ClockSetting);:
PowerUp( );:
PowerDown( );: (See FIG. 25)
RackPOST(void);:
DoPowerShortsTest( );:
DoPowerMeasurements( );:
DoSuspendMeas(double& dMeasSuspend, int& iSerror);:
A SetupCableMap_80x(CMapStringToString &map801Cables, int nTHID);: where x=[1,2]., this method is NOT derived from the Rack object and is used to map the cabling from the rack equipment to the test heads.

TABLE 17

Methods Associated With Instrument.cpp configure_device(CString& strPrimary_Addr, CString& strSecondary_Addr);: Configures a VXI instrument so that the National Instruments CVI driver can communicate with that instrument.

WriteDevice(CString& strPrimary_Addr, CString& strSecondary_Addr, CString& buffer);: Writes data to instruments connected to the GPIB.

ReadDevice(CString& strPrimary_Addr, CString& strSecondary_Addr, CString& buffer, long maxlen, long *numread);: Reads data from instruments connected to the GPIB.

ClearDevice(CString& strPrimary_Addr, CString& strSecondary_Addr);: Clears the command buffer used for sending GPIB commands to an instrument.

SerialPollDevice(CString& strPrimary_Addr, CString& strSecondary_Addr, int *stat_byte);: Polls the state of a instrument connected to the GPIB bus.

TriggerDevice(CString& strPrimary_Addr, CString& strSecondary_Addr);: Used to trigger a single instrument.

Trigger2Devices(CString& str1Primary_Addr, CString& str1Secondary_Addr, CString& str2Primary_Addr, CString& str2Secondary_Addr);: Used to trigger two instruments simultaneously.

LockResources( );: Creates a mutually exclusive handle to the shared resources (VXI cards) on the Test Rack. This allows only one thread to access the resource at a time, locking out the other threads until the instrument finishes servicing the current thread.

UnlockAllResources( );: Releases a mutually exclusive shared resource from Lock status so that another thread may access that resource.

DelayDevice(int nDelay);: (See FIG. 35) Used to create a specific delay before or after executing an instruction by an instrument.

CheckRead(CString strActual, CString strExpect, CString strType, CString strCompare);: Used to check the actual response by an instrument against a expected response by the programmer.

GpibErr(CString strErr);: Used to translate the error response back from an instrument into understandable data by the user.

ExecuteInstructions(CStringArray& strInstructions, CStringArray& strResponse, CStringArray& strErrors);: Used to execute an array of instructions.

CheckYerr(CString strCheck);: Used to check the response from an YERR command to an instrument.

ParseInstruction(CString strParse);: Used to parse an instruction used in an instruction array by the ExecuteInstructions method.

TABLE 18

Methods Associated With MMO.cpp

C1260_13(CString strPrimary, CString strSecondary, CString strMod);: Creates a 1260_13 object.
~C1260_13( );: Destroys/Destructs a 1260_13 object.
CloseRelay(CString strChannel);: Causes a relay to close.
OpenRelay(CString strChannel);: Causes a relay to open.
SetRelays(CStringArray& strRelayArray);: Causes multiple relays to set open or closed.
OpenRelayInstruction(CStringArray& strInstructionArray, CString strRelays);: Causes the relay open instruction to be stored in a instruction array.
CloseRelayInstruction(CStringArray& strInstructionArray, CString strRelays);: Causes the relay open instruction to be stored in a instruction array.
YERRInstruction(CStringArray& strInstructionArray);: Causes the YERR instruction to be stored in a instruction array.
PollRELAY(int& status);: Polls the 1260_13 for its status.

TABLE 19

Methods Associated With MMO.cpp

C1260_14(CString strPrimary, CString strSecondary, CString strMod, CString strPort);: Creates a 1260_14 object.
~C1260_14( );:Destroys/Destructs a 1260_14 object.
ClearDigIo( );: Clears the 1260_14 instrument to its factory defaults.
SetupPullUp(CString strPorts);: Enables the pull-ups on all digital output channels.
ReadFastPort(int& nData);: Programs the 1260_14 to read in fast port mode.
WritePortBit(CString strDigitalLine, int nState);: Programs the 1260_14 to set all the bits on a port.
ReadPortBit(CString strDigitalLine, int& nResponse);: Programs the 1260_14 to read all the bits on a port.
WriteBit(CString strDigitalLine, int nState);: Programs the 1260_14 to set a single bit.
SetBitInstruction(CStringArray& strInstructionArray, CString strDigitalLine, int nState);: writes the instruction to program the 1260_14 to set a single bit to an instruction array.
WritePortInstruction(CStringArray& strInstructionArray, CString strDigitalLine, int nState);: Writes the instruction to program the 1260_14 to set all the bits on a port to an instruction array.
ReadFastPortInstruction(CStringArray& strInstructionArray, CString strDigitalLine);: Writes the instruction to program the 1260_14 to read in fast port mode to an instruction array.
ExecuteTheInstructions(CStringArray& strInstruct, CStringArray& strRead, CStringArray& strErr);: Executes the instructions stored in an instruction array.
PollDIGIO(int& status);: Polls the 1260_14 for its status.
TestDIGIO);: Self tests the 1260_14.

TABLE 20

Methods Associated With MMO.cpp

C1260_14C(CString strPrimary, CString strSecondary, CString strMod, CString strPort);: Creates a 1260_14C object.
~C1260_14C( );: Destroys/Destructs a 1260_14C object.
ClearDigIo( );: Clears the 1260_14C instrument to its factory defaults.
SetupPullUp(CString strPorts);: Enables the pull-ups on all digital output channels.
ReadFastPort(int& nData);: Programs the 1260_14C to read in fast port mode.
WritePortBit(CString strDigitalLine, int nState);: Programs the 1260_14C to set all the bits on a port.
ReadPortBit(CString strDigitalLine, int& nResponse);: Programs the 1260_14C to read all the bits on a port.
WriteBit(CString strDigitalLine, int nState);: Programs the 1260_14C to set a single bit.
SetBitInstruction(CStringArray& strInstructionArray, CString strDigitalLine, int nState);: Writes the instruction to program the 1260_14C to set a single bit to an instruction array.
WritePortInstruction(CStringArray& strInstructionArray, CString strDigitalLine, int nState);: Writes the instruction to program the 1260_14C to set all the bits on a port to an instruction array.
ReadFastPortInstruction(CStringArray& strInstructionArray, CString strDigitalLine);: Writes the instruction to program the 1260_14C to read in fast port mode to an instruction array.
ExecuteTheInstructions(CStringArray& strInstruct, CStringArray& strRead, CStringArray& strErr);: Executes the instructions stored in an instruction array.
PollDIGIO(int& status);: Polls the 1260_14C for its status.
TestDIGIO( );: Self tests the 1260_14C.

TABLE 21

Methods Associated With MMO.cpp

C1260_35(CString strPrimary, CString strSecondary, CString strMod, CString strPort);: Creates a 1260_35 object.
~C1260_35( );: Destroys/Destructs a 1260_35 object.
ClearMUX( );:Clears the 1260_35 instrument to its factory defaults.
TestMUX( );: Self tests the 1260_35.
PollMUX(int& status);: Polls the 1260_35 for its status.
ReadDMMChannels(DMM_Mode mode, double range, double aperature, int chan_list[ ], int chan_cnt, int settle_delay, int num_samples, CArray<double, double>&readings);: Programs the DMM to take voltage and resistance mesurements.
Exclusion( );: Creates an exclusion list for a 2 wire measurement.
CloseMux(CString strChannel);: Closes the specified 1260_35 channels.
OpenMux(CString strChannel);: Opens the specified 1260_35 channels.
OpenAllMux( );: Opens all 1260_35 channels.
Exclusion4Wire( );: Creates an exclusion list for a 4 wire measurement.
ConfigureDMM(DMM_Mode mode, double range, double aperature);: Used to configure the DMM.
DMMModeAndRange(DMM_Mode mode, double range, int *mode_param, int *range_param);: Used to set the mode and range of the DMM.

TABLE 22

Methods Associated With MMO.cpp

C1260_38(CString strPrimary, CString strSecondary, CString strMod, CString strPort);: Creates a 1260_38 object.
~C1260_38( );: Destroys/Destructs a 1260_38 object.
ClearMUX( );:Clears the 1260_38 instrument to its factory defaults.
TestMUX);: Self tests the 1260_38.
PollMUX(int& status);: Polls the 1260_38 for its status.
ReadDMMChannels(DMM_Mode mode, double range, double aperature, int chan_list[ ], int chan_cnt, int settle_delay, int num_samples, CArray<double, double>&readings);: Programs the DMM to take voltage and resistance mesurements.
Exclusion( );: Creates an exclusion list for a 2 wire measurement.
CloseMux(CString strChannel);: Closes the specified 1260_38 channels.
OpenMux(CString strChannel);: Opens the specified 1260_38 channels.
OpenAllMux( );: Opens all 1260_38 channels.
Exclusion4Wire( );: Creates an exclusion list for a 4 wire measurement.
ConfigureDMM(DMM_Mode mode, double range, double aperature);:: Used to configure the DMM.

DMMModeAndRange(DMM_Mode mode, double range, int *mode_param, int *range_param);: Used to set the mode and range of the DMM.

TABLE 23

Methods Associated With MMO.cpp

HPE1411(CString Prim_GPIB_addr, CString Sec_GPIB_addr, CString Dmm_addr);: Creates a HPE1411 object.
virtual ~HPE1411( );: Destroys a HPE1411 object.
ClearHPE1411( );:
hpe1411a_init(int, int, int, int, double, int *);:
hpe1411a_app_fast_meas (int, int, int, int, int *, double[ ]);:
hpe1411a_config_meas (int, int, int, int, int);:
hpe1411a_config_trig (int, int, int, int, long, double);:
hpe1411a_set_timeout (int, double);:
hpe1411a_trig_arm (int, int);:
hpe1411a_trig (int);:
hpe1411a_read_meas (int, double *);:
hpe1411a_config_samp (int, int, long, double);:
hpe1411a_soft_samp_trig (int);:
hpe1411a_read_mult_meas (int, int, int *, double[ ]);:)
hpe1411a_read_data_buffer (int, int, int, int [ ]);:
hpe1411a_convert_data_buffer (int, int, int, int [ ], int *, double [ ]);:
hpe1411a_data_ready (int, int *);:
hpe1411a_read_stat_reg (int, int *);:
hpe1411a_read_error (int, int *);:
hpe1411a_reset (int);:
hpe1411a_close(int);:
hpe1411a_open_instr (int, int, int *);:
hpe1411a_close_instr (int);:
hpe1411a_init_gpib (int);:
hpe1411a_invalid_integer_range (int, int, int, int);:
hpe1411a_invalid_longint_range (long, long, long, int);:
hpe1411a_invalid_real_range (double, double, double, int);:
hpe1411a_device_closed (int);:
hpe1411a_get_status_reg (int, int *);:
hpe1411a_read_reg (int, int, int *);:
hpe1411a_write_reg (int, int, int);:
hpe1411a_wait_cmd_parm_ready (int);:
hpe1411a_wait_til_done (int);:
hpe1411a_check_for_error (int);:
hpe1411a_read_with_peek (void *, int, int, int[ ]);:
hpe1411a_read_with_no_window (long, int, int, int[ ]);:
hpe1411a_read_with_GPIB (int, int, int, int[ ]);:
hpe1411a_setup_arrays (void);:

TABLE 24

Methods Associated With MMO.cpp

CPowerSupply(CString prim_PROG_addr, CString sec_PROG_addr, CString PSCHAN1, CString PSCHAN2);: Creates a power supply object.
~CPowerSupply( );:Destroys/Destructs a power supply object.
CheckPowerSupplyErrors(int *num_errs, int test_head_list[ ], int error_codes[ ]);:Reads back any errors that the programmable power supplies send.
ClearPowerSupplyStatus(void);: Clears the status buffer in the programmable power supplies.
ResetPROGInstruction(CStringArray& strInstruct, int nChan);: Resets the programmable supplies to there factory default settings.
CloseRelayInstruction(CStringArray& strInstruct, int nChan);: Closes the output relays on the programmable supplies.
PowerOnNOXInstruction(CStringArray& strInstruct, int nChan, double n Volts,double nCurrent);: Programs a programmable supply to a specific voltage and current limit and turns the supply on immediately.
PowerOnXInstruction(CStringArray& strInstruct, int nChan, double n Volts, double nCurrent);: Programs a programmable supply to a specific voltage, current limit and trigger event.
TriggerInstruction(CStringArray& strInstruct);: Programs a programmable power supply to turn on at a specific trigger ebent.
PowerOffInstruction(CStringArray& strInstruct, int nChan);: Programs a power supply to turn off.
ResetSCRInstruction(CStringArray& strInstruct, int nChan);:Programs a programmable power supply to reset its SCR device.
TestOutputInstruction(CStringArray& strInstruct, int nChan);: Executes the self test for a programmable power supply.
PollPower(int& status);:Polls a programmable power supply for its status.
TestPS( );: Tests a power supply.

TABLE 25

Methods Associated With MMO.cpp

OpenSerialPortOVRLPD(int nComPortNumber, HANDLE& hOpen, DCB& CommDCB, OVERLAPPED CommOVLPD);: Connects to a RS-232 device via a RS-232 port in overlapped mode.
OpenSerialPort(int nComPortNumber, HANDLE& hOpen, DCB& CommDCB);: Connects to a RS-232 device via a RS-232 port in non-overlapped mode.
CloseSerialPort(int nComPortNumber);:Disconnects a RS-232 device from a RS-232 port.
SetupConnection(HANDLE& hSetup, DCB& XDCB);: Sets up a RS232 port.
ClearBuffer(HANDLE hOpen);: Purges the buffer associated with an RS-232 port.

TABLE 26

Methods Associated With MMO.cpp

CD1700(HANDLE hD1700=NULL, CString strComPort, CString strAddress, CString strParity, int nBaud, CString strLineFeed,,CString strEcho, int nDelay, int nEvent, int nWordLen);: Constructs a D1700 object.
virtual ~CD1700( );: Destroys a D1700 object.
AIB(CString strData);: Assign input bit.
AIO(CString strData);: Assign I/O.
AIP(CString strData);: Assign input position.
AOB(CString strData);: Assign output bit.
AOP(CString strData);: Assign output position.
CE( );: Clear event counter.
EC(CString& strData);: Event read & clear.
ID(CString strData);: Identification.
IV(CString strData);: Initail value.
RR( );: Remote reset.
SU(CString strData);: Setup.
WT(CString strData);: Watchdog timer.
CB(CString strData);: Clear bit.
CP(CString strData);: Clear position.
SB(CString strData);: Set bit.

SP(CString strData);: Set position.
DO(CString strData);: Digital output.
DI(CString& strData);: Digital input.
RA(CString& strData);: Read assignments.
RAB(CString& strData);: Read assignment bit.
RAP(CString& strData);: Read assignment position.
RB(CString& strData);: Read bit.
RP(CString& strData);: Read position.
RD(CString& strData);: Read data.
RE(CString& strData);: Read event counter.
RID(CString& strData);: Read identification.
RIV(CString& strData);: Read initial value.
RS(CString& strData);: Read setup.
RSU(CString& strData);: Read setup.
RT(CString& strData);: Read watchdog timer.
SetDefaultDCB(DCB& xdcb);: Set default rs232 communication parameters.
SetUpD1700(DCB& NewDcb, CString& strSetup, int nAddress, CString strLineFeed, CString strParity, int nBaud, CString strEcho, int nDelay, int nEvent, int nWordLen);: Setup communication parameters.
ReadBack(DWORD dwLength);: Read back data over serial port.
WriteTo(CString strInstruction);: Write data over serial port.
Delay(int nDelay);: (See FIG. 35) Time delay.
LockCommPort( );: Lock serial port resource.
UnLockCommPort( );: Unlock serial port resource.

TABLE 27

Methods Associated With MMO.cpp

C5014r(HANDLE h5014=NULL);:
virtual ~C5014r( );:

TABLE 28

Methods Associated With MMO.cpp

CHandler(HANDLE hHandler=NULL);:
virtual ~CHandler( );:
InitHandler( );:
ScanBoard( );:
LoadBoard(int nPlace);:
UnLoadBoard(int nPlace, BOOL bPass);:
LockHandler( );:
BOUnLockHandler( );:
Write To(CString strInstruction);:
ReadBack(DWORD dwLength);:

TABLE 29

Methods Associated With MMO.cpp

IDReader(HANDLE hMatrix=NULL, char* cID=NULL, BOOL bInhibitor=FALSE);: Creates a Matrix ID object.
~IDReader( );: Destroys/Destructs a Matrix ID object.
CString ReadMatrixID(DWORD dwLength, BOOL bComOpen, HANDLE& hMatrixID);: Reads the serial number that the Matrix ID Reader scans.
ExitMatrixIDThread(HANDLE& hMat, int nComPort);: Stops the Matrix ID Reader's Read Continuous mode.
ReadContinuous(HANDLE hMatID, char* cMatID);: Invokes a thread that initiates the Matrix ID Reader's Read Continuous mode.
CheckSN( );: Determines whether the serial number the Matrix ID Reader scans contains invalid data.
InitInstance( );: Initializes the methods and variables that the Matrix ID object uses.

TABLE 30

Methods Associated With MMO.cpp

WriteFrontPanel(CString strFP);: Writes characters to the GUI display on the front panel.
GetFrontPanelByteCount( );: Retrieves the number of characters returned when you press a button on the front panel.
ReadFrontPanel(char* strFP, int maxLen);::
FlushFrontPanelBuffers( );: Clears the buffer associated with the front panel.
ReadFrontPanelButtons(int& nByteRead);: Retrieves the character returned when you press a button on the front panel.
ReadCount(int &nCount);: Reads the actuator count from the NVRAM in the testhead.
WriteCount(long actuatorCount);: Writes the actuator count to the NVRAM in the testhead.
WriteNVRAM(char *fixtureID);: Writes data via an RS-232 port to the NVRAM in the testhead.
ReadNVRAM(CString& strReadThid);: Reads data via an RS-232 port from the NVRAM in the testhead.

TABLE 31

Methods Associated With MMO.cpp

Inhibitor( );: Creates a Matrix ID Reader Inhibitor object.
~Inhibitor( );: Destroys/Destructs a Matrix ID Reader Inhibitor object.
InitInhibit(HANDLE& hInhibit);: Initializes the Matrix ID Reader Inhibitor to its disengaged state.
OpenInhibit(HANDLE& hInhibit);: Sets the Matrix ID Reader Inhibitor to its disengaged state.
CloseInhibit(HANDLE& hInhibit);: Sets the Matrix ID Reader Inhibitor to its engaged state.
ReadBack(DWORD dwLength, HANDLE& hInhibit);: Determines the recent state of the Matrix ID Reader Inhibitor.
WriteTo(CString strInstruction, HANDLE& hInhibit);: Sends commands to the Matrix ID Reader Inhibitor.

TABLE 32

Methods Associated With MMO.cpp

CSerialTestMsg(int nComPort=0);: Constructs a SerialTestMsg object.
virtual ~CSerialTestMsg( );: Destroys a SerialTestMsg object.
ReadTestMsg(CString& strTestMsg, DWORD dwTimeOut);: Reads a message from the test suite.
WriteTestMsg(CString strTestData,DWORD dwTimeOut);: Writes a message to the test suite.
IsReading( );: Indicates busy reading.
IsWriting( );: Indicates busy writing.

What is claimed:

1. An apparatus comprising:
   a central controller;
   a device identifier to identify each one of the plurality of devices as one of a plurality of device types;
   a plurality of test heads, each test head to test each one of the devices independently of the rest of the plurality of test heads responsive to the identification of each device by the device identifier and under the control of the controller; and
   a server to identify a set of instructions to the controller for one of the plurality of test heads to test one of the devices independently of the rest of the plurality of test heads, the set of instructions to be based upon an identification of a device of the plurality of devices as one of the plurality of device types;

wherein the device identifier is to identify at least one of the plurality of devices prior to inserting the at least one of the plurality of devices into one of the plurality of test heads.

2. A method to test a plurality of devices comprising:

placing the plurality of devices identified into a plurality of test heads, each device to be identified as one of a plurality of predetermined device types and to be subsequently placed in a respective test head;

identifying a plurality of sets of instructions to a central controller to direct the test of each device independently of the testing for the remaining devices, each set of instructions being based upon a device being identified as one of a plurality of predetermined device types; and directing the testing of each device independently of the testing for the remaining devices responsive to the respective identification of the device, the direction for the testing of each device coming from the controller.

3. An apparatus comprising:

a device identifier to identify a device;

a plurality of test heads comprising a first test head to test the device independently of a second test head; and a central controller coupled with said device identifier and with said plurality of test heads to direct testing of the device according to a testing protocol based upon identification of the device;

wherein the device identifier is to identify the device before insertion of the device into the first test head.

4. The apparatus of claim 3, wherein the device comprises a mobile processor board.

5. The apparatus of claim 3, wherein the testing protocol comprises a protocol to emulate a test hardware function with the first test head.

6. The apparatus of claim 3, wherein said controller comprises part of a test bed, wherein said test bed comprises:

a power supply coupled with said plurality of test heads; and a communications interface coupled with said controller.

7. The apparatus of claim 3, further comprising a server through which the test bed controls said plurality of test heads.

8. The apparatus of claim 3, wherein said device identifier comprises:

a serial number reader to determine a serial number of the device; and a product identifier to identify the device as a device type.

9. If The apparatus of claim 3, further comprising a server coupled with said controller to associate testing protocols with the device based upon the identification.

10. An apparatus comprising:

a device identifier to identify a device;

a plurality of test heads comprising a first test head to test the device independently of a second test head;

a server coupled with said device identifier to associate a testing protocol with the device based upon an identification of the device; and a central controller coupled with said device identifier and with said plurality of test heads to direct testing of the device according to the testing protocol;

wherein the device identifier is to identify the device before insertion of the device into the first test head.

11. The apparatus of claim 10, wherein the testing protocol comprises a protocol to emulate a test hardware function with the first test head.

12. The apparatus of claim 10, wherein said controller comprises part of a test bed, wherein said test bed comprises:

a power supply coupled with said plurality of test heads; and a communications interface coupled with said controller.

13. The apparatus of claim 10, further comprising a server through which the test bed controls said plurality of test heads.

14. The apparatus of claim 10, wherein said controller is coupled with said plurality of test heads to direct testing of the device by the first test head independently of testing of a different device by the second test head.

15. A method, comprising:

identifying a device;

placing the device in a first test head of a plurality of test heads coupled with a central controller, subsequent to said identifying; and directing a test of the device via the controller, independently of testing of a second device by the controller, in accordance with a testing protocol based upon said identifying the device.

16. The method of claim 15, wherein said identifying a device comprises reading the serial number of the device.

17. The method of claim 15, wherein said identifying a device comprises predetermining an identity of the device.

18. The method of claim 15, wherein said directing a test of the device comprises identifying a test protocol for the first device based upon said identifying the device.

19. The method of claim 15, wherein said directing a test of the device comprises identifying independently of directing the testing of the second device.

20. The method of claim 19, wherein directing the testing of the second device comprises directing the testing of the second device in accordance with a different test protocol.

21. The method of claim 15, wherein said directing a test of the device comprises emulating a test hardware function with the first test head.

22. A method, comprising:

identifying a device;

placing the device in a first test head of a plurality of test heads coupled with a central controller, subsequent to said identifying;

associating a testing protocol with the device based upon said identifying the device; and directing a test of the device via the controller, independently of testing of a second device by the controller, in accordance with the testing protocol.

23. The method of claim 22, wherein said directing a test of the device comprises identifying a test protocol for the first device based upon said identifying the device.

24. The method of claim 22, wherein said directing a test of the device comprises identifying independently of directing the testing of the second device.

25. The method of claim 24, wherein directing the testing of the second device comprises directing the testing of the second device in accordance with a different test protocol.

26. The method of claim 22, wherein said directing a test of the device comprises emulating a test hardware function with the first test head.

* * * * *

UNITED STATES PATENT AND TRADEMARK OFFICE
CERTIFICATE OF CORRECTION

PATENT NO. : 6,732,053 B1
DATED : May 4, 2004
INVENTOR(S) : Aragona

It is certified that error appears in the above-identified patent and that said Letters Patent is hereby corrected as shown below:

Column 1,
Line 57, delete "its" at the end of the line.

Column 14,
Line 47, delete "DoClock(int nClkSet)" and insert -- DoClock(int nClkSel) --.

Column 19,
Line 55, delete "A" at the beginning of the line.

Column 22,
Line 50, delete "TestMUX)" and insert -- TestMUX() --.

Column 23,
Line 24, delete ")" at the end of the line.

Column 27,
Line 54, delete "If" after the number "9.".

Signed and Sealed this

Thirty-first Day of August, 2004

JON W. DUDAS
*Director of the United States Patent and Trademark Office*